(12) United States Patent
Ozawa et al.

(10) Patent No.: US 7,714,606 B2
(45) Date of Patent: May 11, 2010

(54) SEMICONDUCTOR INTEGRATED CIRCUIT

(75) Inventors: Osamu Ozawa, Tokyo (JP); Toshio Sasaki, Tokyo (JP); Ryo Mori, Tokyo (JP); Takashi Kuraishi, Tokyo (JP); Yoshihiko Yasu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 690 days.

(21) Appl. No.: 11/639,140

(22) Filed: Dec. 15, 2006

(65) Prior Publication Data
US 2007/0176233 A1 Aug. 2, 2007

(30) Foreign Application Priority Data
Jan. 27, 2006 (JP) .............................. 2006-018876

(51) Int. Cl.
*H03K 3/01* (2006.01)
*G05F 1/10* (2006.01)
*G05F 3/02* (2006.01)

(52) U.S. Cl. .......................... 326/30; 327/534; 327/537

(58) Field of Classification Search .................. 326/30, 326/31, 34, 83; 327/534, 535, 537
See application file for complete search history.

(56) References Cited

U.S. PATENT DOCUMENTS

| 5,594,371 A | 1/1997 | Douseki |
| 5,821,769 A | 10/1998 | Douseki |
| 5,917,365 A * | 6/1999 | Houston ..................... 327/534 |
| 6,097,113 A * | 8/2000 | Teraoka et al. ............... 307/125 |
| 6,337,593 B1 * | 1/2002 | Mizuno et al. .............. 327/534 |

FOREIGN PATENT DOCUMENTS

| JP | 8-228145 A | 9/1996 |
| JP | 9-121152 A | 5/1997 |

* cited by examiner

*Primary Examiner*—Daniel D Chang
(74) *Attorney, Agent, or Firm*—Miles & Stockbridge P.C.

(57) ABSTRACT

A plurality of MOS transistors each having an SOI structure includes, in mixed form, those brought into body floating and whose body voltages are fixed and variably set. When a high-speed operation is expected in a logic circuit in which operating power is relatively a low voltage and a switching operation is principally performed, body floating may be adopted. Body voltage fixing may be adopted in an analog system circuit that essentially dislikes a kink phenomenon of a current-voltage characteristic. Body bias variable control may be adopted in a logic circuit that requires the speedup of operation in an active state and needs low power consumption in a standby state. Providing in mixed form the transistors which are subjected to the body floating and the body voltage fixing and which are variably controlled in body voltage, makes it easier to adopt an accurate body bias according to a circuit function and a circuit configuration in terms of the speedup of operation and the low power consumption.

30 Claims, 47 Drawing Sheets

SEMICONDUCTOR INTEGRATED CIRCUIT

CROSS-REFERENCE TO RELATED APPLICATION

The present application claims priority from Japanese patent application No. 2006-18876 filed on Jan. 27, 2006, the content of which is hereby incorporated by reference into this application.

BACKGROUND OF THE INVENTION

The present invention relates to a semiconductor integrated circuit using SOI (Silicon On Insulator) type field effect transistors (called MOS transistors in the present specification), and particularly to a power shutdown technique thereof.

In a bulk type MOS integrated circuit, active regions are formed in a substrate and well regions to configure MOS transistors. In an SOI type MOS integrated circuit, however, a large number of active regions are formed in an insulating thin film provided on a substrate, without using the well regions, and MOS transistors are configured in the individual active regions. Thus, the SOI type MOS integrated circuit is fundamentally different from the bulk type MOS integrated circuit in terms of device isolation. There are little junction capacitance and junction leak between the same circuit and the substrate. In this respect, the SOI type MOS integrated circuit is superior to the bulk type MOS integrated circuit in terms of a low voltage operation, low power consumption and a high-speed operation. From the viewpoint of the low power consumption and the high-speed operation, a patent document 1 (Japanese Unexamined Patent Publication No. Hei 8(1996)-228145) illustrates by way of example, a configuration wherein the bodies of MOS transistors constituting a logic circuit are respectively set to a low threshold voltage by bringing them into floating, and the MOS transistors constituting the logic circuit are brought into a high threshold voltage by body-biasing a power supply switch connected to a power supply and ground respectively. According to this example, a high-speed operation of the logic circuit can be attained by the MOS transistors low in threshold voltage, and low power consumption at standby can be achieved by the power supply switch high in threshold voltage. A patent document 2 (Japanese Unexamined Patent Publication No. Hei 9(1997)-121152) describes that the body of a power supply switch is biased by its own gate potential thereby to realize the setting of a variable threshold voltage to the power supply switch. When the power supply switch is in an on state, current supply capability can be obtained by bringing the power supply switch to a low threshold voltage. Further, when the power supply switch is in an off state, a subthreshold leak current is reduced by bringing the power supply switch to a high threshold voltage. A backbias technique that an input terminal of a CMOS inverter is connected to its body has been described in the patent document 2.

SUMMARY OF THE INVENTION

The present inventors have carried out investigations about the execution of body biasing corresponding to the function and configuration of a circuit having an SOI structure, such as a logic circuit, an analog circuit or the like except for a power supply switch, with respect to the circuit having the SOI structure. For example, if a body is brought into floating, then a threshold voltage is made variable by capacitive coupling between the gate and body. This can thus contribute to a high-speed operation. However, the body may preferably be fixed in terms of a soft error. There may be a case in which even though the high-speed operation is required, then a body potential becomes easy to fluctuate when the body is brought into floating, so that a variation in characteristic due to it cannot be ignored. There is cited, for example, an analog circuit exclusively operated in a saturated region. Further, electrons that flow from the source to drain are accelerated by a high electric field of a drain portion, so that electrons and positive holes occur due to impact ionization. However, when the positive holes are stored between a portion just above the body and a layer below a channel, a kink phenomenon that distortion or bending occurs in a transistor's current/voltage characteristic takes place. Such impact ionization occurs with a high potential of the drain, and the kink phenomenon comes to the fore with body floating. It has been revealed by the present inventors that the kink phenomenon should be taken into consideration at an external I/O area (input/output circuit area in which a circuit such as an external input/output buffer or the like is formed) set higher in operating power supply voltage than a core area. Further, the present inventors have found out that a high-speed operation and low power consumption for circuits such as a logic circuit, an analog circuit, etc. in a core area in which the operating power supply voltage is lowered as compared with the I/O area and in which the high-speed operation and the low power consumption have been projected or planned, are not improved in effectiveness unless the relationship with the state of operation of the power supply switch is also taken into consideration.

The present invention is to provide a semiconductor integrated circuit easy to carry out a body bias suitable for improving a high-speed operation of a circuit using SOI type MOS transistors and low power consumption thereof according to the function and configuration of the circuit.

The above and other objects and novel features of the present invention will become apparent from the description of the present specification and the accompanying drawings.

Summaries of typical or representative ones of the inventions disclosed in the present application will briefly be explained as follows:

[1]

A semiconductor integrated circuit (1) according to the present invention comprises a plurality of MOS transistors (MNtn, MPtn, MNtk and MPtk) each having a source (SOC), a drain (DRN), a body (BDY), a gate insulating film (GOX) provided over the body, and a gate (GAT) provided over the gate insulating film, which are provided over an insulating thin film of a substrate (BPL). The plurality of MOS transistors are provided in mixed form in such a manner that the bodies thereof are brought into floating, the voltages of the bodies are fixed and the voltages of the bodies are set variable. Body floating may be adopted in a circuit which expects a high-speed operation for a logic circuit or the like in which operating power is relatively a low voltage and a switching operation is principally performed. Body voltage fixing may be adopted in an analog system circuit that essentially dislikes a kink phenomenon of a current-voltage characteristic. Body bias voltage variable control may be adopted in a logic circuit that requires the speedup of operation in an active state and needs low power consumption in a standby state. Body bias fixing or body bias variable control rather than the body floating may be adopted in a memory circuit or a sequence circuit that needs resistance to soft error. Providing in mixed form the SOI type MOS transistors which are subjected to the body floating (MNtn_F, MPtn_F, MNtk_F and MPtk_F) and the body voltage fixing (MNtn_S, MPtn_S, MNtk_S and MPtk_S) and which are variably controlled in body voltage (MNtn_C, MPtn_C, MNtk_C and MPtk_C), makes it easier to adopt an accurate body bias according to a circuit function and a circuit configuration in terms of the speedup of operation and the low power consumption.

[2]

<<Body Fixing Memory Circuit>>

Another semiconductor integrated circuit according to the present invention comprises a plurality of circuits constituted of MOS transistors each having a source, a drain, a body, a gate insulating film provided over the body, and a gate provided over the gate insulating film, which are provided over an insulating thin film of a substrate; and a memory circuit (MRY) included as part of the plurality of circuits. The memory circuit has memory elements constituted of MOS transistors (MNtn_S and MPtn_S) whose body voltages are fixed. Even though an electrical charge occurs in the support substrate due to the incidence of radiation, the electrical charge has little effect on electric conduction of a channel portion by isolation using an embedded oxide film. Therefore, an SOI structure is capable of obtaining high resistance to soft error at the memory circuit.

<<Body Fixing Sequence Circuit>>

When a digital circuit used as part of the plurality of circuits is included as one specific form of the present invention, the digital circuit has sequence circuits (SQUC) constituted of MOS transistors whose body voltages are fixed. Each sequence circuit SQUC constitutes, for example, a memory circuit like each latch at a clock synchronous logic stage and can contribute to an improvement in reliability of a logical operation because of the high resistance to soft error.

<<Body Floating Combination Circuit>>

When the digital circuit has combination circuits (CMBC) constituted of MOS transistors whose bodies are brought into floating, the combination circuits are connected in series with the sequence circuits respectively.

The combination circuits provided in series with the sequence circuits may be constituted of MOS transistors whose bodies are brought into floating. This is because it is considered that if precedence of a high-speed operation based on body floating is given to the combination circuit CMBC rather than consideration of resistance to soft error, connected in series with the sequence circuit SQUC, an improvement in data processing performance by the digital circuit, and the like can be often expected.

<<Body Floating>>

When another digital circuit is contained as part of the plurality of circuits, the digital circuit has a logic circuit constituted of MOS transistors whose bodies are brought into floating. Such a logic circuit is of such a circuit that a high-speed operation is given a priority.

[3]

<<Body Potential Variable>>

A further semiconductor integrated circuit according to the present invention comprises a plurality of circuits constituted of MOS transistors each having a source, a drain, a body, a gate insulating film provided over the body, and a gate provided over the gate insulating film, which are provided over an insulating thin film of a substrate; and a control circuit (5, 5A), a controlled circuit (6, 7, 8, 9) and an external interface circuit (2) as parts of the plurality of circuits. The control circuit variably controls a body potential of each MOS transistor constituting the controlled circuit according to an operation mode. It is possible to optimize a body bias according to operation modes such as a high-speed operation, low power consumption, a low leak and the like.

As another specific form of the present invention, a body bias circuit is provided, as another part of the plurality of circuits, which variably controls body potentials of MOS transistors constituting a subsequent-stage circuit (12) on the basis of an output of a pre-stage circuit (13) at a serial signal transmission path in the controlled circuit. Transmission characteristics of the individual signal transmission paths can be aligned in advance.

<<Power Supply Switch>>

As a further specific form of the present invention, the controlled circuit has a power supply switch (10), and a gate oxide film of the MOS transistor (MNtk, MPtk) constituting the power supply switch has the same thickness as a gate oxide film of each of the MOS transistors for external input/output, constituting the external interface circuit. The control circuit controls on/off of the power supply switch according to the operation mode.

Since the MOS transistors used for each power supply switch are subjected to body isolation because of a so-called SOI structure, their free layout is allowed in a circuit forming area without being subject to layout constraints by well isolation as in the case of a bulk type. Therefore, since no isolation area for well isolation is needed even though a functional unit for performing power shutdown is fractionized, a power shutdown function high in the degree of freedom can be obtained without a load of an increase in area.

<<Body Bias of Power Supply Switch>>

As a still further specific form of the present invention, the body of the MOS transistor constituting the power supply switch may preferably be biased using its source potential or the like. When the body is brought into floating, a variation in body potential due to capacitive coupling between the body and gate can suppress instability of power supply capability due to a variation in on resistance of the power supply switch.

<<Source Tie Structure>>

As a still further specific form of the present invention, the bodies of the MOS transistors constituting the external interface circuit are connected to sources thereof at plural spots (ST (P+) and ST (N+)). By body-biasing, with connecting points to a source potential as plural points, an external interface circuit that tends to become higher in operating power than a core circuit portion or a logic circuit portion and widen a channel width because impact ionization occurs due to a high potential at each drain and a kink phenomenon frequently occurs due to body floating, the occurrence of a kink phenomenon of a voltage/current characteristic due to the impact ionization can be suppressed or reduced.

<<Body Bias in Low Leak Mode and High-Speed Mode>>

As a still further specific form of the present invention, in a low leak mode at shutoff of the power supply switch, the control circuit (5, 5A) controls the body of each MOS transistor constituting the controlled circuit to a reverse bias voltage at which a threshold voltage thereof becomes greater than when equal to a source voltage thereof. In a high-speed mode at the supply of power by the power supply switch, the control circuit controls the body of each MOS transistor constituting the controlled circuit to a forward bias voltage at which the threshold voltage becomes smaller than when equal to the source voltage thereof. The control to the reverse bias voltage increases an on resistance of each MOS transistor and can contribute to a reduction in subthreshold leak current. The control to the forward bias voltage reduces an on resistance of each MOS transistor and can contribute to a high-speed operation.

<<Body Bias in Low-Speed Mode>>

As a still further specific form of the present invention, the control circuit (5, 5A) sets the body of each MOS transistor constituting the controlled circuit to the reverse bias in a low-speed mode at the supply of power by the power supply switch. This can contribute to a reduction in power consumption at the operation.

<<Body Bias in Normal Mode>>

As a still further specific form of the present invention, the control circuit (5, 5A) controls the body of each MOS transistor constituting the controlled circuit to a source voltage thereof in a normal mode at the supply of power by the power supply switch.

<<Power-On of Semiconductor Integrated Circuit>>

As a still further specific form of the present invention, upon power-on of the semiconductor integrated circuit, the control circuit (5, 5A) applies a bias voltage for holding a parasitic diode in an off state to the body of the MOS transistor prior to or simultaneously with the application of operating power to each MOS transistor constituting the controlled circuit. That is, when the power of the semiconductor integrated circuit is turned on, the body of the MOS transistor is connected to a power supply on the source side prior to or simultaneously with the application of operating power to each MOS transistor constituting the controlled circuit. Thus, it is possible to suppress the disadvantage that the forward direction current flows into the parasitic diodes between the sources and bodies of the MOS transistors, upon the power-on of the semiconductor integrated circuit. The body is biased to or by operating power in advance before the application of the operating power to, for example, a p channel type MOS transistor.

<<Power-On of Semiconductor Integrated Circuit>>

As a still further specific form of the present invention, upon power-off of the semiconductor integrated circuit, the control circuit (5, 5A) shuts off the application of the bias voltage for holding the parasitic diode in the off state, which is applied to the body of the MOS transistor, simultaneously with or after the shutdown of the operating power for each MOS transistor constituting the controlled circuit. That is, when the power of the semiconductor integrated circuit is turned off, the control circuit shuts off the connection between the body of the MOS transistor and the power supply on the source side simultaneously with or after the shutdown of the operating power for each MOS transistor constituting the controlled circuit. Thus, it is possible to suppress the disadvantage that the forward direction current flows into the parasitic diode between the source and body of each MOS transistor before the operating power supplied to each MOS transistor is completely shut down.

<<At Shutdown of Power by Power Supply Switch>>

As a still further specific form of the present invention, when power on a high-potential side or a low-potential side is shut down by the power supply switch, the control circuit (5, 5A) biases the body of each MOS transistor connected to the power supply switch to a power supply lying on the side opposite to a power supply shutdown by the power supply switch, or brings the same into floating. When, for example, power on the low potential side like a ground potential is shut down by the power supply switch, a body potential of an n channel type MOS transistor is also brought to a high potential power supply, thereby making it possible to suppress a junction leak between the drain and body of the n channel type MOS transistor in a shutdown state of the power supply switch. When, for example, power on the high potential side is shut off by the power supply switch, a body potential of a p channel type MOS transistor is also brought to a low potential power supply like the ground potential, thereby making it possible to suppress a junction leak between the drain and body of the p channel type MOS transistor in a shutdown state of the power supply switch.

<<At Reset from Power Shutdown by Power Supply Switch>>

As a still further specific form of the present invention, when the supply of power by the power supply switch is resumed, the control circuit (5, 5A) applies a bias voltage for holding a parasitic diode in an off state to the body of each MOS transistor connected to the power supply switch prior to or simultaneously with an on operation of the power supply switch. When, for example, the state of shutdown of power on the low-potential side like a ground potential is released by the power supply switch, a body potential of an n channel type MOS transistor is first switched to the low-potential power supply when the body potential is brought to a high-potential power supply, thereby making it possible to suppress that a parasitic diode between the body and source of the n channel type MOS transistor is brought to an on state after the release of power shutdown. When, for example, the state of shutdown of power on the high potential side is released by the power supply switch, a body potential of a p channel type MOS transistor is first switched to the high-potential power supply when the body potential is brought to the low-potential power supply, thereby making it possible to suppress that a parasitic diode between the body and source of the p channel type MOS transistor is brought to an on state after the release of power shutdown.

When the supply of power by the power supply switch is shut off, the control circuit may preferably shut off the application of the bias voltage applied to hold the parasitic diode in the off state to the body of each MOS transistor connected to the power supply switch after or simultaneously with an off operation of the power supply switch.

[4]

<<Analog Circuit>>

As a still further specific form of the present invention, a semiconductor integrated circuit comprises a plurality of circuits constituted of MOS transistors each having a source, a drain, a body, a gate insulating film provided over the body, and a gate provided over the gate insulating film, which are provided over an insulating thin film of a substrate; and an analog circuit included as part of the plurality of circuits. The analog circuit has a circuit which allows each MOS transistor to operate in a saturated region. There is a fear that since a gate potential of the circuit operated in the saturated region little changes periodically between a low-potential power supply and a high-potential power supply, an electrical charge is stored gradually during operation so that a current/voltage characteristic changes. Fixing the body potential of each MOS transistor operated in the saturated region can resolve the fear of causing such a change in characteristic.

An advantageous effect obtained by a typical one of the inventions disclosed in the present application will briefly be explained as follows:

It becomes easy to carry out a body bias suitable for improving a high-speed operation of a circuit using SOI type MOS transistors and low power consumption thereof according to the function and configuration of the circuit.

BRIEF DESCRIPTION OF THE DRAWINGS

FIG. 40 is a timing chart illustrating an operation timing at which a state TRS_NG occurs upon LSI power-on;

FIG. 41 is a timing chart illustrating operation timing for realizing a state TRS_OK upon LSI power-on;

DETAILED DESCRIPTION OF THE PREFERRED EMBODIMENTS

<<Power Supply Switches Using SOI Type Thick Film MOS Transistors>>

Figure 2:
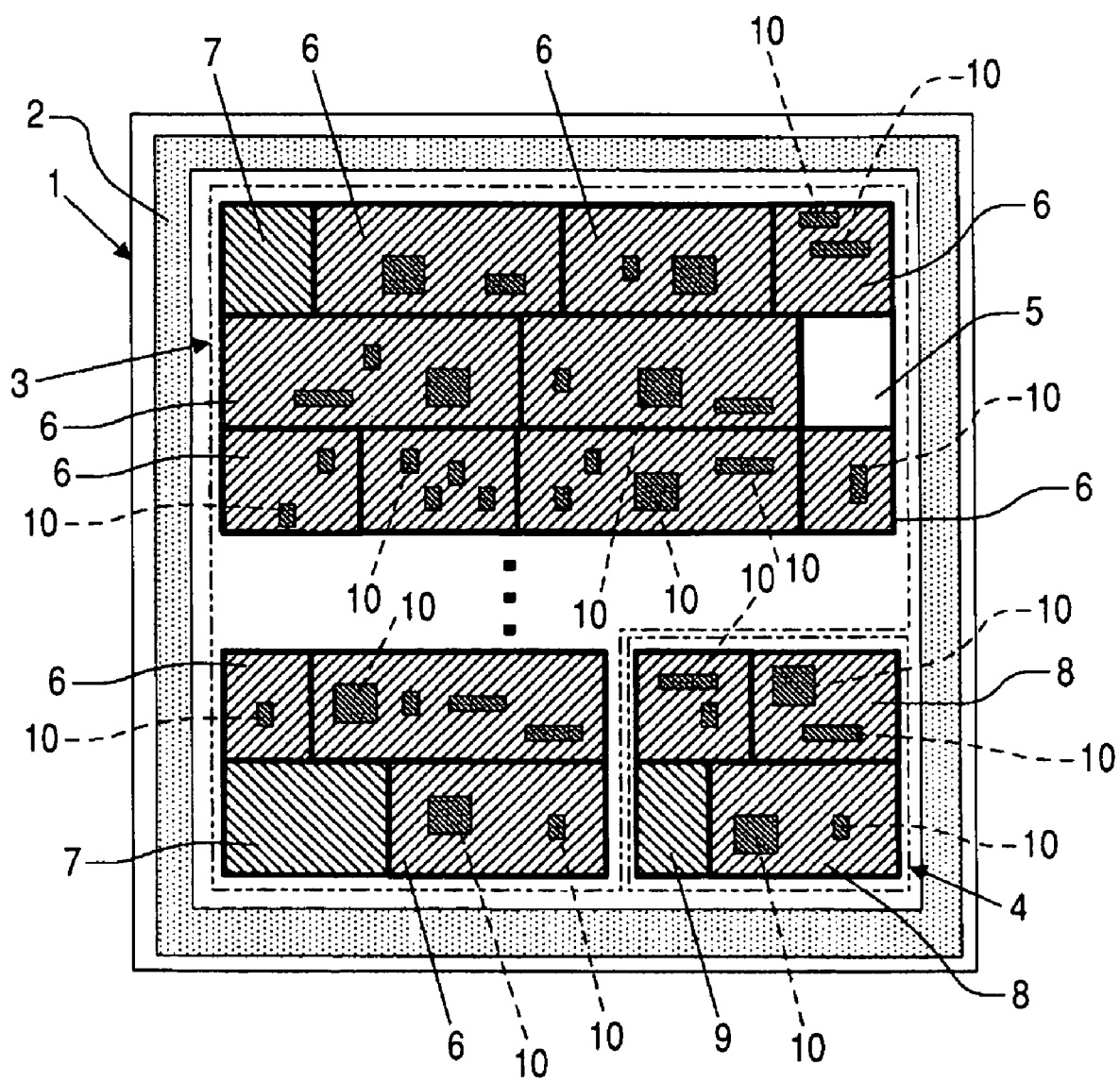
FIG. 2 is a plan view illustrating a planer configuration of the semiconductor integrated circuit according to the present invention.
Figure 3:
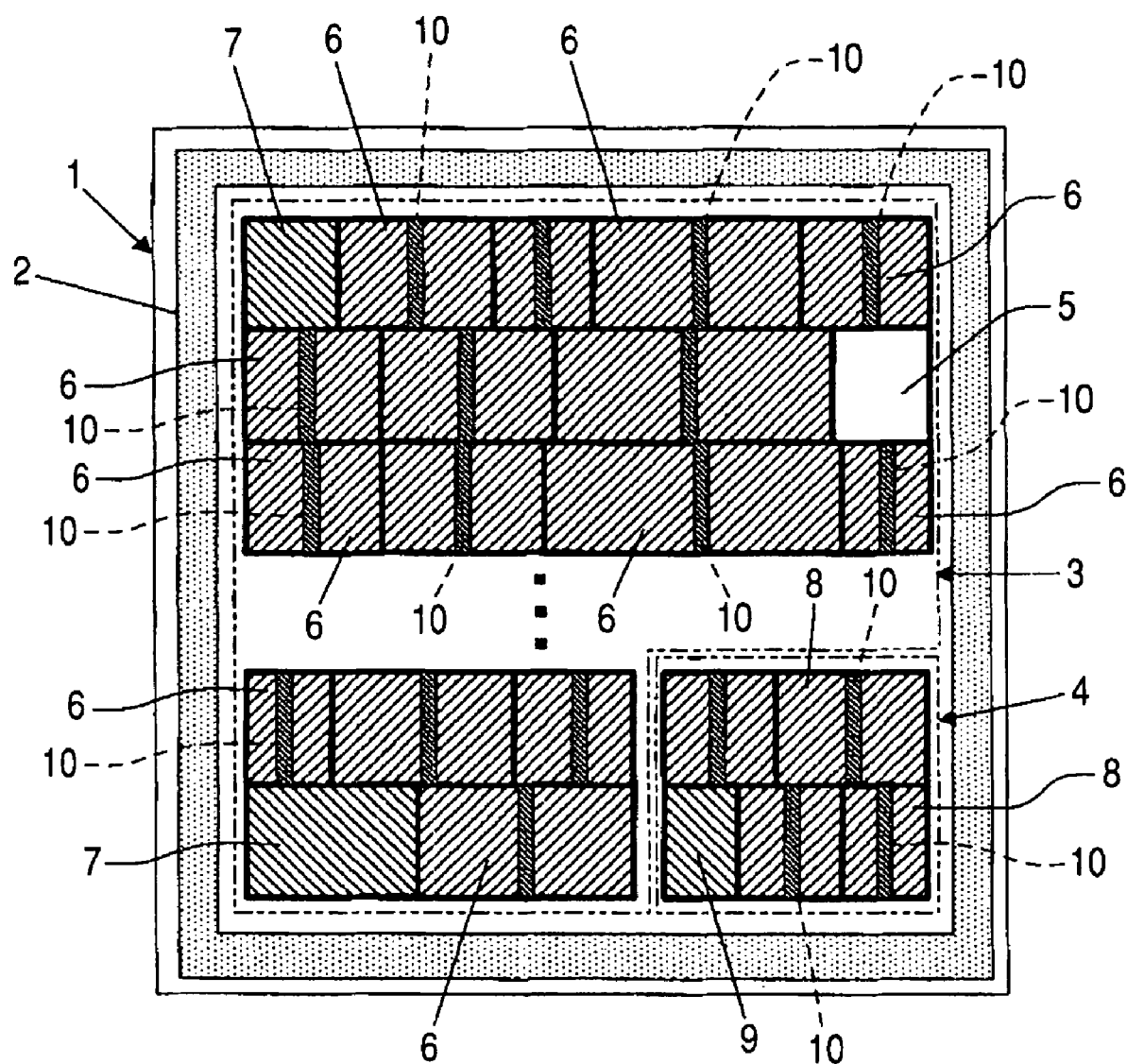
FIG. 3 is a plan view illustrating a planer configuration of the semiconductor integrated circuit in which central power supply switches of the power shuttable-down circuits are disposed.
Figure 4:
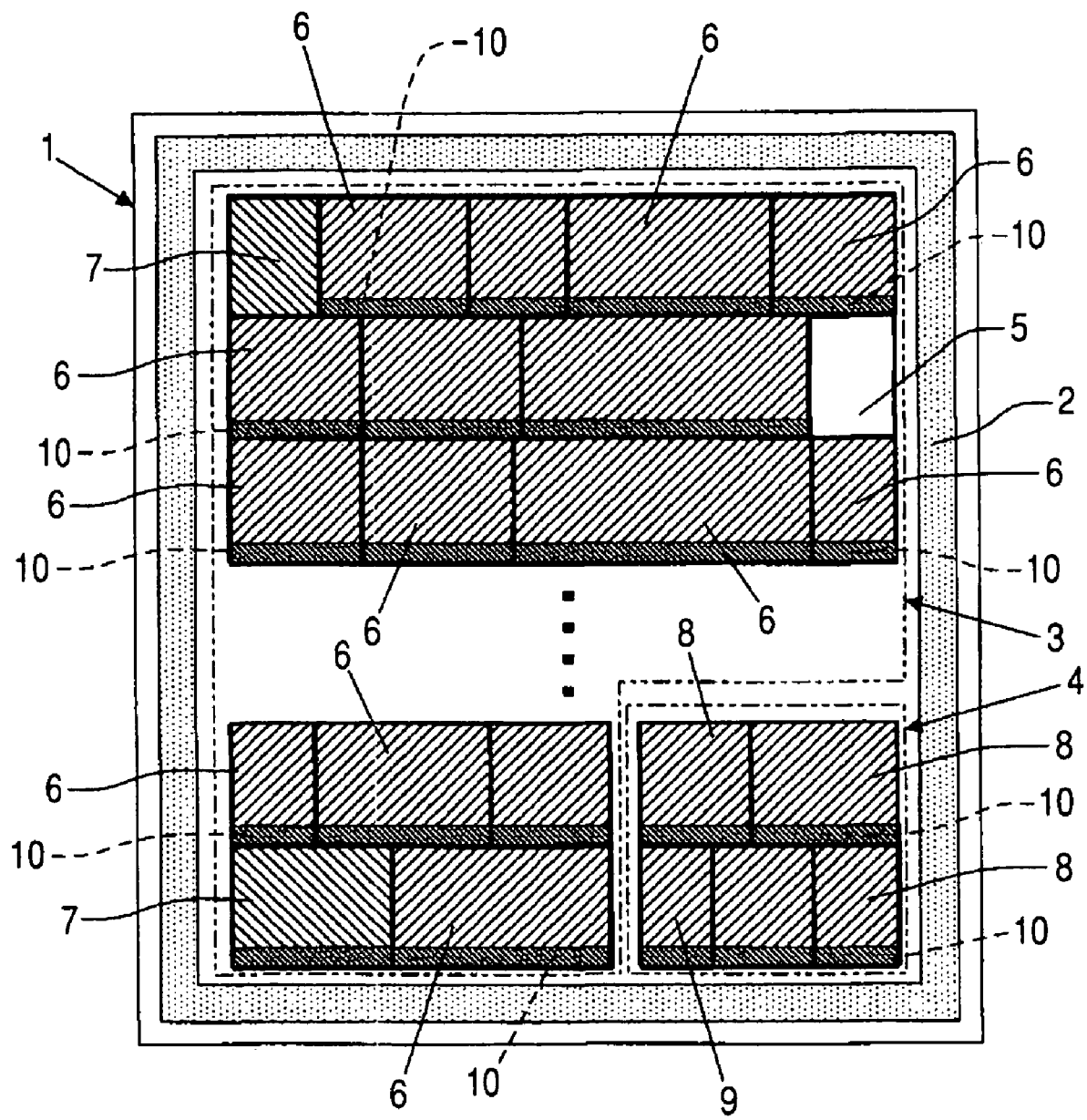
FIG. 4 is a plan view illustrating a planer configuration of the semiconductor integrated circuit in which power supply switches are disposed along the bottoms of the power shuttable-down circuits.

A planer configuration of a semiconductor integrated circuit 1 according to the present invention is illustrated in FIG. 2. A MOS integrated circuit equipped with a digital/analog-mixed SOI structure is illustrated as one example. A peripheral edge portion of the semiconductor integrated circuit 1 is defined as an area for forming an input/output circuit 2 used as an external interface circuit. A digital circuit area 3 and an analog circuit area 4 are formed inside the area as core circuit areas. A power control and body bias control circuit 5, power shuttable-down circuits 6 each of which makes it possible to selectively shut or block off the supply of operating power by the power control and body bias control circuit 5, and power non-shutdown circuits 7 each of which is always supplied with the applied operating power. The analog circuit area 4 includes power shuttable-down circuits 8 each of which makes it possible to selectively shut off the supply of the operating power by the power control and body bias control circuit 5, and a power non-shutdown circuit 9 which is always supplied with the applied operating power. Power supply switches 10 are disposed in the power shuttable-down circuits 6 and 8 respectively. The layout of the power supply switches in the power shuttable-down circuits 6 and 8 may be random. In terms of the regularity of their layout, the power supply switches 10 can also be disposed along the bottoms of the power shuttable-down circuits 6 and 8 in such a way as to be located in the centers of the power shuttable-down circuits 6 and 8 as shown in FIG. 3 or to be illustrated in FIG. 4. Although described in detail later, the layout of the power supply switches 10 is not basically subjected to device-structural restrictions.

Figure 5:
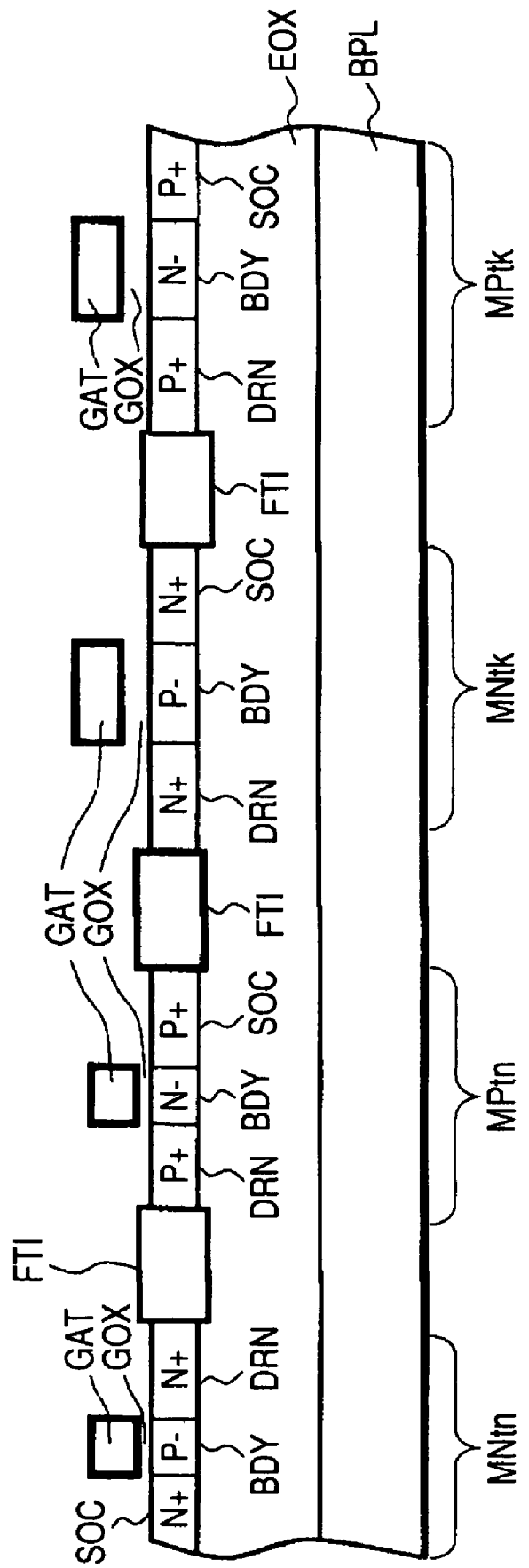
FIG. 5 is a sectional view illustrating a vertical sectional structure illustrative of SOI type MOS transistors that constitute the semiconductor integrated circuit.

A vertical sectional structure illustrative of SOI type MOS transistors that constitute the semiconductor integrated circuit 1 is illustrated in FIG. 5. Each MOS transistor is configured in an active region via an embedded oxide film EOX provided on a silicon substrate BPL, corresponding to an insulating thin film ranging from 20 to 200 nanometers. The active region is defined as a source SOC, a drain DRN and a body BDY. The body BDY assumes a channel forming region. A gate GAT is formed over its corresponding body BDY through a gate insulating film GOX interposed therebetween. The source SOC, drain DRN and body BDY are electrically separated from therearound by such full isolation regions FTIs (or partial isolation regions OTIs) as to cover the inside of each trench formed by, for example, an STI (Shallow Trench Isolation) method with silicon oxide and are electrically isolated from the silicon substrate by the embedded oxide film EOX.

The MOS transistors are classified into an n channel type MOS transistor MNtn and a p channel type first MOS transistor MPtn, which are used as first MOS transistors (thin film MOS transistors) relatively thin in gate oxide film, and an n channel type MOS transistor MNtk and a p channel type MOS transistor MPtk, which are used as second MOS transistors (thick film MOS transistors) relatively thick in gate oxide film. In each n channel type MOS transistor, the source SOC and drain DRN thereof comprise an N$^+$ type diffusion layer, and the body BDY thereof comprises a P$^-$ type diffusion layer. In each p channel type MOS transistor, the source SOC and drain DRN thereof consist of a P$^+$ type diffusion layer, and the body BDY thereof is made up of an N$^-$ type diffusion layer.

In each of the thin film MOS transistors MNtn and MPtn, for example, its channel length ranges from 45 nanometers (nm) to 180 nanometers (nm), the thickness of the gate oxide film thereof ranges from 1.5 nm to 3.9 nm, and a gate input voltage amplitude corresponding to the thickness of the gate oxide film ranges from 0.8V to 1.5V. In each of the thick film MOS transistors MNtk and MPtk, for example, its channel length ranges from 300 nm to 1000 nm, the thickness of the gate oxide film thereof ranges from 3.0 nm to 15.0 nm, and a gate input voltage amplitude corresponding to the thickness of the gate oxide film ranges from 1.2V to 5.0V. The thin film MOS transistors MNtn and MPtn are principally used to configure a digital logic circuit and an analog circuit in a core logic area. The thick film MOS transistors MNtk and MPtk are used to configure parts of the input/output circuit and analog circuit because of their high breakdown voltages. The thick film MOS transistors MNtk and MPtk are used even to configure the power shutdown switch 10 because of their high threshold voltages.

Figure 6:
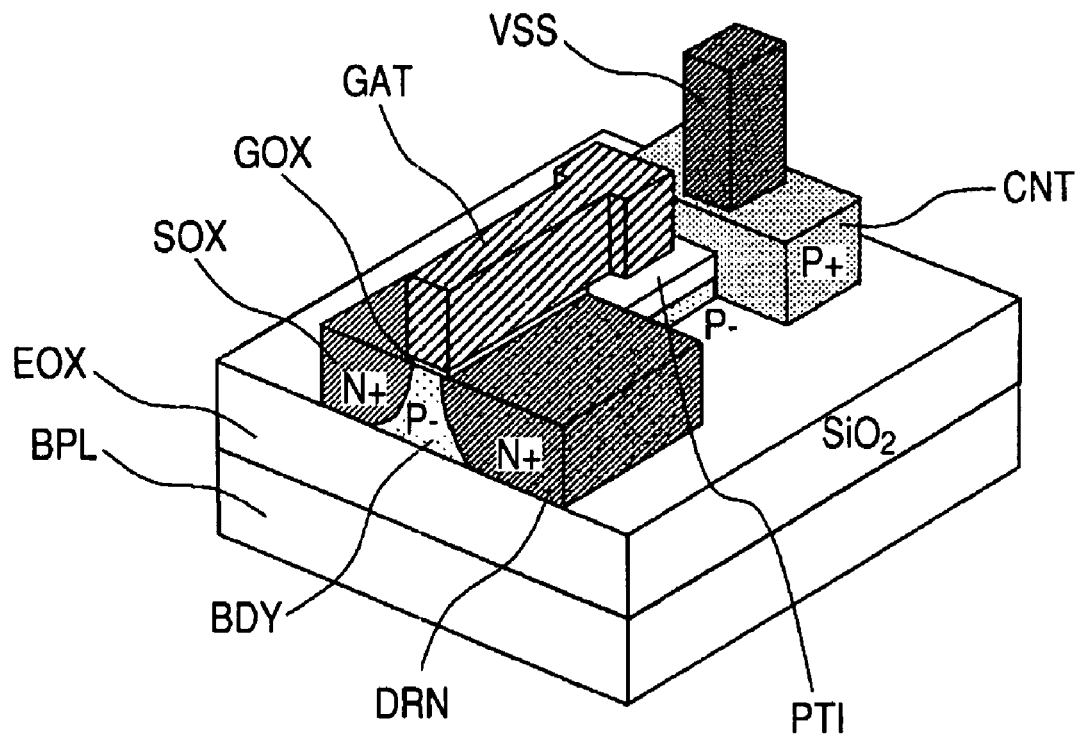
FIG. 6 is a bird's eye view showing an n channel type MOS transistor having an SOI structure.
Figure 7:
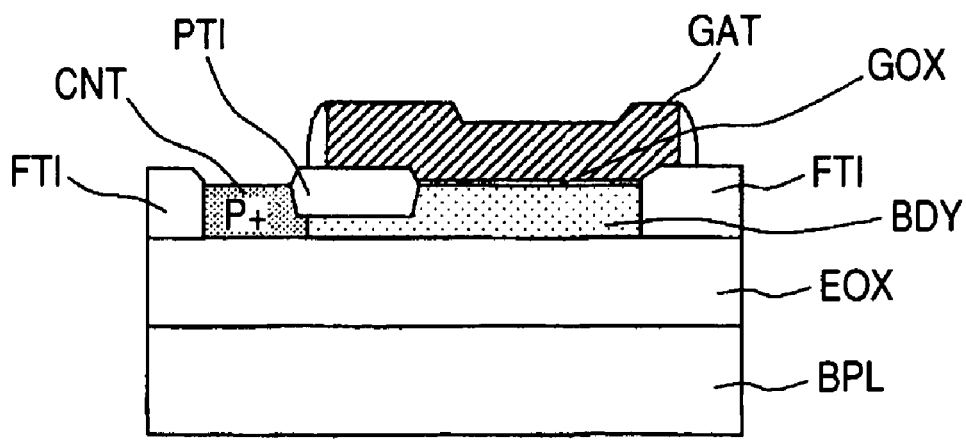
FIG. 7 is a vertical sectional view depicting the MOS transistor shown in FIG. 6.
Figure 8:
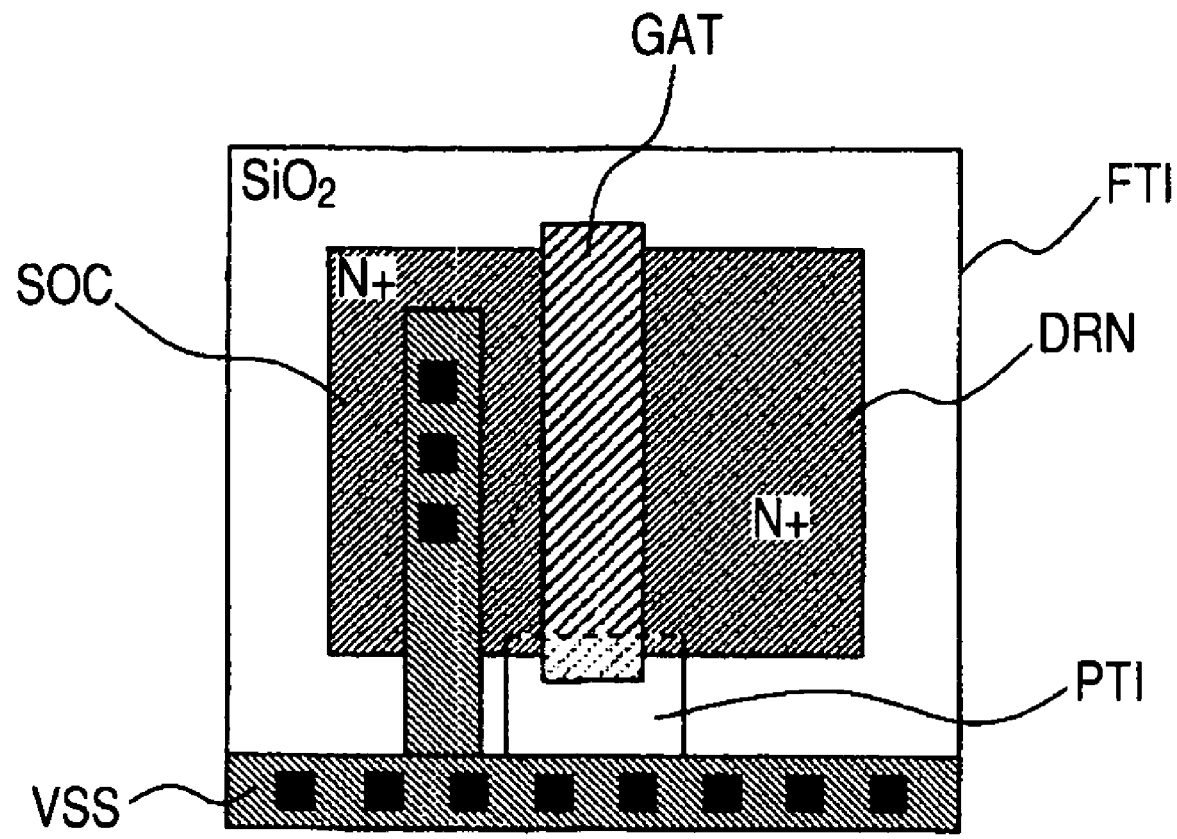
FIG. 8 is a plan view showing the MOS transistor shown in FIG. 6.

A bird's eye view of the n channel type MOS transistor of SOI structure is shown in FIG. 6, a vertical sectional view of FIG. 6 is shown in FIG. 7, and a plan view of FIG. 6 is shown in FIG. 8, respectively. It is apparent from FIGS. 6 through 8 that in the present SOI structure, the source SOC, drain DRN and body BDY of the n channel type MOS transistor are electrically isolated from therearound by the full isolation region FTI or the partial isolation region PTI and electrically isolated from the silicon substrate BPL by the embedded oxide film EOX. In particular, the body BDY may be floating or may be body-biased to prevent a fluctuation in body potential or control a threshold voltage. When its body biasing is performed, the body BDY is connected to a contact region CNT made up of, for example, a P type diffusion region (P$^+$), using the partial isolation region PTI. Here, there is shown an example in which the contact region CNT is connected to a metal ground wiring VSS to which the source SOC is connected.

Thus, since the individual MOS transistors are electrically isolated from one another in the SOI structure as described above, there is no need to perform isolation by well regions corresponding to conductivity types of the MOS transistors, differences in power supply voltage and the like. Further, there are little junction capacitance between the substrate and each MOS transistor and current leak between the substrate and each MOS transistor. The SOI structure is excellent in low voltage operation and high-speed operation.

Figure 1:
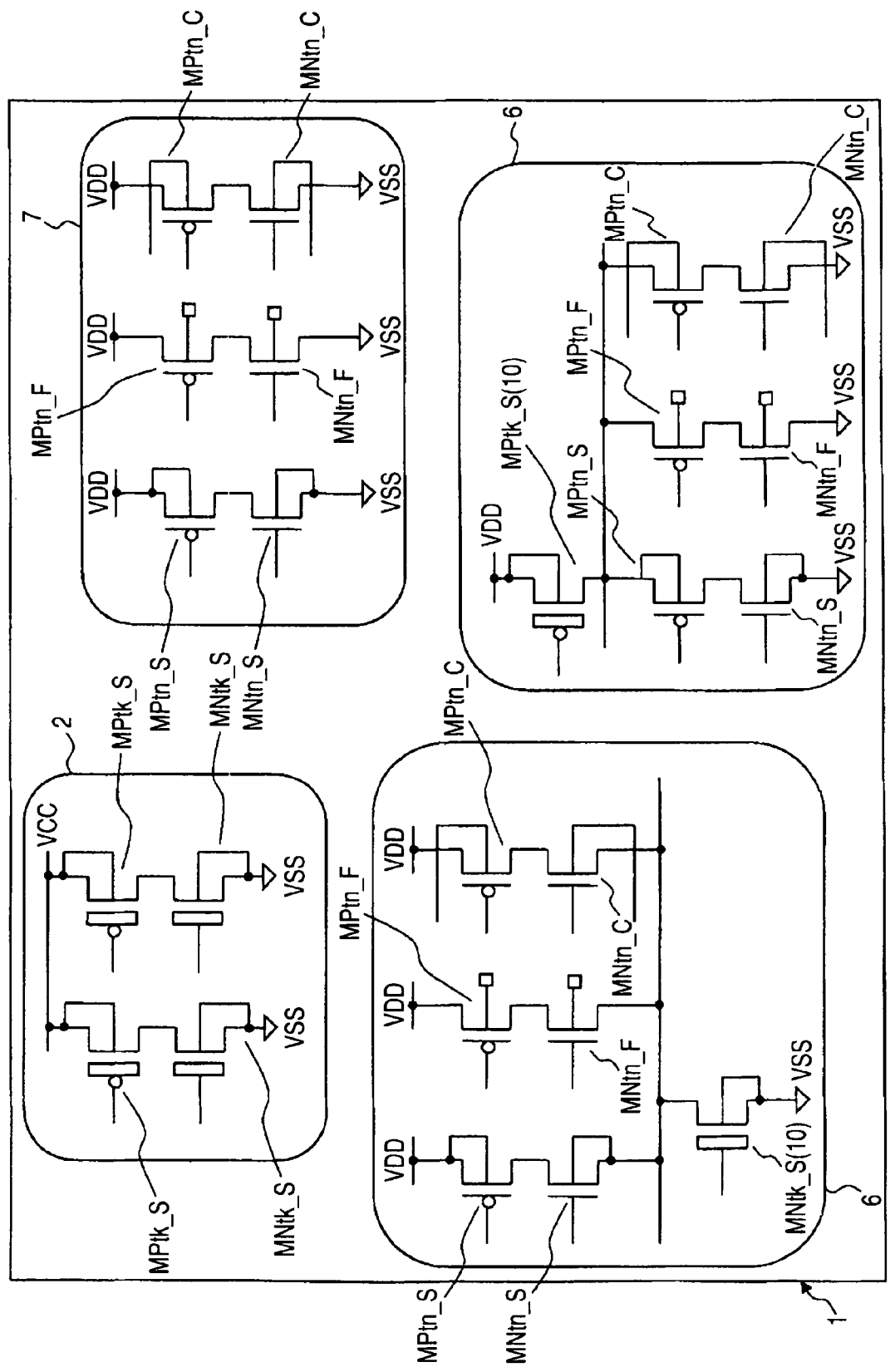
FIG. 1 is a circuit diagram illustrating power shuttable-down circuits, a power non-shutdown circuit and an input/output circuit having considered the characteristic of an SOI structure, as one example of a semiconductor integrated circuit according to the present invention.

A power shuttable-down circuit 6 (8), a power non-shutdown circuit 7 (9) and an input/output circuit 2 having considered the characteristic of an SOI structure are illustrated in FIG. 1. In the present specification, a suffix S appended to the back of a reference numeral of each MOS transistor means that the body BDY is biased to its own source potential. A suffix F means that the body BDY is floating, and a suffix C means that the bias voltage of the body BDY is variably controlled. Let's assume that when either the body bias, body floating or body potential variable control based on a source potential may be selected, the suffixes of S, F and C are not appended to the reference numerals of the MOS transistors. In the power shuttable-down circuit 6 and the power non-shutdown circuit 7, MOS transistors subjected to the source-potential fixing of the body, the body floating and the body potential variable control are constituted as existent in mixed form. The input/output circuit 2 is constituted of MOS transistors MPtk_S and MNtk_S whose bodies are fixed to their own source potentials.

The power shuttable-down circuits 6 each disposed between a power supply voltage VDD and a ground voltage VSS have thick film MOS transistors MNtk_S and MPtk_S used as power supply switches 10. The power non-shutdown circuit 7 is not provided with the thick film MOS transistors MNtk_S and MPtk_S used as the power supply switches 10. The body bias of the MOS transistor that constitutes each power supply switch 10 is not limited to the source potential fixing but may be variably controlled.

In the power shuttable-down circuit 6, a circuit typified by a CMOS inverter constituted of a plurality of thin film MOS transistors MNtn and MPtn is connected in serried with each of the thick film MOS transistors MNtk_S and MPtk_S used as the power supply switches 10. The power non-shutdown circuit 7 also has a circuit typified by a CMOS inverter constituted of a plurality of thin film MOS transistors MNtn and MPtn provided in series. When, for example, the ground voltage VSS is 0V and the power supply voltage VDD is 1.5V, gate input voltage amplitudes of the thin film MOS transistors MNtn and MPtn are set to 1.5V. At this time, gate input voltage amplitudes of the thick film MOS transistors MNtk_S and MPtk_S that constitute the power supply switches 10 are set to 3.3V. Although not shown in the figure in particular, only either one of the thick film MOS transistors MNtk_S and MPtk_S used as the power supply switches 10 in the power shuttable-down circuit 6 may be used or both of them may be used in one power shuttable-down circuit. A circuit typified by a CMOS inverter constituted of a plurality of thick film MOS transistors MNtk_S and MPtk_S is illustrated as the input/output circuit 2. In the present example, the ground voltage VSS is set to 0V and a power supply voltage VCC is set to 3.3V.

Incidentally, as to symbol notation of the MOS transistors on the drawings, the p channel type MOS transistors are respectively distinguished from the n channel type MOS transistors by circling the gates of the p channel type MOS transistors. The thick film MOS transistors are respectively distinguished from the thin film MOS transistors by notating the gates of the thick film MOS transistors relatively thickly.

Figure 9:
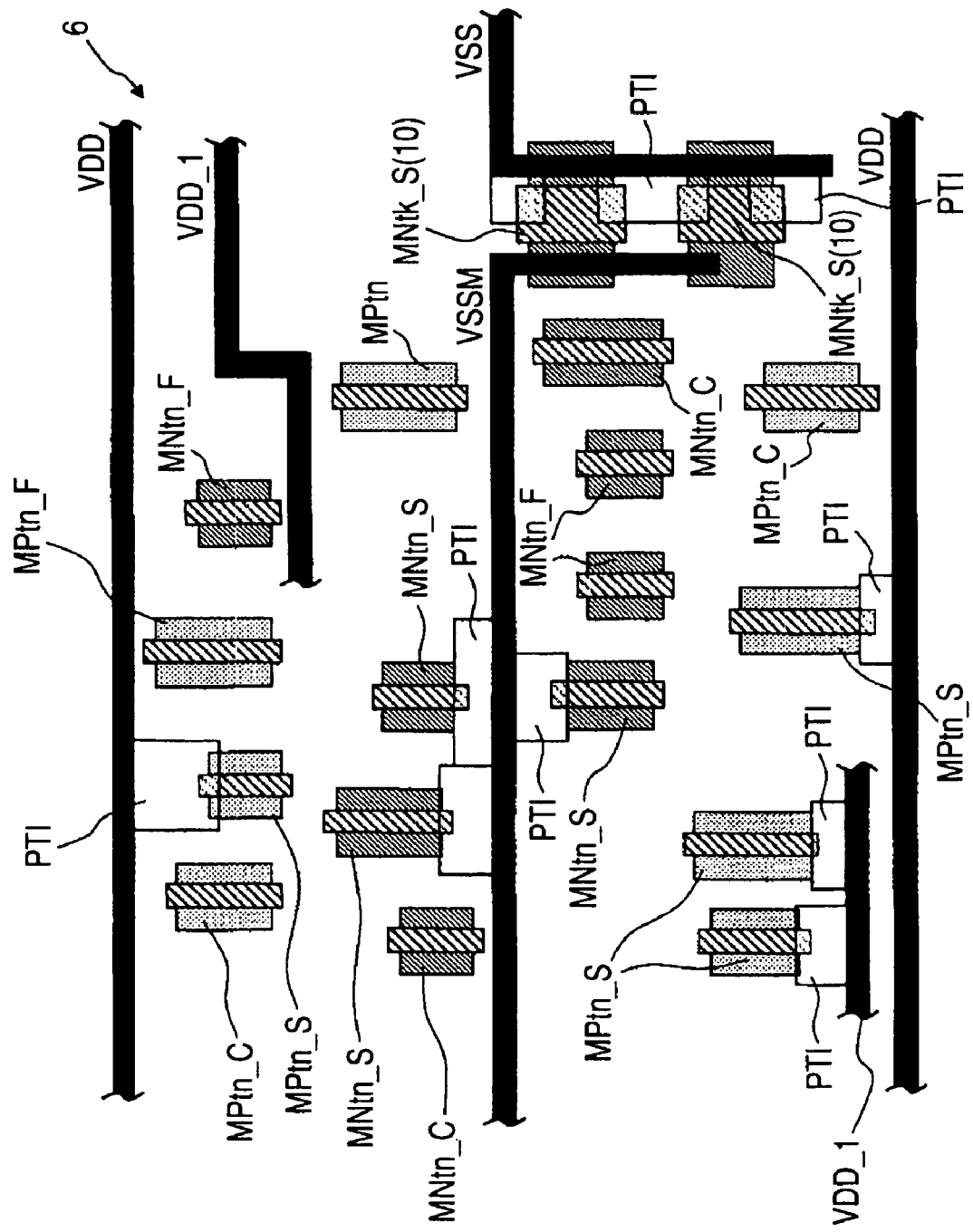
FIG. 9 is a layout diagram illustrating a planer configuration of the power shuttable-down circuit.

A planer configuration of the power shuttable-down circuit 6 is illustrated in FIG. 9. Signal wirings connected to the drains and sources are omitted here. As is apparent from the figure, thick film MOS transistors MNtk_S and MPtk_S that constitute the power supply switches 10 can be freely laid out without effecting region isolation like well isolation on the thin film MOS transistors MNtn and MPtn that perform logical operations or the like. Similarly, n channel type thin film MOS transistors MNtn and p channel type thin film MOS transistors MPtn can also be laid out freely without performing the region isolation like the well isolation. Further, as a result thereof, the layout of partial power wirings can also be freely laid out as typified by VDD_1. The commonalization of body potentials using the partial isolation regions PTIs can also be performed easily in arbitrary units. Besides, MOS transistors MNtn_S (MPtn_S) whose body potentials are fixed to their corresponding source potentials, MOS transistors MNtn_F (MPtn_F) whose bodies are brought into floating, and MOS transistors MNtn_C (MPtn_C) whose body potentials can be variably controlled, can be laid out freely therebetween without performing the region isolation like the well isolation.

Figure 10:
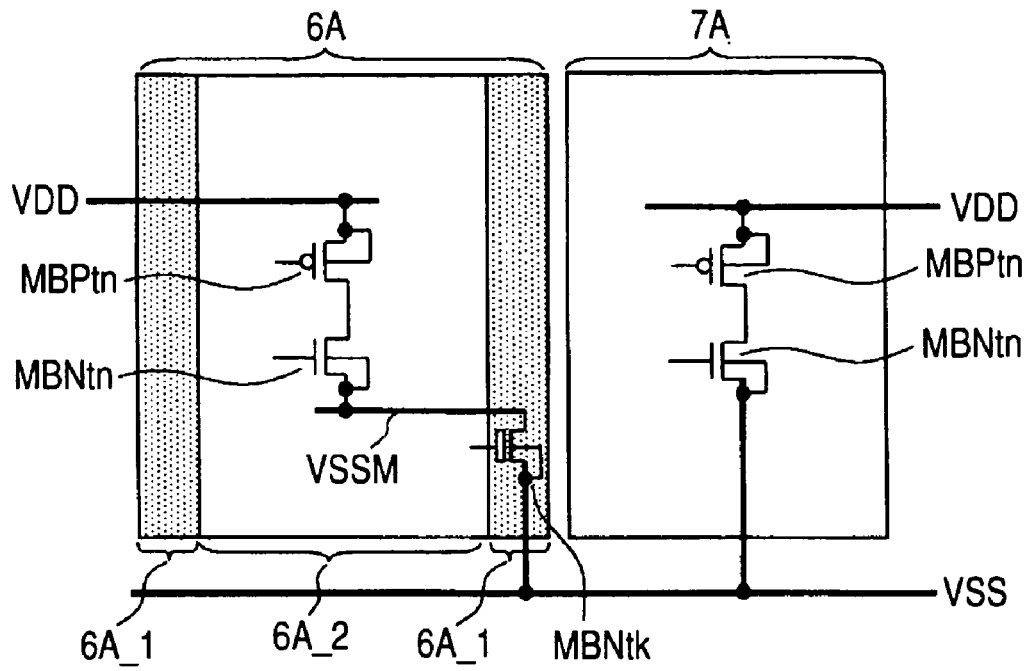
FIG. 10 is a circuit diagram showing, as a comparative example of FIG. 1, circuit configurations of a power shuttable-down circuit and a power non-shutdown circuit each constituted of a bulk type MOS transistor.
Figure 11:
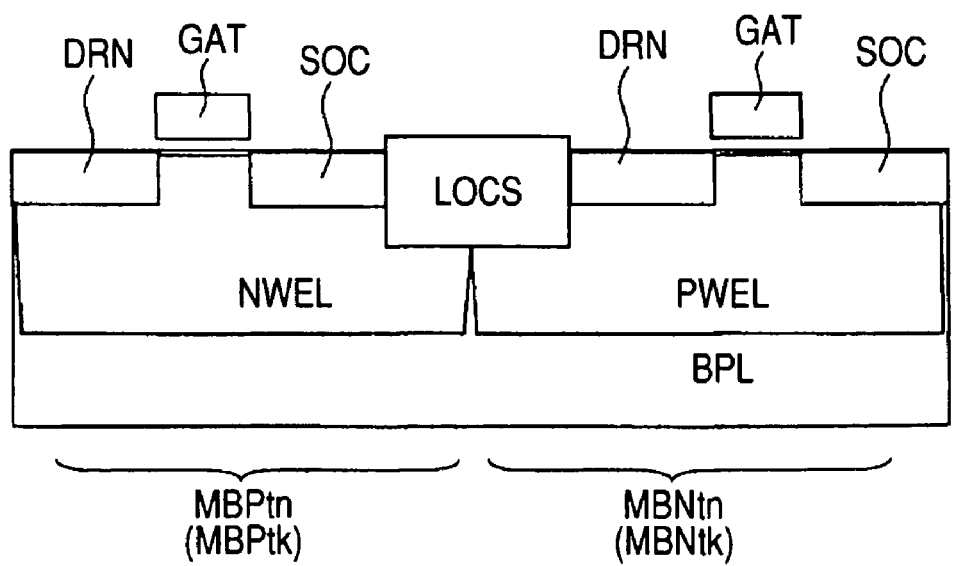
FIG. 11 is a vertical sectional view showing a bulk type CMOS circuit.

A circuit configuration illustrative of a power shuttable-down area and a power non-shutdown area constituted of bulk type MOS transistors is shown in FIG. 10 as a comparative example of FIG. 1. In a bulk type CMOS circuit as illustrated in FIG. 11, a p channel type MOS transistor MBPtn is formed in an n type well region PWEL, and an n channel type MOS transistor MOStn is formed in an n type well region NWEL, whereby well-region isolation is performed. Thus, a substrate BPL and well regions PWEL and NWEL are biased in the backward direction therebetween, and the well regions PWEL and NWEL and a source SOC/drain DRN are biased in the backward direction therebetween, whereby electrical isolation is carried out. LCS is LOCOS which performs lateral device isolation. Although not shown in the figure in particular, a thick film n channel type MOS transistor MBNtk and a thick film p channel type MOS transistor MBPtk used for an external input/output circuit are also subjected to well-region isolation in like manner.

Although the manner of well-region isolation by the conductivity types of MOS transistors is not specifically shown in the example shown in FIG. 10, there is a need to separate the power shuttable-down area 6A and the power non-shutdown area 7A from each other and further isolate an area 6A_1 for forming a power supply switch by a thick film MOS transistor MBNtk and an area 6A_2 for performing logical operations or the like from each other within the power shuttable-down area 6A. The area 6A_1 and the area 6A_2 are isolated from each other within the power shuttable-down area 6A to reduce junction leaks between a well and a source and drain in the area 6A_2 in a power shutdown state. Since each MOS transistor does not originally develop leaks between each MOS transistor and the substrate by virtue of the embedded oxide film EOX in the configuration of FIG. 1, there is no need to take such a consideration essentially in terms of a device structure. The power shuttable-down area 6A and the power non-shutdown area 7A are isolated from each other in FIG. 10 because there is a difference in that the well potential of the power non-shutdown area 7A is of a ground potential VSS, whereas the well potential of the area 6A_2 for performing the logical operations in the power shuttable-down area 6A becomes a virtual ground VSSM corresponding to a drain voltage of the power supply switch MBNtk upon the supply of operating power. Although not shown in the figure in particular, this is the same even when the power supply switch is of a p channel type MOS transistor or it is configured using a thin film MOS transistor. Since the bodies DBY can originally be isolated from one another by the embedded oxide film EOX and the isolation regions FTIs (or isolation regions OTIs) in the respective MOS transistors under the configuration shown in FIG. 1, such well region isolation is not needed essentially.

Figure 12:
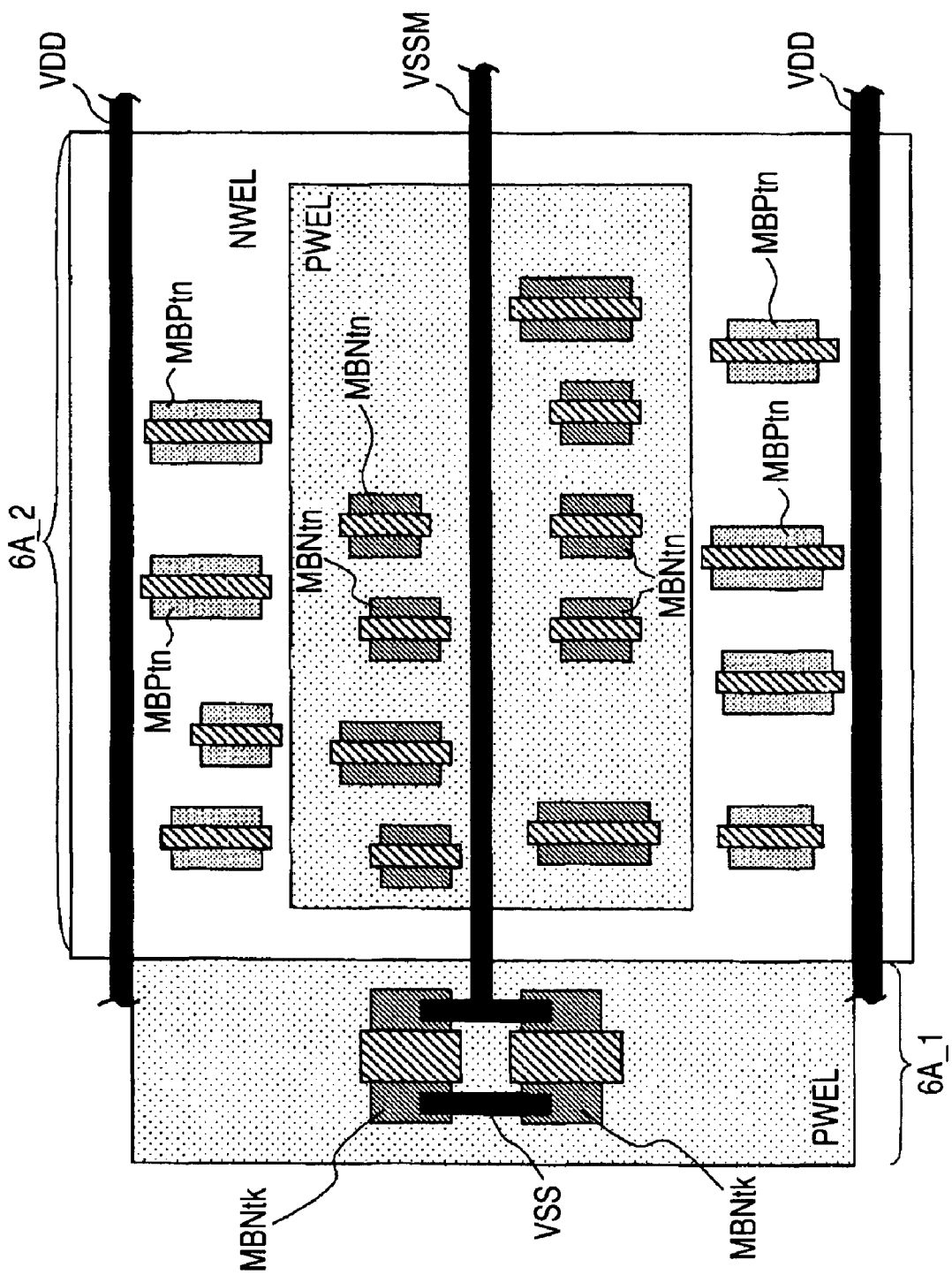
FIG. 12 is a layout diagram showing, as a comparative example, a planer configuration of a power shuttable-down circuit corresponding to FIG. 10.

A planar layout configuration of a power shuttable-down area corresponding to FIG. 10 is shown in FIG. 12 as a comparative example. As described in FIG. 10, well region isolation is carried out even between an area 6A_1 for forming each power supply switch and an area 6A_2 for performing logical operations or the like together with well region isolation by the conductivity type of each MOS transistor.

<<Transistor Characteristics Corresponding to Body's Bias Form>>

Figure 24:
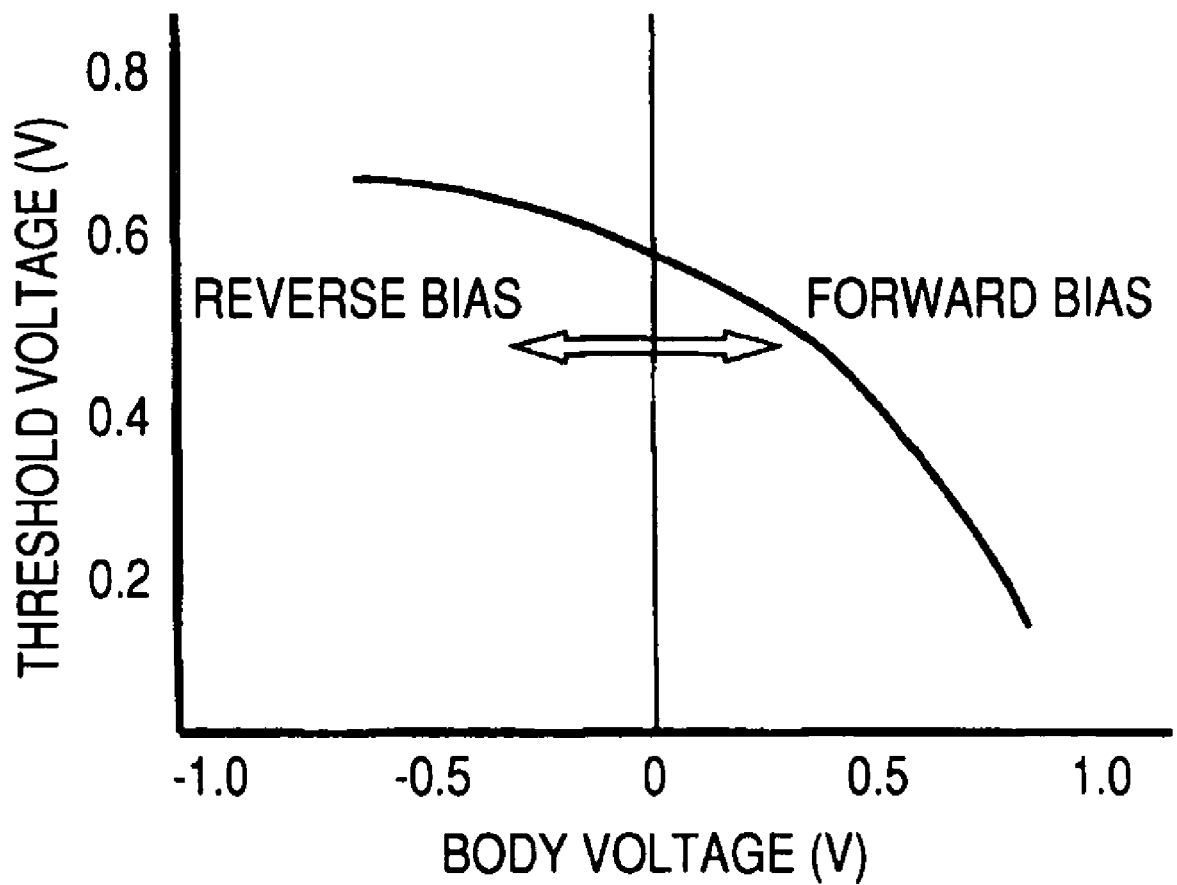
FIG. 24 is a characteristic diagram showing the relationship between a body potential of each MOS transistor and a threshold voltage thereof.

A description will now be made, in advance, of the characteristics of floating for the body of each MOS transistor, the body biasing based on the source potential and variable control on the body biasing. The relationship between a body potential of each MOS transistor and its threshold voltage reaches such a tendency as shown in FIG. 24. In FIG. 24, the body potential 0V means that it is equal to the source potential. A positive body potential indicates a pro-drain potential, and a negative body potential means a potential in the direction opposite to the positive body potential. In the case of an n channel type MOS transistor, its threshold voltage is lowered (reduced) as the body voltage increases. In the case of a p channel type MOS transistor, its threshold voltage is lowered (reduced) as the body voltage decreases. For convenience, the body bias as viewed in the direction in which the threshold voltage is lowered, is referred to as a forward bias, and the body bias as viewed in the direction in which the threshold voltage is increased, is referred to as a reverse bias.

If the body potential of the MOS transistor is fixed using its own source potential or the like, then an undesired variation in threshold voltage can be suppressed. Besides, even though an electrical charge occurs in the support substrate due to the incidence of radiation, the electrical charge has little effect on electric conduction of a channel portion by isolation using the embedded oxide film. Therefore, the SOI structure is capable of obtaining high resistance to soft error at a memory circuit as will be described later.

The body potential varies due to capacitive coupling to the gate by bringing each body into floating. The direction in which the body potential varies corresponds to the direction in which the threshold voltage of each MOS transistor is reduced in its on state. Thus, it can contribute to the high-speed operation of a logic circuit.

If the body bias is made variable, then the advantage of a high-speed operation based on a small threshold voltage can be emphasized by application of the forward bias. Applying the reverse bias enables emphasis on a reduction in subthreshold leak or low power consumption by a large threshold voltage.

<<Primitive Cells>>

Figure 13:
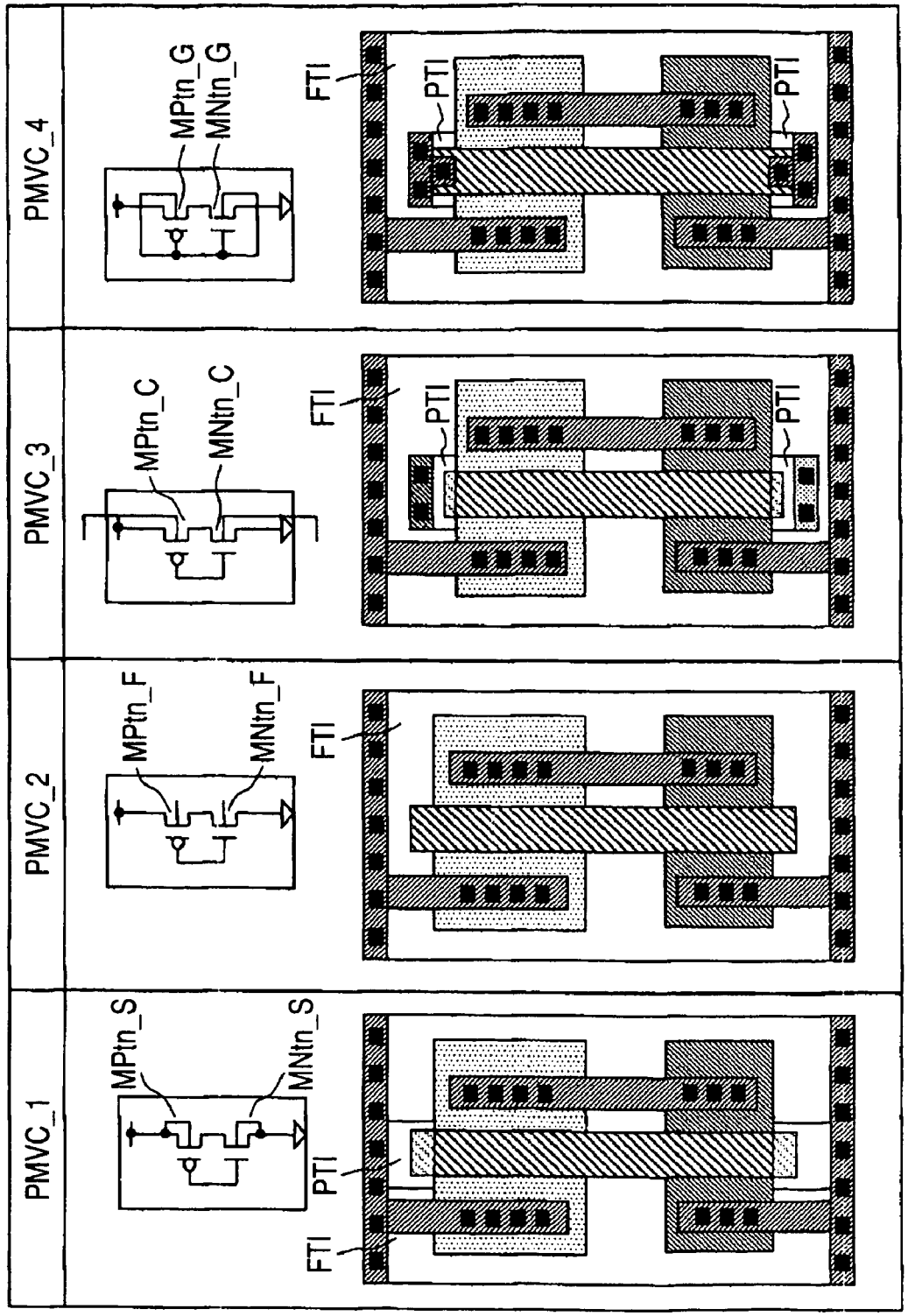
FIG. 13 is a diagram for describing one example illustrative of primitive cells usable by the power shuttable-down circuit and the power non-shutdown circuit.
Figure 14:
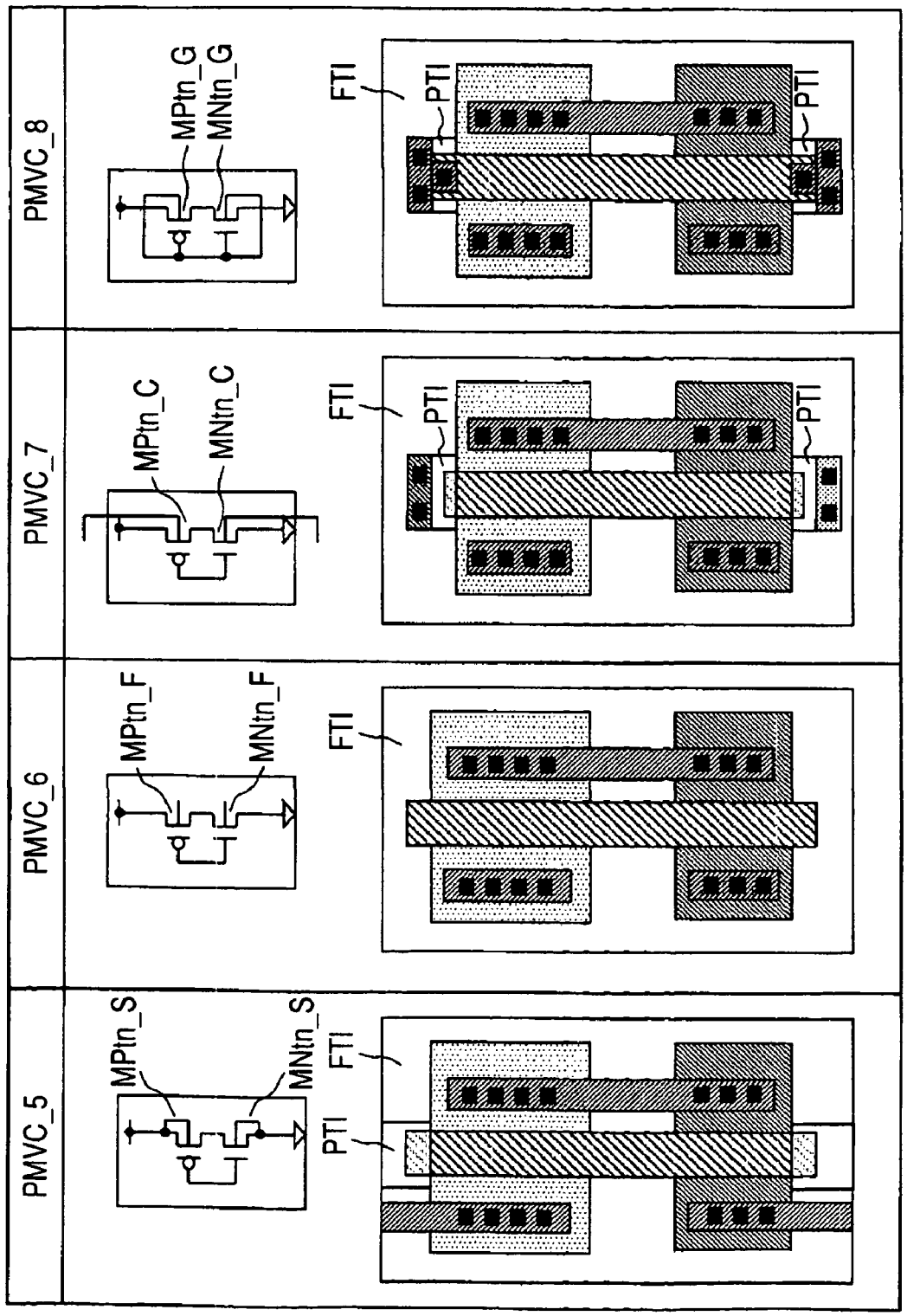
FIG. 14 is an explanatory diagram showing one example illustrative of other primitive cells usable by the power shuttable-down circuit and the power non-shutdown circuit.

While the power shuttable-down circuit 6 and the power non-shutdown circuit 7 can also be constituted by full custom design, its adaptation by a standard cell system will be taken into consideration here. Preparing several primitive cells as design parts in advance and performing design using the same make it possible to facilitate circuit design and layout design. Primitive cells illustrated in FIGS. 13 and 14, for example, are prepared. Although each of logical functions of the primitive cells shown in the same figures is taken or set with a CMOS inverter as one example, it is needless to say that the logical function can suitably be changed.

The primitive cell PMVC_1 comprises thin film MOS transistors MPtn_S and MNtn_S. Bodies BDY of the two transistors are connected to their own sources via partial isolation regions PTIs. The primitive cell PMVC_2 comprises thin film MOS transistors MPtn_F and MNtn_F. Bodies BDY of both transistors are being brought into floating. The primitive cell PMVC_3 comprises thin film MOS transistors MPtn_C and MNtn_C. Bodies BDY of both transistors are provided in such a manner that their body potentials are made variable by signal wirings connected via partial isolation regions PTIs. In brief, the primitive cell PMVC_3 is placed under mode control type active body bias control (MC_ABC). The primitive cell PMVC_4 comprises thin film MOS transistors MPtn_G and MNtn_G whose bodies BDY are connected to their own gates via partial isolation regions PTIs. In brief, the primitive cell PMVC_4 is placed under self-control type active body bias control.

Since well power feeding at a bulk structure is not necessary for the SOI structure, wirings such as power paths, ground paths and the like may not be necessarily disposed above and below each primitive cell. The primitive cells PMVC_5 through PMVC_8 shown in FIG. 14 have taken it into consideration.

<<Layout Forms of MOS Transistors>>

Figure 15:
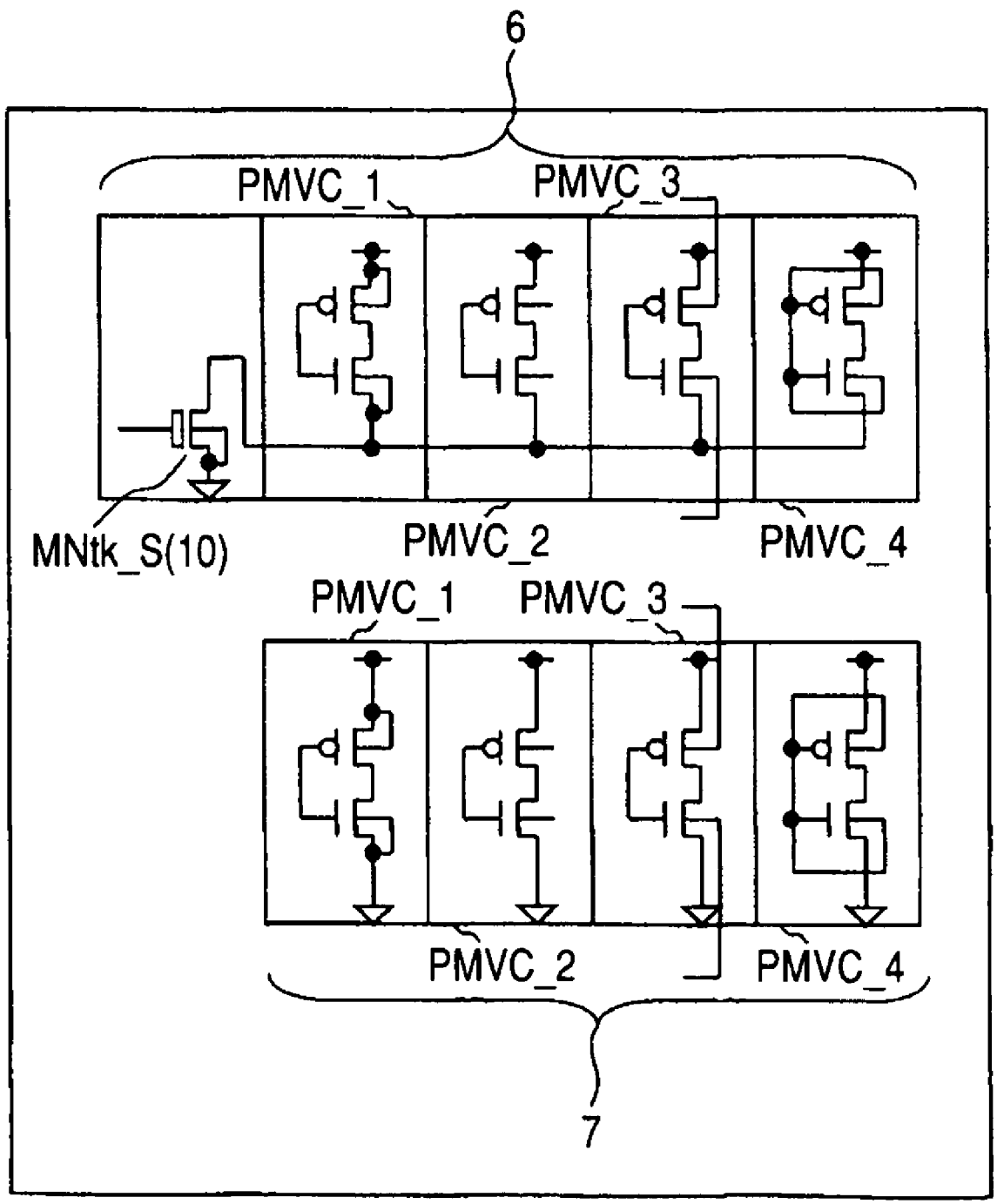
FIG. 15 is a circuit diagram illustrating a circuit in which primitive cells and the like are used in a power shuttable-down circuit and a power non-shutdown circuit.

A circuit in which primitive cells or the like are used in the power shuttable-down circuit 6 and the power non-shutdown circuit 7, is illustrated in FIG. 15. In the same figure, connecting signal wirings for MOS transistors MNtn and MPtn among the primitive cells are not shown in the figure except for a power system. Even primitive cells different in body bias form can be disposed adjacent to one another. This is because there is no need to perform well isolation at the bulk structure.

Figure 16:
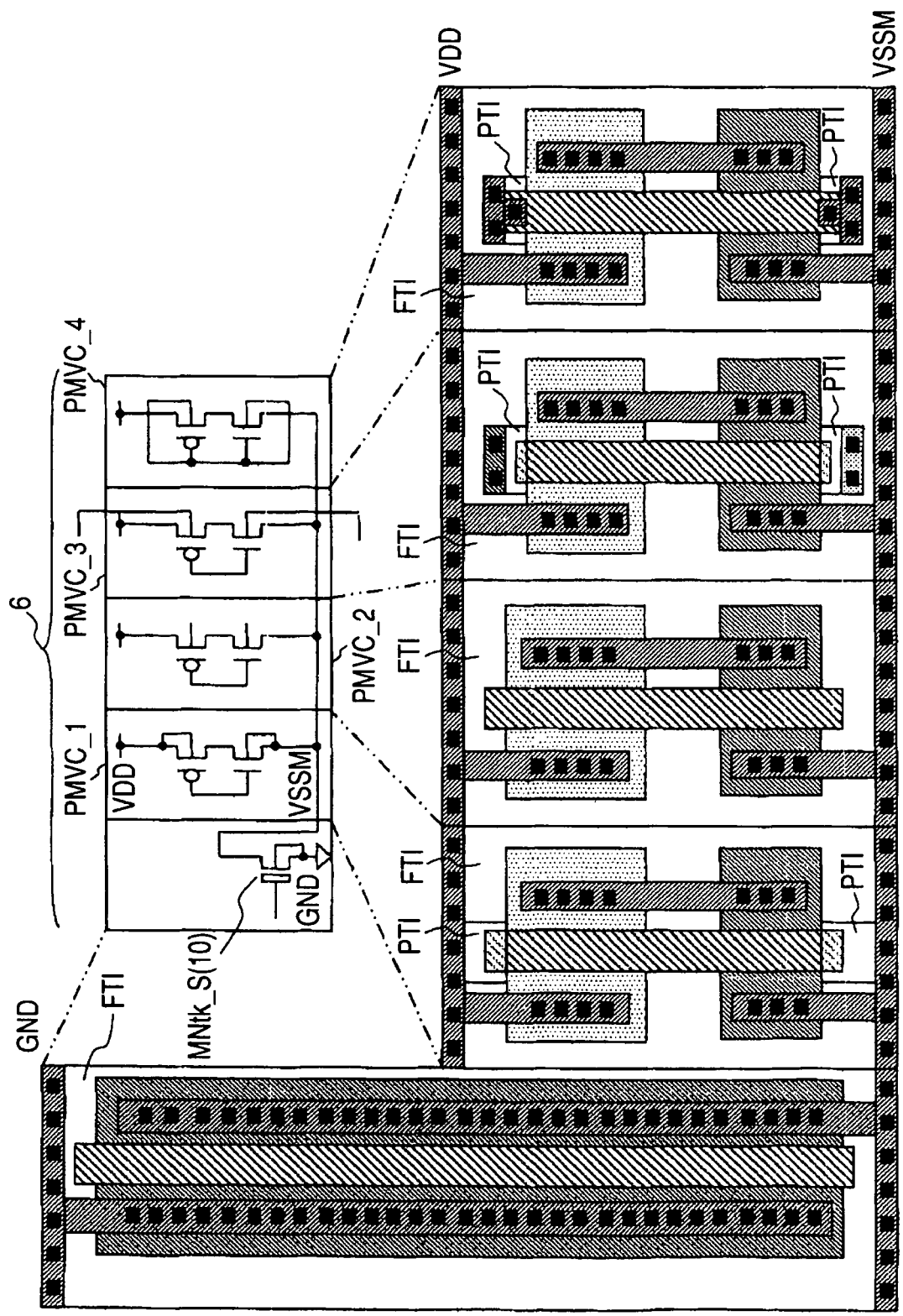
FIG. 16 is an explanatory diagram illustrating a circuit in which primitive cells and the like are used in a power shuttable-down circuit, and layout forms thereof.

A circuit using primitive cells or the like in the power shuttable-down circuit 6 and its layout configuration or form are illustrated in FIG. 16. A gate width of a thick film MOS transistor MNtk_S that constitutes a power supply switch is set large as compared with the thin film MOS transistors MNtn and MPtn. This is done to obtain current supply capability.

Figure 17:
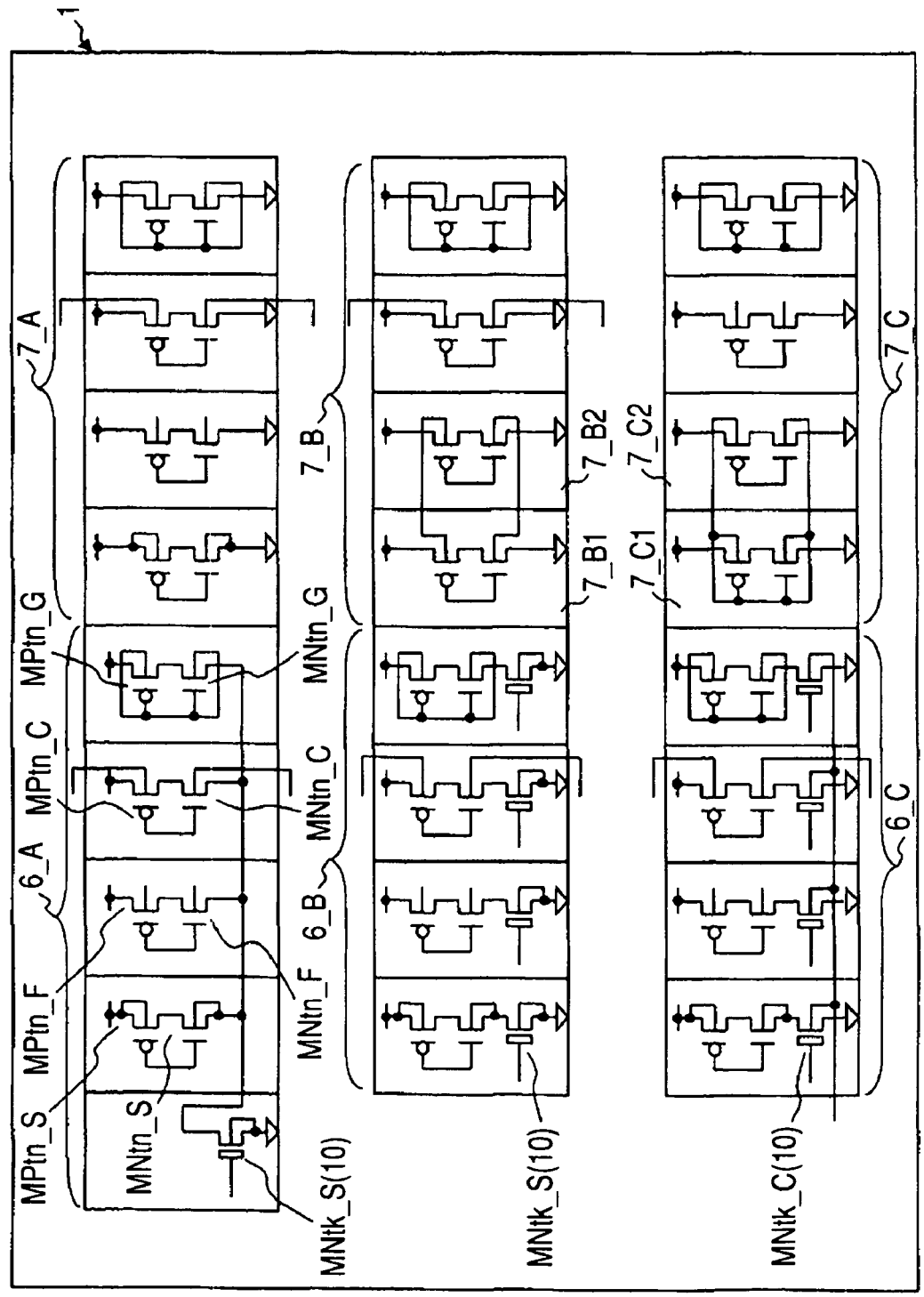
FIG. 17 is a circuit diagram typically showing a layout example of MOS transistors different in body bias form in power shuttable-down circuits and power non-shutdown circuits.

A layout example of MOS transistors different in body bias form in the power shuttable-down circuit 6 and the power non-shutdown circuit 7 is typically shown in FIG. 17. While a CMOS inverter is taken as one example of a logic circuit in the same figure, it is needless to say that the function of the logic circuit can suitably be changed. In a power shuttable-down circuit 6_A, a power supply switch 10 constituted of a MOS transistor MNtk_S is shared for each circuit. In a power shuttable-down circuit 6_B, power supply switches 10 each constituted of a MOS transistor MNtk_S are individualized for respective circuits. In a power shuttable-down circuit 6_C, MOS transistors MNtk_C that constitute power supply switches 10 individualized for respective circuits are variably body-biased by a common signal wire or line. As illustrated in a power non-shutdown circuit 7_B, body potentials of a plurality of circuits 7_B1 and 7_B2 may be set in common. Likewise, body potentials of a plurality of circuits 7_C1 and 7_C2 may be set in common as illustrated in a power non-shutdown circuit 7_C.

Figure 18:
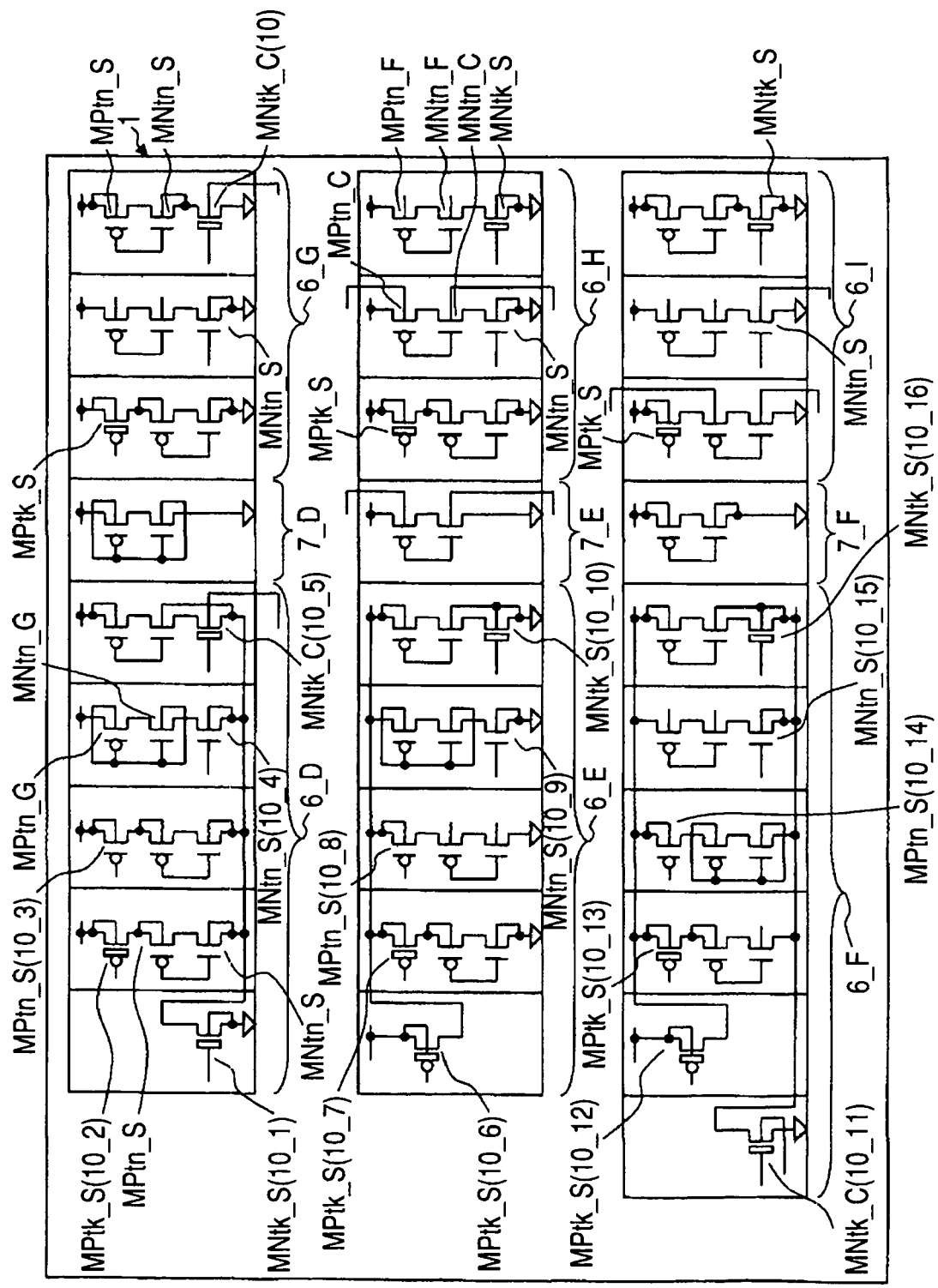
FIG. 18 is a circuit diagram illustrating a layout state in which various MOS transistors different in body bias form, conductivity type and gate oxide-film thickness are disposed adjacent to one another, and a hierarchical structure of power supply switches.

A layout state in which various MOS transistors different in body bias form, conductivity type and gate oxide-film thickness are disposed adjacent to one another, and a hierarchical structure of power supply switches are shown in FIG. 18. Although each of CMOS inverters is shown as one example of a logic circuit in the same figure, it is needless to say that the function of the logic circuit can suitably be changed. It is also possible for a power shuttable-down circuit 6_D to adopt a circuit configuration in which a high hierarchy power supply switch 10_1 constituted of an n channel type thick film MOS transistor MNtk_S and a low hierarchy power supply switch 10_2 constituted of a p channel type thick film MOS transistor MPtk_S are interposed in one current dc path, adopt a circuit configuration in which a power supply switch 10_3 constituted of a p channel type thin film MOS transistor MPtn_S is interposed as a low hierarchy power supply switch, and adopt, as a low hierarchy power supply switch, a power supply switch 10_4 constituted of an n channel type thin film MOS transistor MNtn_S or a power supply switch 10_5 constituted of an n channel type thick film MOS transistor MNtk_C. It is also possible for another power shuttable-down circuit 6_E to adopt a circuit configuration in which a high hierarchy power supply switch 10_6 constituted of a p channel type thick film MOS transistor MPtk_S and a low hierarchy power supply switch 10_7 constituted of a p channel type thick film MOS transistor MPtk-S are interposed in one current dc path, adopt a circuit configuration in which a power supply switch 10_8 constituted of a p channel type thin film MOS transistor MPtn_S is interposed as a low hierarchy power supply switch, and adopt, as a low hierarchy power supply switch, a power supply switch 10_9 constituted of an n channel type thin film MOS transistor MNtn_S or a power supply switch 10_10 constituted of an n channel type thick film MOS transistor MNtk_C. It is also possible for a further power shuttable-down circuit 6_F to have both a high hierarchy power supply switch 10_11 constituted of an n channel type thick film MOS transistor MNtk_S and a high hierarchy power supply switch 10_12 constituted of a p channel type thick film MOS transistor MPtk_S. At this time, it is also possible to further interpose in a dc path, a low hierarchy power supply switch 10_13 constituted of a p channel type thick film MOS transistor MPtk-S, interpose therein a power supply switch 10_14 constituted of a p channel type thin film MOS transistor MPtn_S as a low hierarchy power supply switch, interpose therein a power supply switch 10_15 constituted of an n channel type thin film MOS transistor MNtn_S as a low hierarchy power supply switch, or interpose therein a power supply switch 10_16 constituted of an n channel type thick film MOS transistor MNtk_C. In power shutdown circuits 6_G, 6_H and 6_I, power supply switches 10 are constituted of thick film MOS transistors MPtk_D and MNtk_S and a thin film MOS transistor MNtn_S without hierarchization. Primitive cells PMVC_1, PMVC_3 and PMVC_4 are shown in power non-shutdown circuits 7_D, 7_E and 7_F.

In the semiconductor integrated circuit 1 as shown in FIGS. 17 and 18, the body bias forms of the thick film MOS transistors MNtk and MPtk that constitute the individual power supply switches 10, and the body bias forms of the thin film MOS transistors MNtn and MPtn that constitute the logic circuits or the like can be suitably combined in the individual power shuttable-down circuits 6. The body bias forms of the thin film MOS transistors MNtn and MPtn that constitute the logic circuits or the like can also be suitably combined in the power non-shutdown circuits 7. The body bias forms are not prevented from differing between the adjacent transistors. This is because even in the case of MOS transistors different in various ways in body potential, bodies BDY of the respective transistors bring about attainment of their own electrical isolation by the embedded oxide film EOX and isolation regions FTIs and PTIs.

<<Fixing of Body Potential at Memory Circuit>>

Figure 19:
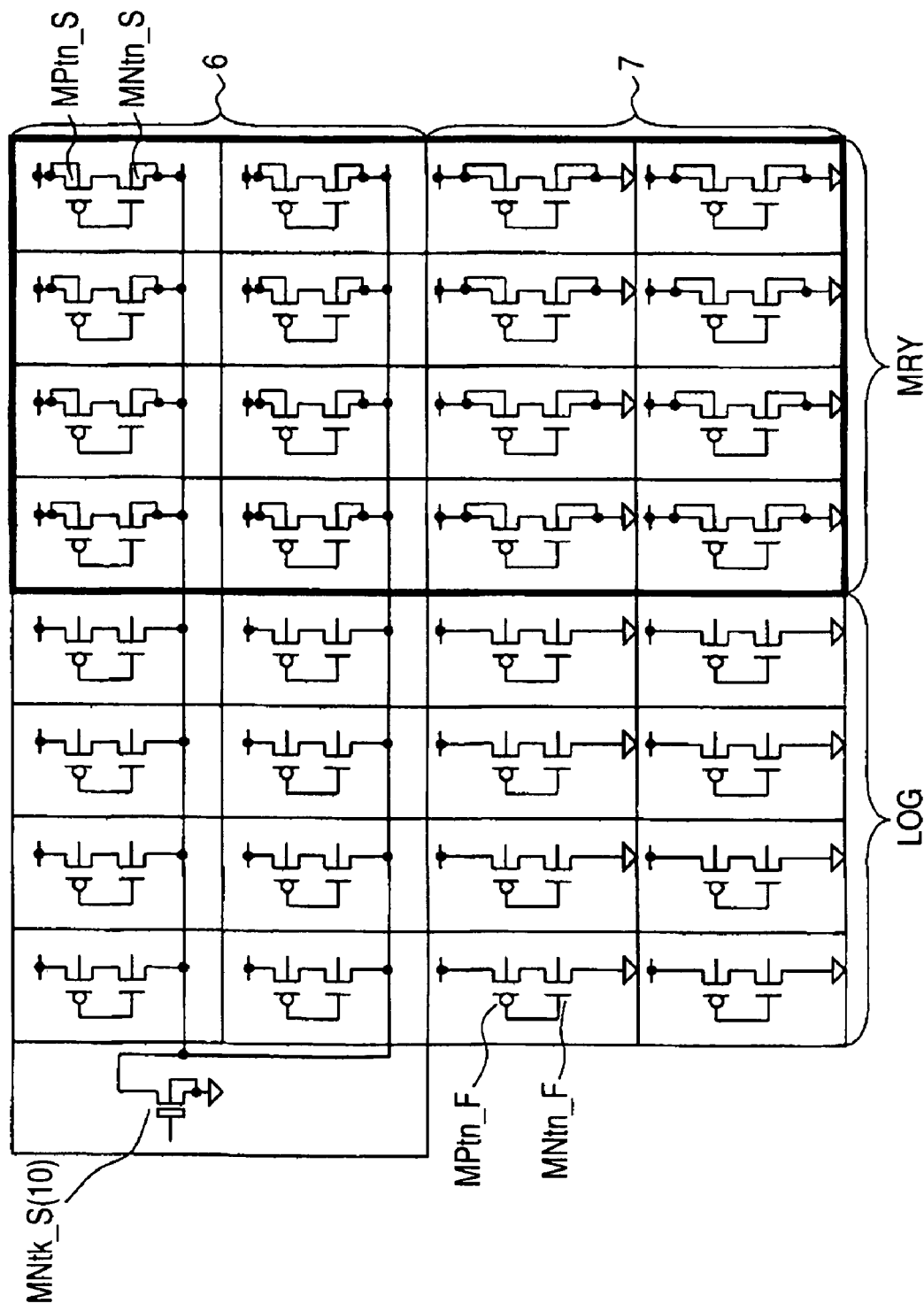
FIG. 19 is a circuit diagram showing one example of a semiconductor integrated circuit equipped with a memory circuit.

A description will be made of a specific example related to how to use body biases properly. One example of a semiconductor integrated circuit 1 equipped with a memory circuit is shown in FIG. 19. A logic circuit LOG and a memory circuit MRY are respectively configured astride a power shuttable-down circuit 6 and a power non-shutdown circuit 7. For instance, the memory circuit MRY is a static type memory array that constitutes a cache memory, an address translation buffer or the like. The logic circuit LOG is defined as control logic such as a central processing unit (CPU), an interrupt controller or the like. In both of the power shuttable-down circuit 6 and the power non-shutdown circuit 7, MOS transistors that constitute the memory circuit MRY are constituted of MOS transistors MPtn_S and MNtn_S whose body potentials are fixed by their own sources. The SOI structure is originally high in resistance to radiation by blocking the incidence of radiation with a substrate portion. Further, even though a positive charge occurs in the oxide film due to the incidence of radiation, the charge is hard to be accumulated or stored owing to the action of the body bias, and the memory circuit can obtain high resistance to soft error. MOS transistors that constitute the logic circuit LOG are configured by MOS transistors MPtn_F and MNtn_F whose body potentials are brought into floating. By bringing them into body floating, the body potentials vary depending upon capacitive coupling to their gates. The direction in which the body potential of each MOS transistor varies assumes the direction in which its threshold voltage is reduced in an on state f each MOS transistor. This can therefore contribute to a high-speed operation of the logic circuit.

Figure 20:
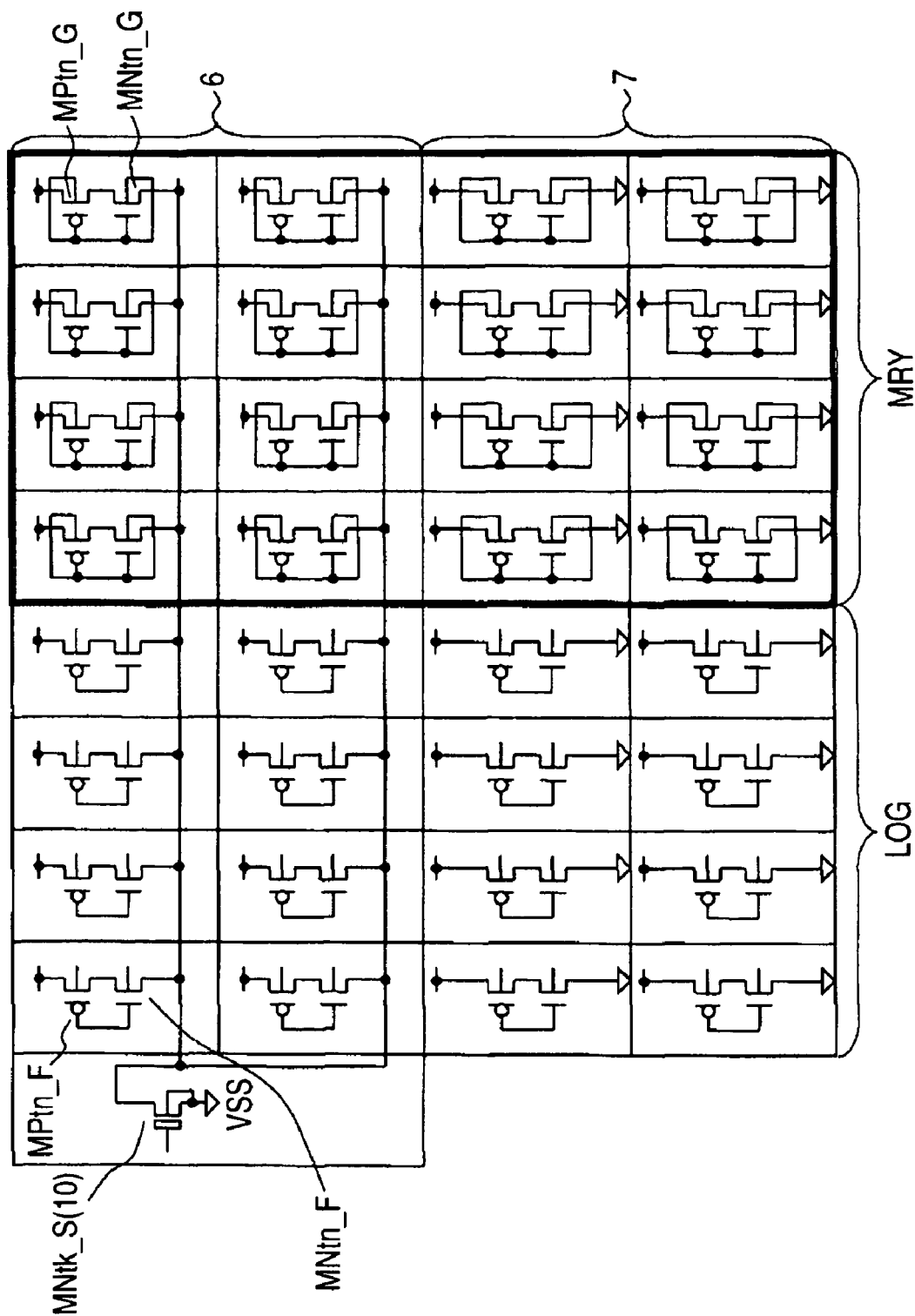
FIG. 20 is a circuit diagram illustrating a power shuttable-down circuit and a power non-shutdown circuit having a memory circuit like a static memory cell array that makes use of MOS transistors whose bodies are biased at their gates.

As illustrated in FIG. 20, a memory circuit MRY like a static memory cell array may be configured using MOS transistors MPtn_G and MNtn_G whose bodies are biased at their gates. It is thus possible to increase resistance to radiation as compared with the body floating and realize an increase in operating speed and a reduction in leak current in a manner similar to the body floating.

<<Sequence Circuits with Fixing of Body Potentials and Combinational Circuits with Body Floating>>

Figure 21:
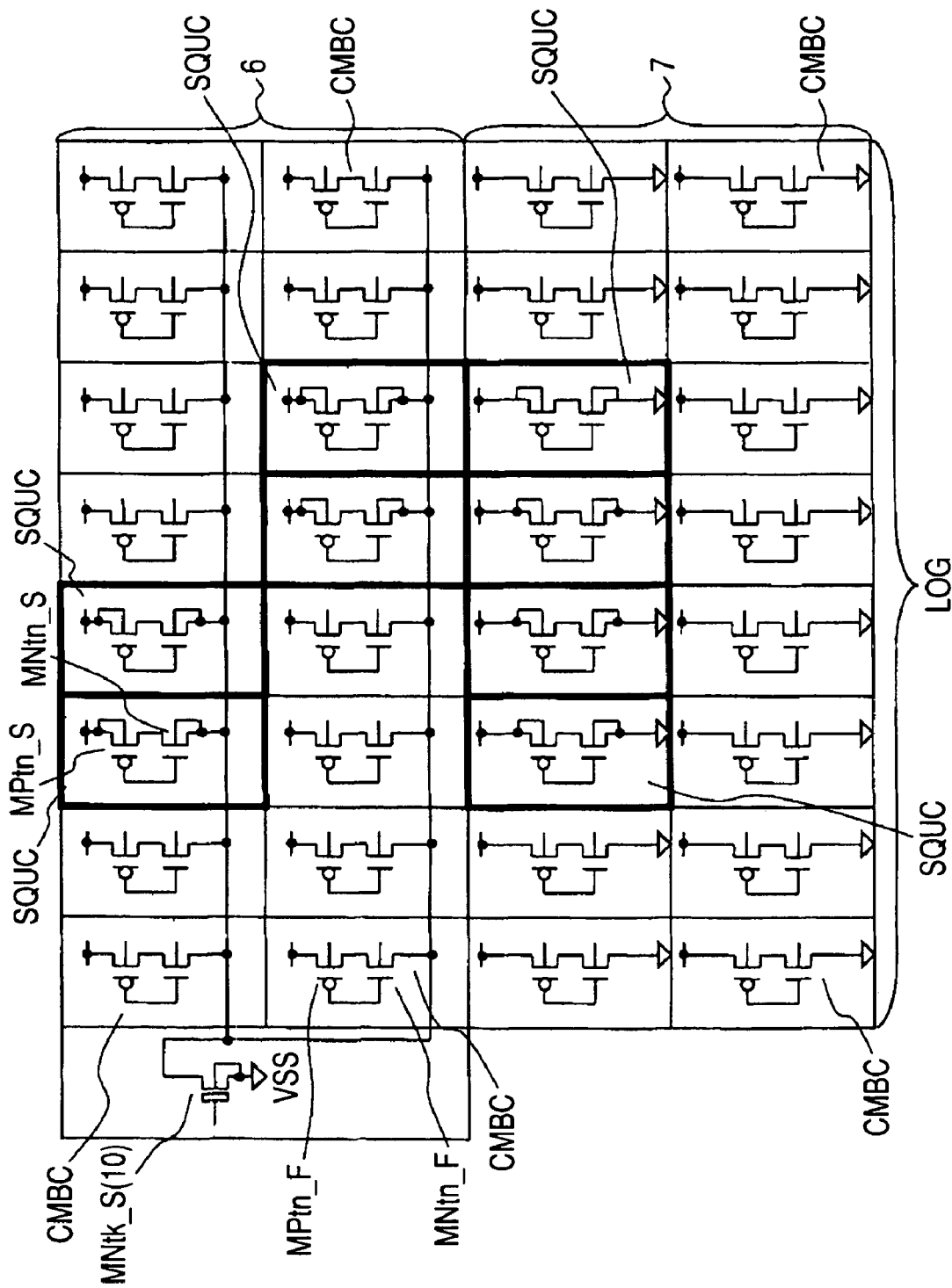
FIG. 21 is a circuit diagram showing an example of separate use of body biases employed in a logic circuit including sequence circuits such as flip-flops, latch circuits, etc.

Another example in which body biases are properly used in a logic circuit LOG is shown in FIG. 21. Sequence circuits SQUC such as flip-flops, latch circuits, etc. are formed in respective areas surrounded by a bold frame in the logic circuit LOG. Combination circuits CMBC are formed in respective areas surrounded by a thin or unbold frame. Each of the sequence circuits SQUC is constituted of thin film MOS transistors MPtn_S and MNtn_S whose bodies are coupled to their own sources. On the other hand, each of the combination circuits CMBC is constituted of thin film MOS transistors MPtn_F and MNt_F whose bodies are brought into floating.

Figure 22:
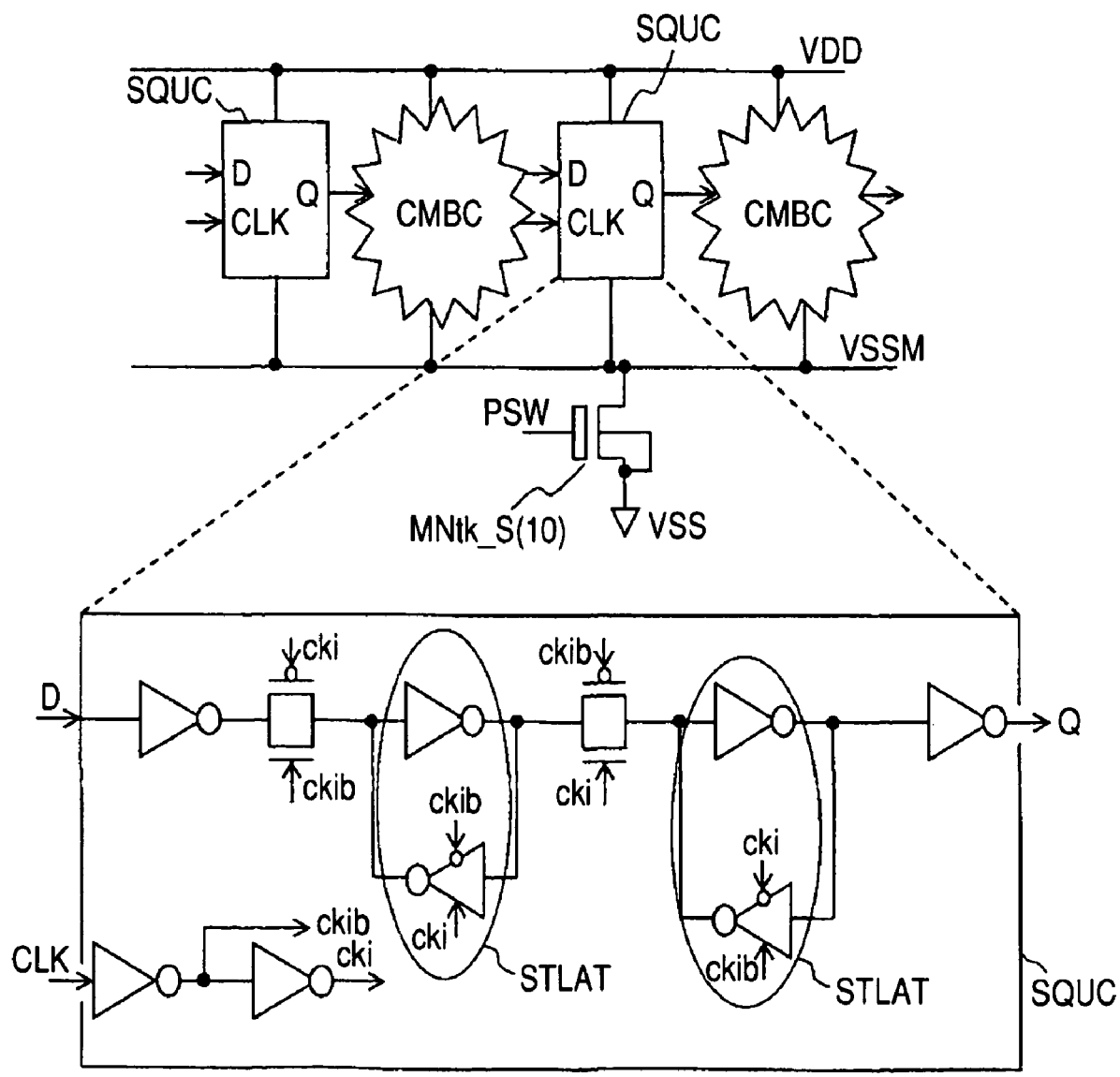
FIG. 22 is a circuit diagram showing sequence circuits and combination circuits disposed in a series configuration with a signal propagation path in a clock synchronous logic circuit.

The sequence circuits SQUC and the combination circuits CMBC disposed in a series configuration with a signal propagation path in a clock synchronous logic circuit are shown in FIG. 22. Each sequence circuit SQUC is fixed to a body potential and each combination circuit CMBC is brought into body floating. The sequence circuit SQUC is constituted of flip-flops. The combination circuits CMBC and the sequence circuits SQUC are supplied with operating power from a power supply wiring VDD and connected to a ground wiring VSS via a power supply switch 10 comprised of an n channel type thick film MOS transistor MNtk. PSW indicates a power supply switch control signal. In the sequence circuits SQUC, MOS transistors each fixed to the body potential may be at least MOS transistors MNtn and MPtn that constitute each static latch STLAT. However, even each MOS transistor that constitutes other transfer gate or inverter does not prevent the body potential from being fixed to its own source.

Each sequence circuit SQUC, which constitutes the memory circuit like each latch at the clock synchronous logic stage, can contribute to an improvement in reliability of a logical operation because of the high resistance to soft error. Even though precedence of a high-speed operation based on body floating is given to the combination circuit CMBC connected in series with the sequence circuit SQUC, an improvement in data processing performance by a digital circuit, and the like can be expected without losing the reliability of the logical operation.

<<Analog Circuit with Body-Potential Fixing and Digital Circuit with Body Floating>>

Figure 23:
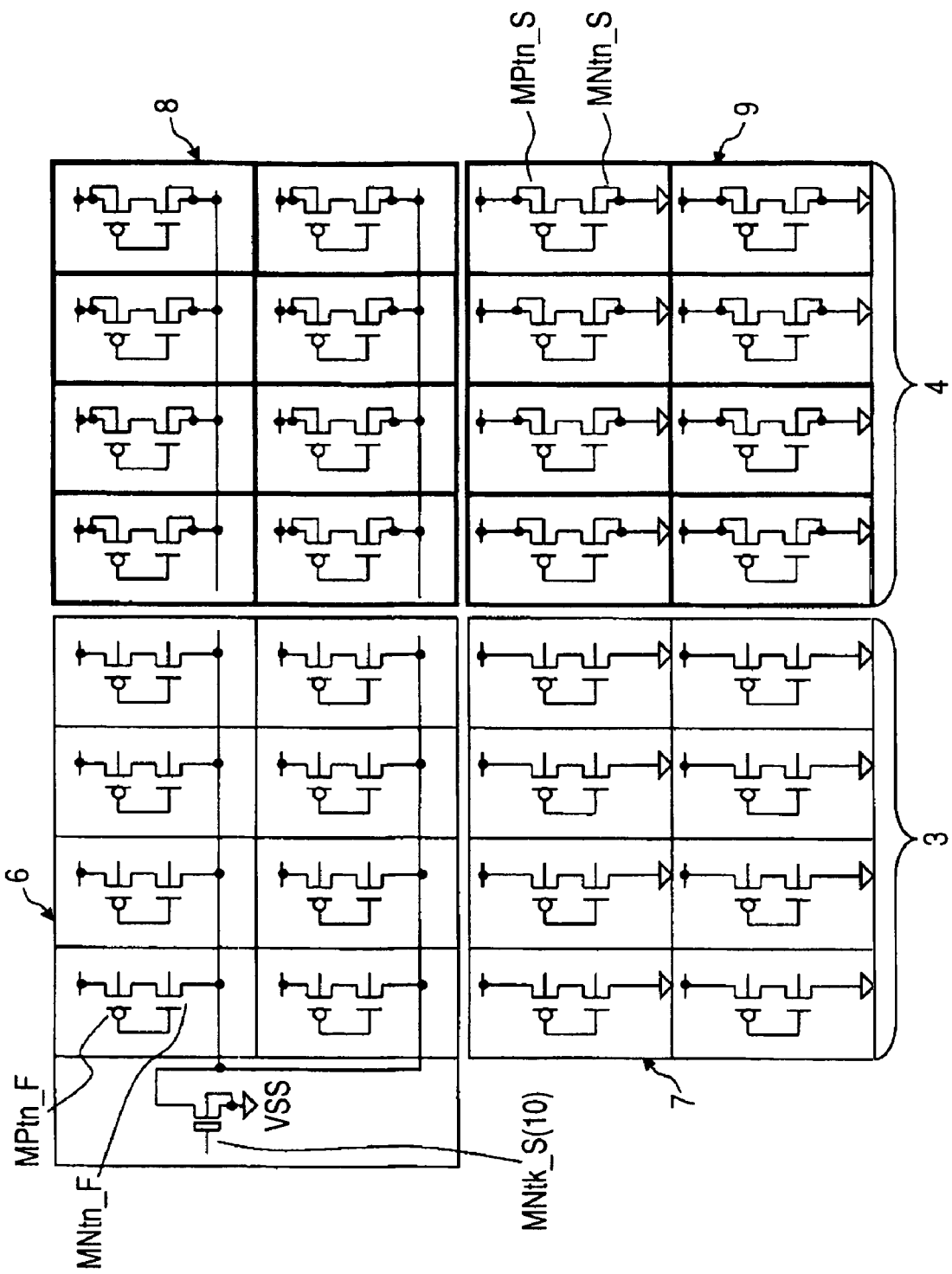
FIG. 23 is a circuit diagram depicting another example of separate use of body biases with respect to a digital circuit and an analog circuit.

An example in which body biases are properly used for digital and analog circuits is shown in FIG. 23. With respect to MOS transistors that constitute a power shuttable-down circuit 6 and a power non-shutdown circuit 7 which place prime importance on an operating speed in a digital circuit area 3, their bodies are brought into floating. With respect to MOS transistors that constitute a power shuttable-down circuit 8 and a power non-shutdown circuit 9 which place special emphasis on the accuracy of operation in an analog circuit area 4, their body potentials are fixed using their own source potentials or the like. With respect to the power shuttable-down circuit 6 and the power non-shutdown circuit 7 which place special emphasis on timing in the digital circuit area 3, the body potential relative to each of the MOS transistors that constitutes the circuits may be fixed using its own source potential or the like. Although a MOS transistor MNtk_S constituting a power supply switch 10 is shared for both the power shuttable-down circuit 6 in the digital circuit area 3 and the power non-shutdown circuit 8 in the analog circuit area 4 in the example of FIG. 23, it may be individualized for them. Although not shown in the figure in particular, each of the power shuttable-down circuit 8 and the power non-shutdown circuit 9 that place special emphasis on the accuracy of operation in the analog circuit area 4 is, for example, a circuit which allows each MOS transistor to operate in a saturated region. Since such a circuit configuration as to operate the MOS transistors in the saturated region is known as in the case of an amplifier, a constant current circuit or a constant voltage circuit or the like, the description of its detailed circuit configuration is omitted here.

<<Combined Use of Power Shutdown and Body Bias Control>>

Figure 25:
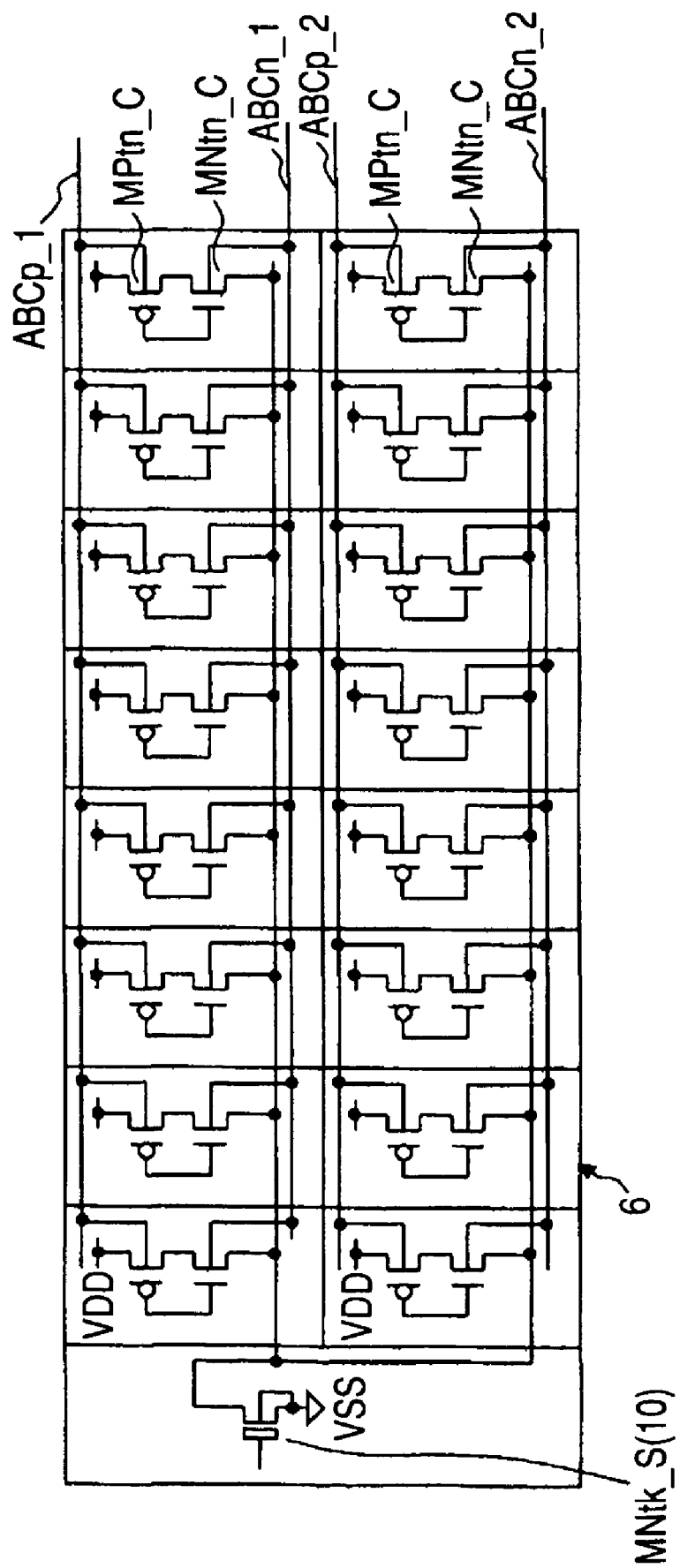
FIG. 25 is a circuit diagram illustrating, as a further example of separate use of body biases, a configuration in which power shutdown and body bias control are used in combination.

A configuration in which power shutdown and body bias control are used in conjunction with each other, is shown in FIG. 25 as a further example in which body biases are properly used. In a typically-shown power shuttable-down circuit 6, the supply and stop of operating power is controlled with respect to each circuit constituted of thin film MOS transistors MPtn_C and MNtn_C through a power supply switch 10 based on a thick film MOS transistor MNtk_S. A circuit portion such as a CPU or the like large in power consumption is advantageous in that the power supply switch 10 is brought into an off state upon its deactivation to reduce a subthreshold leak current. Further, in order to reduce the subthreshold leak current of the power supply switch 10 per se, the thin film MOS transistors MPtn_C and MNtn_C may preferably be reverse-biased using body bias signals ABCp_1, ABCn_1, ABCp_2 and ABCn_2 upon power shutdown. The body bias signals ABCp_1, ABCn_1, ABCp_2 and ABCn_2 may be brought into floating so as to suppress the occurrence of undesired junction leaks. On the other hand, the operating power is supplied via the power supply switch 10 upon the operation of each circuit comprising the thin film MOS transistor MPtn_C and MNtn_C. At this time, however, the operating speed or power consumption can also be adjusted as needed by dynamically adjusting each threshold voltage using the body bias signals ABCp_1, ABCn_1, ABCp_2 and ABCn_2. When a low-speed operation is enough, each body BDY is reverse-biased to increase the threshold voltage, thereby suppressing power consumption. When a high-speed operation is required, the body BDY is forward-biased to reduce the threshold voltage.

Figure 26:
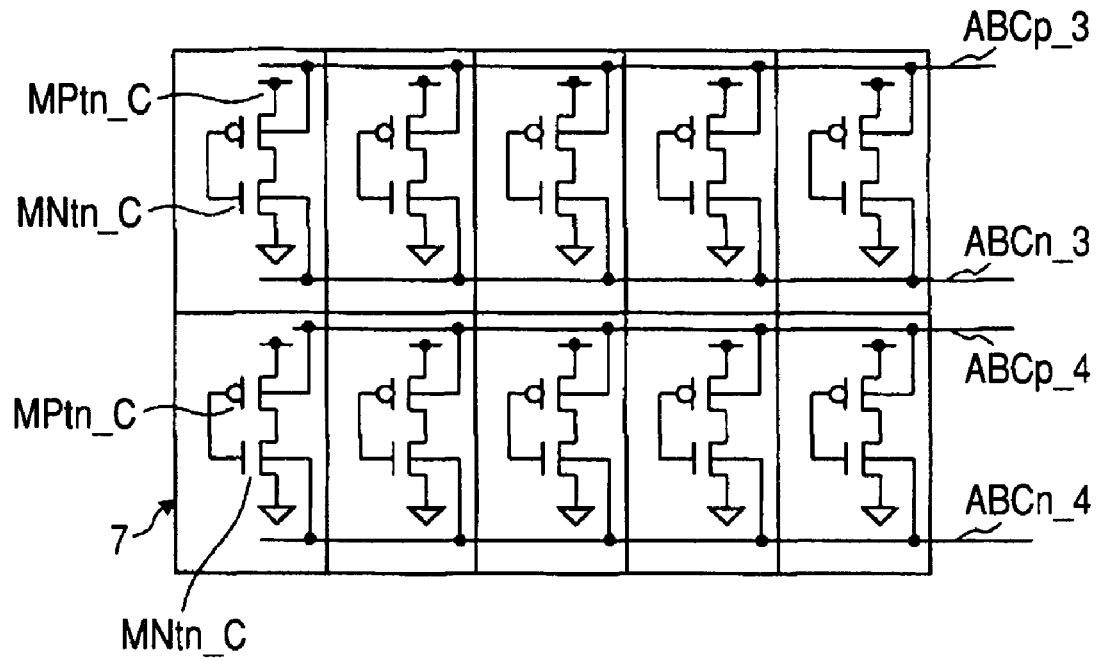
FIG. 26 is a circuit diagram showing, as a still further example of separate use of body biases, an example of body bias control for a power non-shutdown circuit.

An example of body bias control on a power non-shutdown circuit is shown in FIG. 26 as a still further example in which body biases are properly used. A typically-shown power non-shutdown circuit 7 comprising thin film MOS transistors MPtn_C and MNtn_C is not power-shutdown functionally and individually as in the case of, for example, a system controller or the like. For instance, the system controller performs control or the like for making a transition to an active mode, such as a case where in a state in which a CPU or the like has entered into a standby mode to stop an operating clock, an interrupt request or the like is detected to resume the supply of the operating clock. Thus, it is not possible to shut down operating power with respect to the power non-shutdown circuit 7 like the system controller even in a standby state. Since, however, a high-speed operation is not required, it is advisable to reverse-bias the power non-shutdown circuit 7 like the system controller in the standby state thereby to attain low power consumption.

Figure 27:
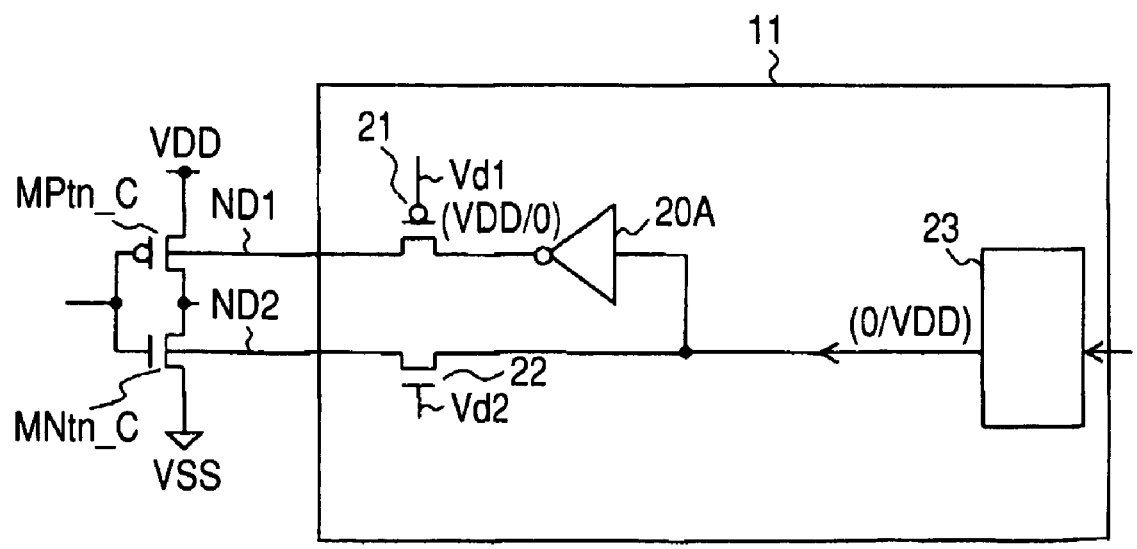
FIG. 27 is a circuit diagram illustrating a body bias voltage control circuit.

A body bias voltage control circuit 11 is illustrated in FIG. 27. The body bias voltage control circuit 11 illustrates a circuit that constitutes part of the power control and body bias control circuit 5.

The body bias voltage control circuit 11 generates the body bias signal ABCp_1 (ABCp_2) at a node ND1 and generates the body bias signal ABCn_1 (ABCn_2) at a node ND2. The body bias voltage control circuit 11 comprises an inverter 20A, a first switch 21 constituted of a thin film MOS transistor MPtn, a second switch 22 constituted of a thin film MOS transistor MNtn, and a control register 23. A gate voltage Vd1 of the first switch 21 is set to such a voltage that a parasitic diode between the source and body of the switch 21 is not turned on when a body bias voltage thereof reaches Vd1+Vthp. Vthp is a threshold voltage of the first switch 21. A gate voltage Vd2 of the second switch 22 is set to such a voltage that a parasitic diode between the source and body of the switch 22 is not turned on when a body bias voltage thereof reaches Vd2−Vthn. Vthn is a threshold voltage of the second switch 22. The first switch 21 is coupled to the body of a p channel type MOS transistor MPtn_C that constitutes a power shuttable-down circuit 6 or a power non-shutdown circuit 7. The voltage at the node ND1 becomes its body voltage. Likewise, the second switch 22 is coupled to the body of an n channel type MOS transistor MNtn_C that constitutes a power shuttable-down circuit 6 or a power non-shutdown circuit 7. The voltage at the node ND2 becomes its body bias voltage.

When a control bit of a high level is set to the control register 23 according to a high speed mode, the control register 23 outputs a control signal for a power supply voltage VDD. When a control bit of a low level is set thereto according to a normal mode, the control register 23 outputs a control signal for a ground voltage VSS (0V). When a semiconductor integrated circuit is of a microcomputer, the setting of the control bits to the control register 23 may be performed by, for example, a CPU. When the high-level control bit is set to the control register 23, the node ND1 is brought to Vd1+Vthp and the threshold voltage of the MOS transistor MPtn_C is reduced. As a result, the MOS transistor MPtn_C can perform a turn-on operation at high speed and obtain relatively large mutual conductance. Likewise, as a result of bringing the node ND2 to Vd2−Vthn and reducing the threshold voltage of the MOS transistor MNtn_C, the MOS transistor MNtn_C can perform a turn-on operation at high speed and obtain relatively large mutual conductance. On the other hand, when the low-level control bit is set to the control register 23, the node ND1 is brought to VDD and the node ND2 is brought to 0. As a result, the respective threshold voltages of the n channel type MOS transistor MNtn_C and the p channel type MOS transistor MPtn_C are set larger than at the high-speed operation mode, and low power consumption is reached in terms of a reduction in subthreshold leak current or its suppression.

Figure 28:
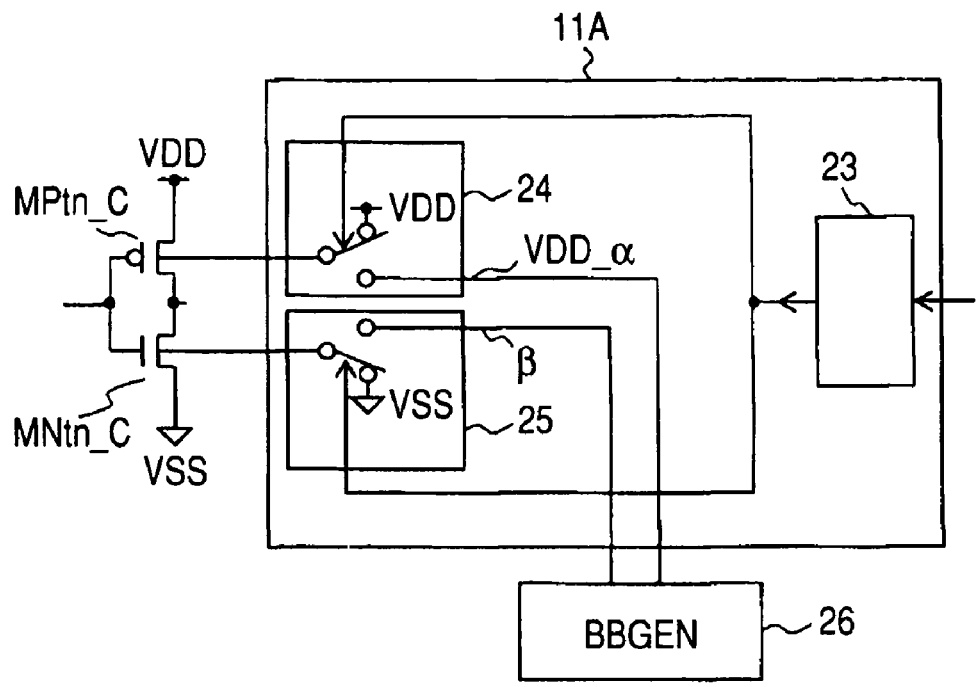
FIG. 28 is a circuit diagram showing another example of a body bias voltage control circuit.

Another example of a body bias voltage control circuit is shown in FIG. 28. The body bias voltage control circuit 11A selects in advance, outputs of a body bias voltage generating circuit or generator (BBGEN) 26 according to the output of a control register 23 by using selectors 24 and 25. The body bias voltage generator 26 generates VDD-α and β as bias voltages. α indicates a voltage (Vfbp) not greater than such a voltage Vf as not to turn on a parasitic diode between the source and body of a p channel type MOS transistor MPtn_C. β indicates a voltage (Vfbn) not greater than such a voltage Vf as not to turn on a parasitic diode between the source and body of an n channel type MOS transistor MNtn_C. When the output of the control register 23 is low in level, the selector 24 selects a voltage VDD and the selector 25 selects a ground voltage VSS. On the other hand, when the output of the control register 23 is high in level, the selector 24 selects the voltage VDD-α and the selector 25 selects the voltage β. Even depending upon such a configuration, the threshold voltages of the MOS transistors MPtn_C and MNtn_C can be variably controlled according to a high-speed operation mode and a normal mode in a manner similar to FIG. 27.

<<Pre-Control on Body Potential Optimization>>

Figure 29:
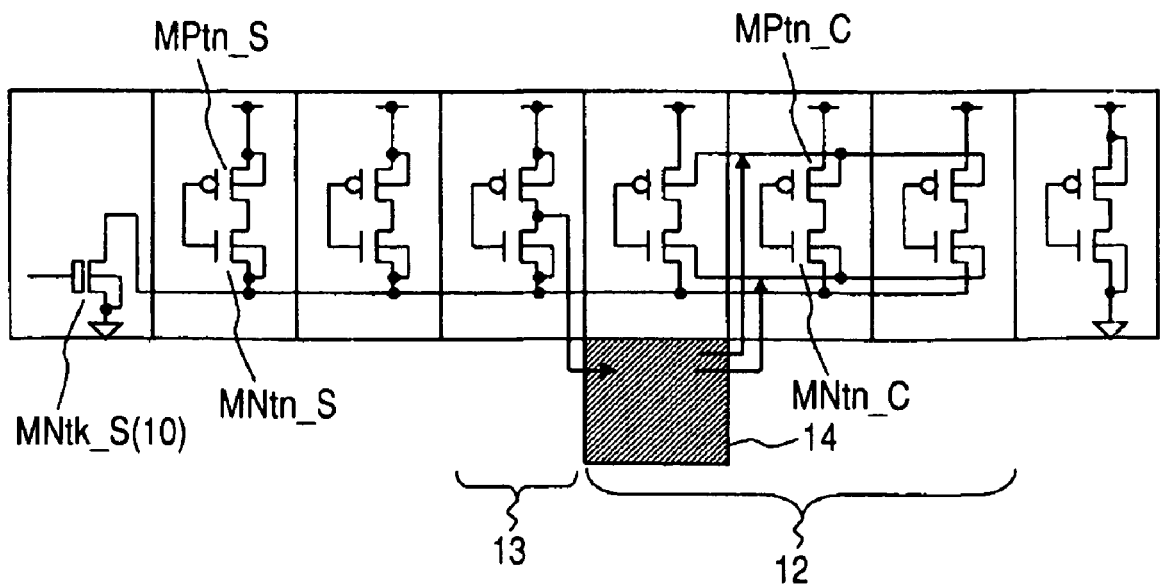
FIG. 29 is a circuit diagram illustrating a control form that optimizes a body potential of a subsequent-stage circuit on the basis of an output of a pre-stage circuit in a power shuttable-down circuit.
Figure 30:
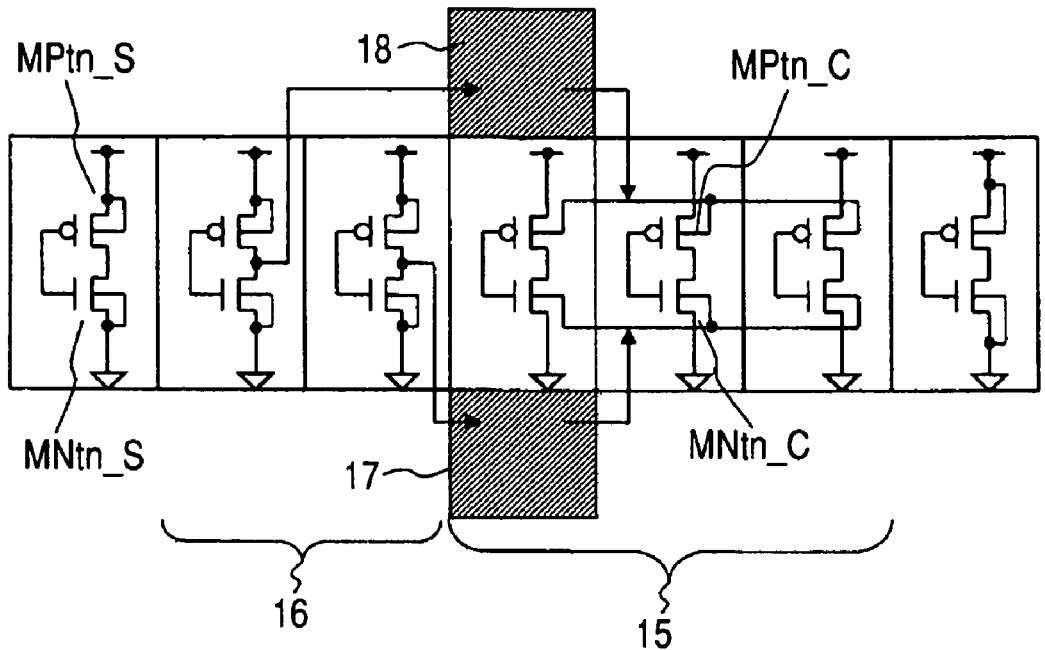
FIG. 30 is a circuit diagram illustrating a control form that optimizes a body potential of a subsequent-stage circuit on the basis of an output of a pre-stage circuit in a power non-shutdown circuit.

As another example of body bias control, control for optimizing a body potential of a subsequent-stage circuit by a pre-stage circuit will be explained. FIG. 29 illustrates a control form for optimizing the body potential of the subsequent-stage circuit, based on the output of the pre-stage circuit in a power shuttable-down circuit 6. FIG. 30 illustrates such a control form in a power non-shutdown circuit 7. In FIG. 29, a body bias circuit 14 for optimizing the body potential using the output of the pre-stage circuit 13 is disposed with respect to the subsequent-stage circuit 12 in which the body potential of each MOS transistor of the same conductivity type is shared. In FIG. 30, body bias circuits 17 and 18 for respectively optimizing body potentials using the output of a pre-stage circuit 16 are disposed with respect to a subsequent-stage circuit 15 in which the body potential of each MOS transistor of the same conductivity type is shared.

Figure 31:
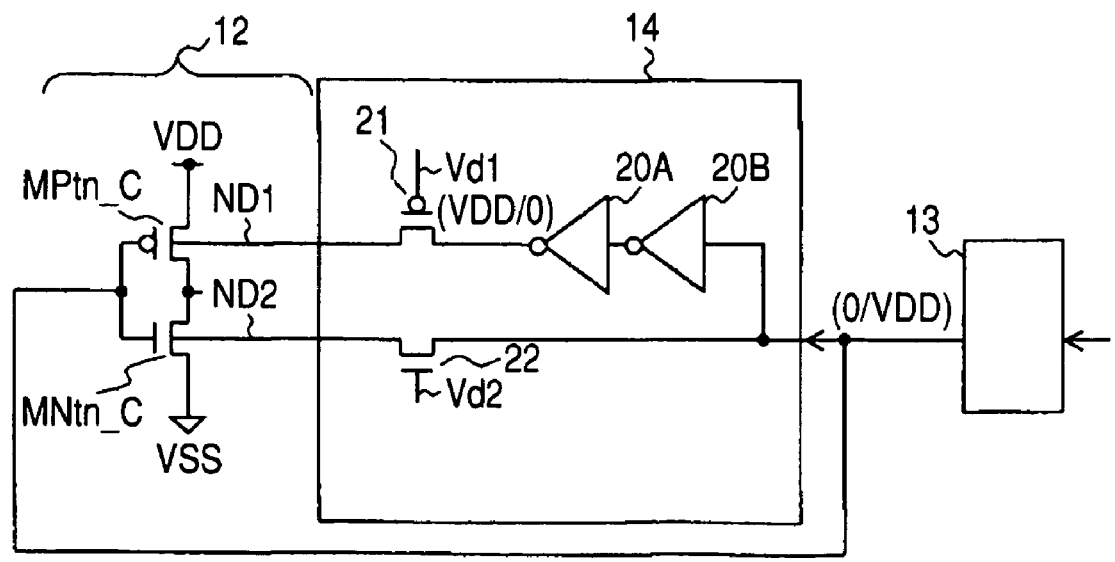
FIG. 31 is a circuit diagram showing one example of a body bias circuit.

One example of a body bias circuit 14 is shown in FIG. 31. The body bias circuit 14 comprises inverters 20A and 20B provided in a serial two-stage configuration, a first switch 21 made up of a thin film MOS transistor MPtn, and a second switch 22 constituted of a thin film MOS transistor MNtn. A gate voltage Vd1 of the first switch 21 is set to such a voltage that a parasitic diode between the source and body of the switch 21 is not turned on when a body bias voltage thereof reaches Vd1+Vthp. Vthp is a threshold voltage of the first switch 21. A gate voltage Vd2 of the second switch 22 is set to such a voltage that a parasitic diode between the source and body of the switch 22 is not turned on when a body bias voltage thereof reaches Vd2−Vthn. Vthn is a threshold voltage of the second switch 22. The first switch 21 is coupled to the body of a p channel type MOS transistor MPtn_C of a subsequent-stage circuit 12. The voltage at a node ND1 becomes its body voltage. Likewise, the second switch 22 is coupled to the body of an n channel type MOS transistor MNtn_C of the subsequent-stage circuit 12. The voltage at a node ND2 becomes its body bias voltage.

When the output of a pre-stage circuit 13 is VDD, an inverter of the subsequent-stage circuit 12 having received it outputs a low level. At this time, the node ND2 is brought to Vd2−Vthn and the threshold voltage of the MOS transistor MNtn_C is reduced. As a result, a current drawing operation is performed at high speed by the MOS transistor MNtn_C. At this time, the node ND1 is brought to VDD and the threshold voltage of the p channel type MOS transistor MPtn_C is kept relatively large. Hence, the occurrence of subthreshold leaks is reduced or suppressed. On the other hand, when the output of the pre-stage circuit 13 is 0V, the inverter of the subsequent-stage circuit 12 having accepted it outputs a high level. At this time, the node ND1 is brought to Vd1+Vthp and the threshold voltage of the MOS transistor MPtn_C is reduced. As a result, a current supply operation is performed at high speed by the MOS transistor MPtn_C. At this time, the node ND2 is brought to 0V and the threshold voltage of the n channel MOS transistor MNtn_C is kept relatively large. Hence, the occurrence of subthreshold leaks is reduced or suppressed. Thus, the logic threshold voltage of the inverter of the subsequent-stage circuit 12 can be optimized in the direction to speed up its output operation, according to the output of the pre-stage circuit 13.

Figure 32:
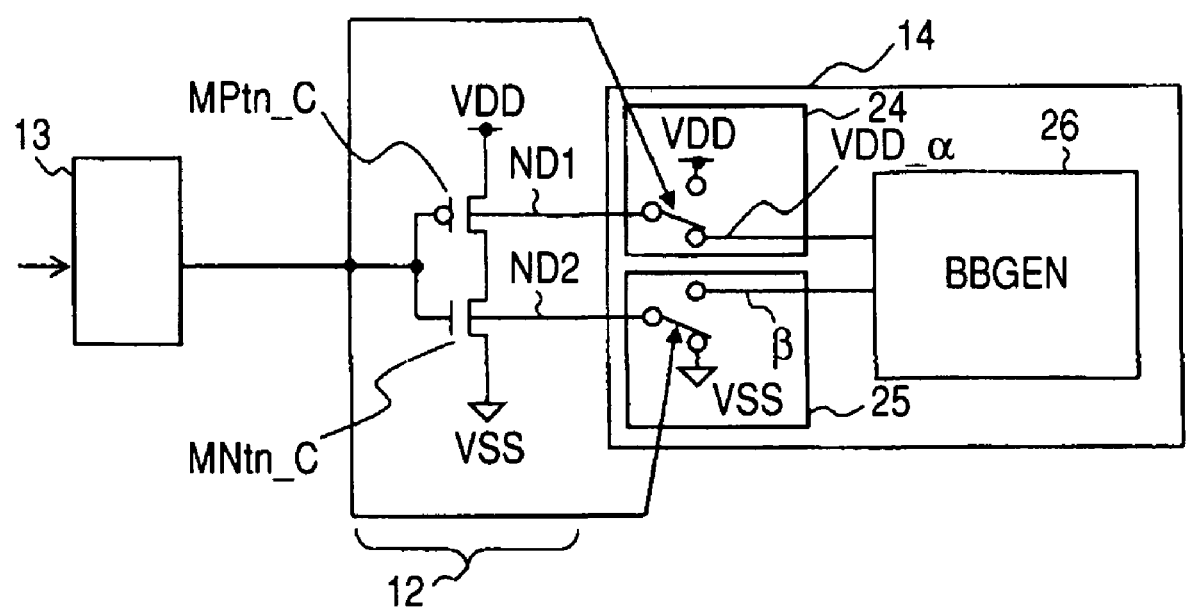
FIG. 32 is a circuit diagram showing another example of a body bias circuit.

Another example of a body bias circuit 14 is shown in FIG. 32. The body bias circuit 14 shown in the same figure is equipped with a circuit or generator (BBGEN) 26 for generating body bias voltages in advance regardless of the output of a pre-stage circuit 13. Selectors 24 and 25 select the outputs thereof according to the output of the pre-stage circuit 13. The body bias voltage generator 26 generates VDD-α and β as bias voltages. α indicates a voltage not greater than such a voltage Vf as not to turn on a parasitic diode between the source and body of a p channel type MOS transistor MPtn_C. β indicates a voltage not greater than such a voltage Vf as not to turn on a parasitic diode between the source and body of an n channel type MOS transistor MNtn_C. When the output of the pre-stage circuit 13 is low in level, the selector 24 selects the voltage VDD-α and the selector 25 selects a ground voltage VSS. On the other hand, when the output of the pre-stage circuit 13 is high in level, the selector 24 selects a power supply voltage VDD and the selector 25 selects the voltage β. In a manner similar to above, the logic threshold voltage of an inverter of a subsequent-stage circuit 12 can be optimized in the direction to speed up its output operation, according to the output of the pre-stage circuit 13.

Figure 33:
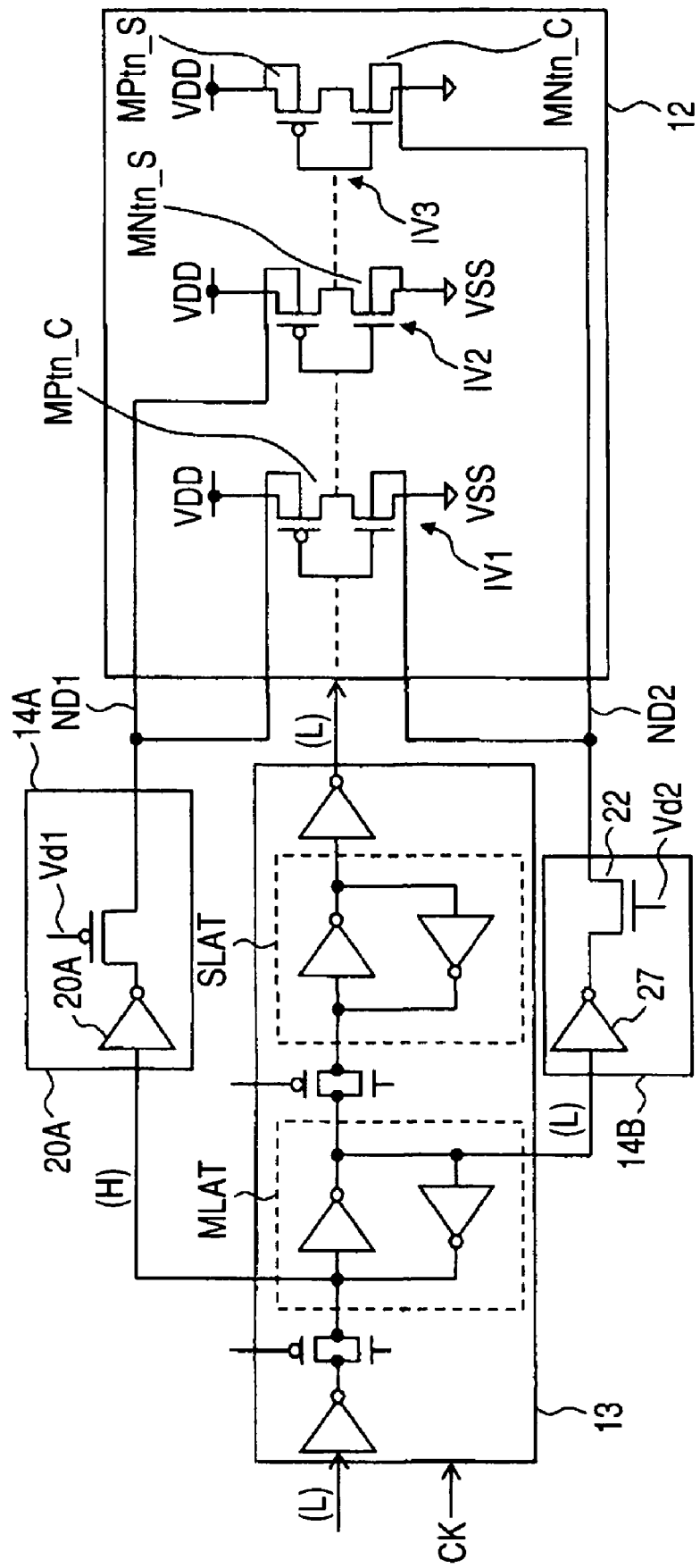
FIG. 33 is a circuit diagram showing another example of body bias control that optimizes a body potential of a subsequent-stage circuit by a pre-stage circuit.

A further example of body bias control for optimizing a body potential of a subsequent-stage circuit by a pre-stage circuit is shown in FIG. 33. In the present example, the pre-stage circuit 13 is flip-flopped, and the subsequent-stage circuit 12 is set as a combination circuit that performs a logical operation in response to the output of the flip-flop 13. Three inverters IV1 through IV3 are typically shown in the combination circuit 12. In the same figure, body bias circuits 14A and 14B for optimizing the body potential using the output of the pre-stage circuit 13 are disposed with respect to the subsequent-stage circuit 12. The body bias circuit 14A generates a body bias voltage for p channel type MOS transistors MPtn_C of the inverters IV1 and IV2. The body bias circuit 14B generates a body bias voltage for n channel type MOS transistors MNtn_C of the inverters IV1 and IV3. The flip-flop 13 has a master latch MLAT and a slave latch SLAT. CK indicates an operating clock of the flip-flop 13 and is a clock signal inputted to a clock terminal CLK of FIG. 22. The body bias circuit 14A includes an inverter 20A coupled to an input node of the master latch MLAT, and a first switch 21 constituted of a thin film MOS transistor MPtn provided in series with it. The body bias circuit 14B includes an inverter 27 coupled to an output node of the master latch MLAT, and a second switch 22 constituted of a thin film MOS transistor MNtn provided in series with it. The voltage Vd1 is applied to the gate of the first switch 21, and the voltage Vd2 is applied to the gate of the second switch 22. The gate voltage Vd1 is set to such a voltage as not to turn on a parasitic diode between the source and body of the switch 21 when the body bias voltage at a node ND1 is brought to Vd1+Vthp according to a high level input of the inverter 20A. Vthp is a threshold voltage of the first switch 21. The gate voltage Vd2 of the second switch 22 is set to such a voltage as not to turn on a parasitic diode between the source and body of the switch 22 when the body bias voltage at a node ND2 is brought to Vd2−Vthn. Vthn is a threshold voltage of the second switch 22. When the input of the flip-flop 13 is low in level, the node ND1 is brought to Vd1+Vthp and the threshold voltage of each MOS transistor MPtn_C is reduced. As a result, the MOS transistor MPtn_C can perform a turn-on operation at high speed and can obtain relatively large mutual conductance. Likewise, the node ND2 is brought to Vd2−Vthn and the threshold voltage of each MOS transistor MNtn_C is reduced. As a result, the MOS transistor MNtn_C can perform a turn-on operation at high speed and can obtain relatively large mutual conductance. On the other hand, when the input of the flip-flop 13 is high in level, the node ND1 is brought to VDD and the node ND2 is brought to 0V. As a result, the respective threshold voltages of the n channel type MOS transistors MNtn_C and p channel type MOS transistors MPtn_C are set larger than the above, and low power consumption is brought about in terms of a reduction in subthreshold leak current or its suppression.

Thus, according to the circuit configuration shown in FIG. 33, the combination circuit 12 is operated in such a manner that when low-level data is inputted from the flip-flop 13, the inverter IV1 is speeded up in terms of the operation of transition of its output with respect to a change in input, the inverter IV2 is speeded up in terms of the operation of transition of its output with respect to a change of the input from a low level to a high level, and the inverter IV3 is speeded up in terms of the operation of transition of its output with respect to a change of the input from a high level to a low level. The combination circuit 12 is operated in such a manner that when high-level data is inputted from the flip-flop 13, the bodies of all the p channel type MOS transistors MPtn of the inverters IV1 through IV3 are brought to a power supply voltage VDD, and the bodies of all the n channel type MOS transistors MNtn are brought to a ground voltage VSS. In brief, the subsequent-stage combination circuit 12 optimizes the body bias so as to be capable of high-speed operation in response to the low-level input from the pre-stage flip-flop 13 and performs control on the subthreshold leak current with respect to the high-level input that needs no speeding-up. Further, since the body bias control for the subsequent-stage combination circuit 12 by the pre-stage flip-flop 13 is determined depending upon the state of the master latch MLAT, the body-biased state of the combination circuit 12 can reliably be determined until the output of the slave latch SLAT is changed.

Figure 34:
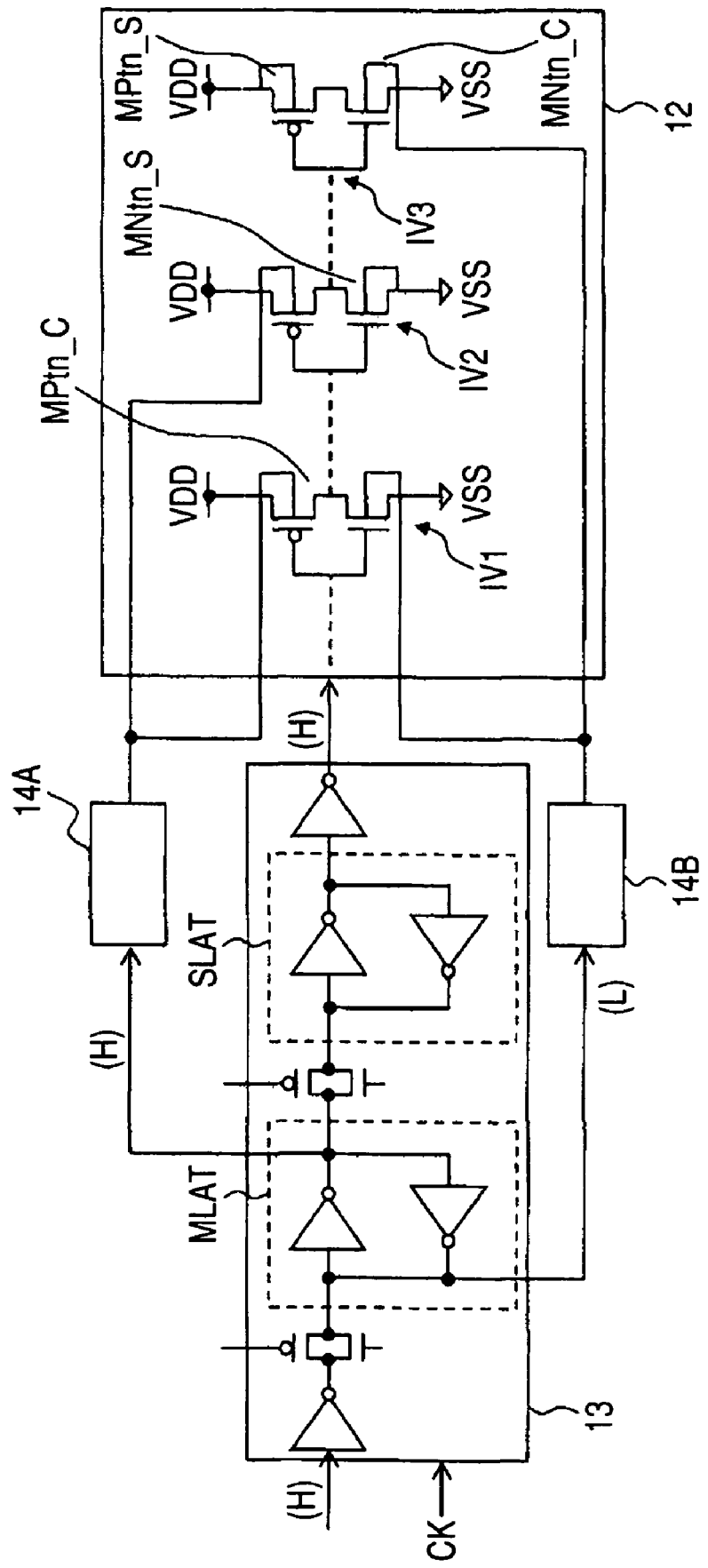
FIG. 34 is a circuit diagram showing a further example of body bias control that optimizes a body potential of a subsequent-stage circuit by a pre-stage circuit.

A still further example of body bias control for optimizing a body potential of a subsequent-stage circuit by a pre-stage circuit is shown in FIG. 34. In the present example, a combination circuit 12 to be operated at high speed in response to a high-level input is adopted. FIG. 34 is different from FIG. 33 in that a body bias circuit 14A is coupled to an output node of a master latch MLAT, and a body bias circuit 14B is coupled to an input node of the master latch MLAT. In this case, the subsequent-stage combination circuit 12 optimizes a body bias so as to be capable of high-speed operation in response to the high-level input from the pre-stage flip-flop 13 and performs control on a subthreshold leak current with respect to a low-level input that needs no speeding-up. FIG. 34 is identical to FIG. 33 in other configuration.

Figure 35:
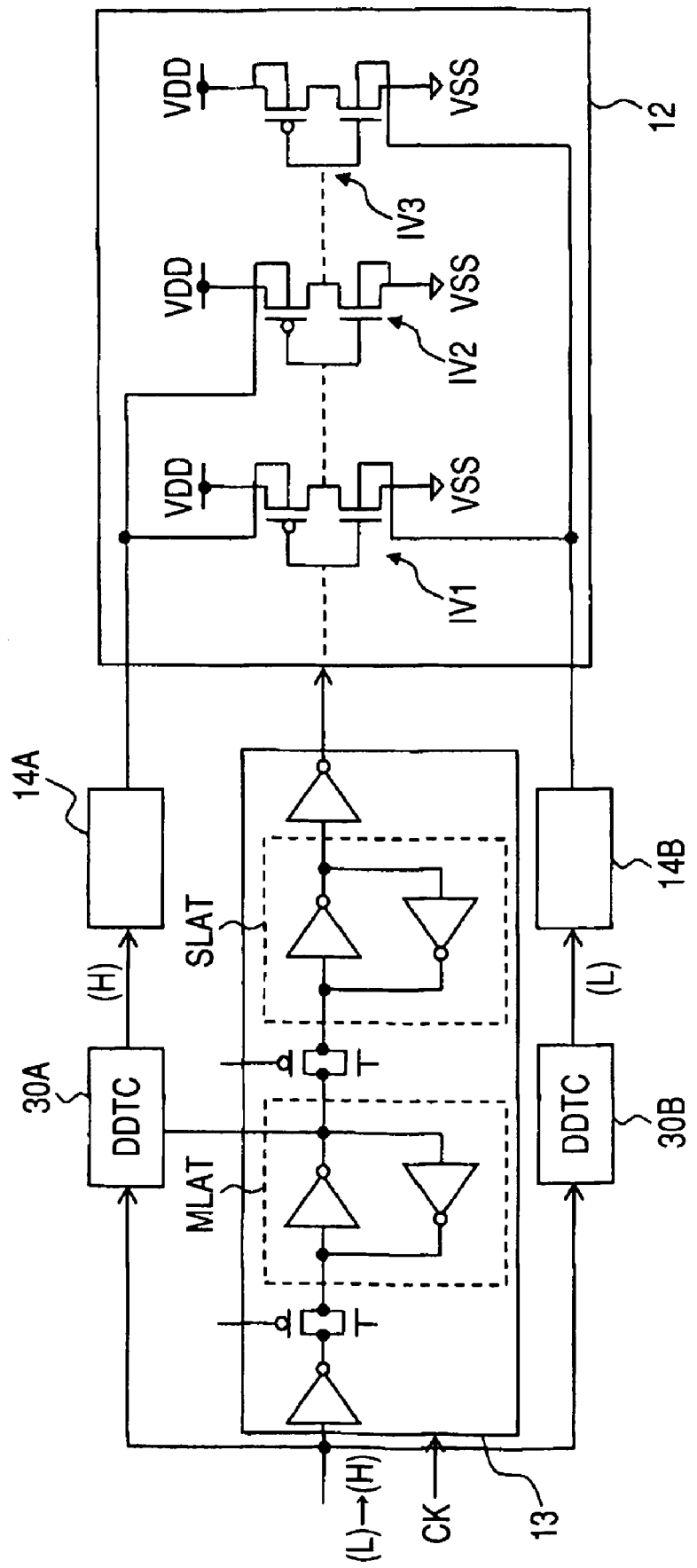
FIG. 35 is a circuit diagram showing a still further example of body bias control that optimizes a body potential of a subsequent-stage circuit by a pre-stage circuit.

A still further example of body bias control for optimizing a body potential of a subsequent-stage circuit by a pre-stage circuit is shown in FIG. 35. The present example differs from that shown in FIG. 33 in that detection circuits (DDTC) 30A and 30B each of which detects a change of input data of a flip-flop 13 corresponding to the pre-stage circuit from a low level to a high level, and a change thereof from the high to low levels are adopted. The detection circuit 30A detects the change of the input data from the low level to the high level thereby to change an output to a body bias circuit 14A from a low level to a high level. The detection circuit 30A detects the change of the input data from the high level to the low level thereby to change an output to the body bias circuit 14A from a high level to a low level. The detection circuit 30B detects the change of the input data from the low to high levels thereby to change an output to a body bias circuit 14B from a high level to a low level. The detection circuit 30B detects the change of the input data from the high to low levels thereby to change an output to the body bias circuit 14B from a low level to a high level.

Figure 36:
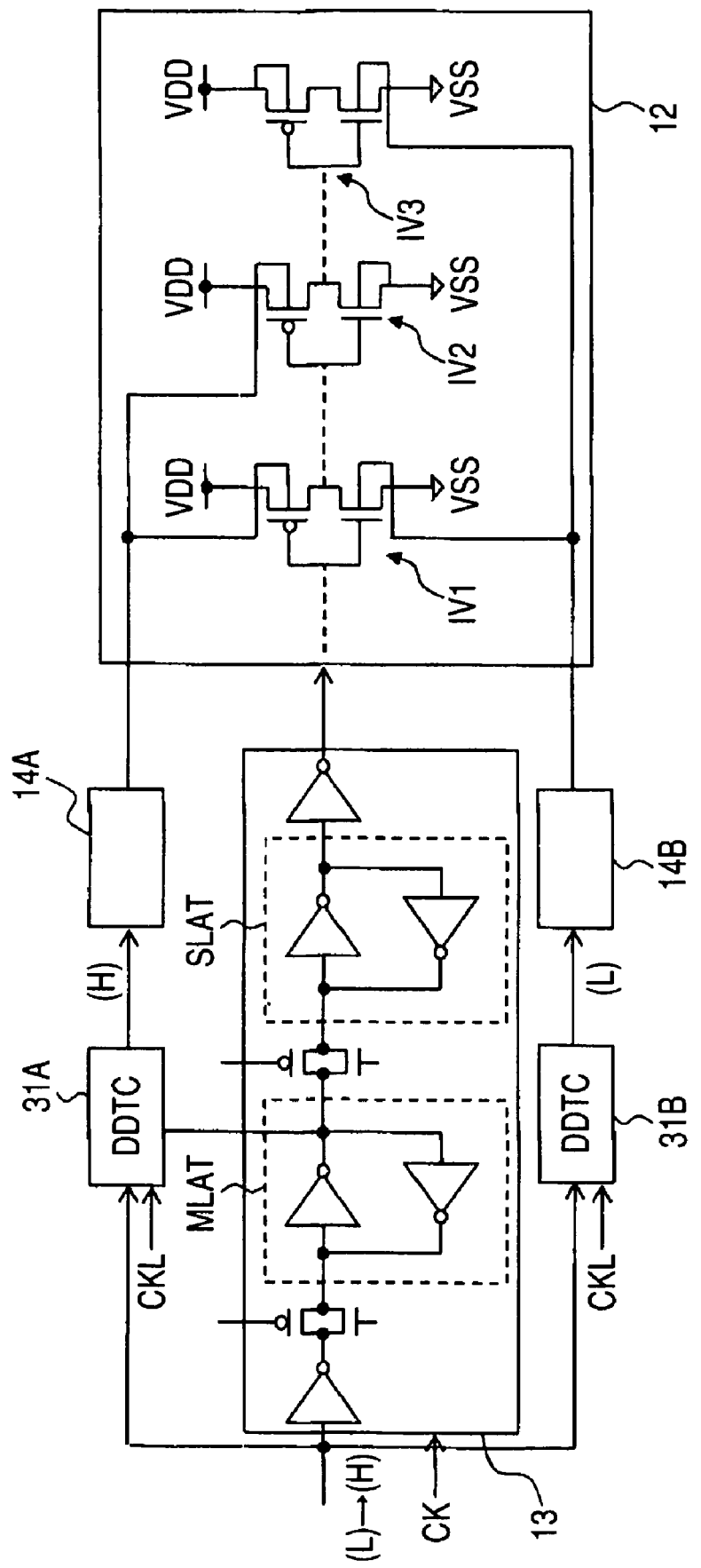
FIG. 36 is a circuit diagram showing an example having adopted detection circuits each of which defines a forward bias period by the number of cycles in a clock signal CK using a body bias circuit.

An example in which detection circuits (DDTC) 31A and 31B each of which defines a forward bias period based on each of body bias circuits 14A and 14B by the number of cycles in a clock signal CK are adopted, is shown in FIG. 36. When the detection circuit 31A detects that input data has changed from a low level to a high level, the detection circuit 31A changes an output to a body bias circuit 14A from low to high levels and maintains its state by a predetermined number of cycles of the clock signal CK. When the detection circuit 31B detects the change of the input data from the low to high levels, the detection circuit 31B changes an output to a body bias circuit 14B from a high level to a low level and maintains its state by a predetermined number of cycles of the clock signal CK. The clock signal CK is a synchronous operating clock of a flip-flop 13 and is equal to a clock signal inputted to the clock terminals CLK of FIG. 22, for generating a latch clock that controls each of latch operations of a master latch MLAT and a slave latch SLAT. According to this configuration, a combination circuit 12 supplied with high-level data from the flip-flop 13 can be operated at high speed by a body's forward bias over a predetermined cycle period of the clock signal CK.

Figure 37:
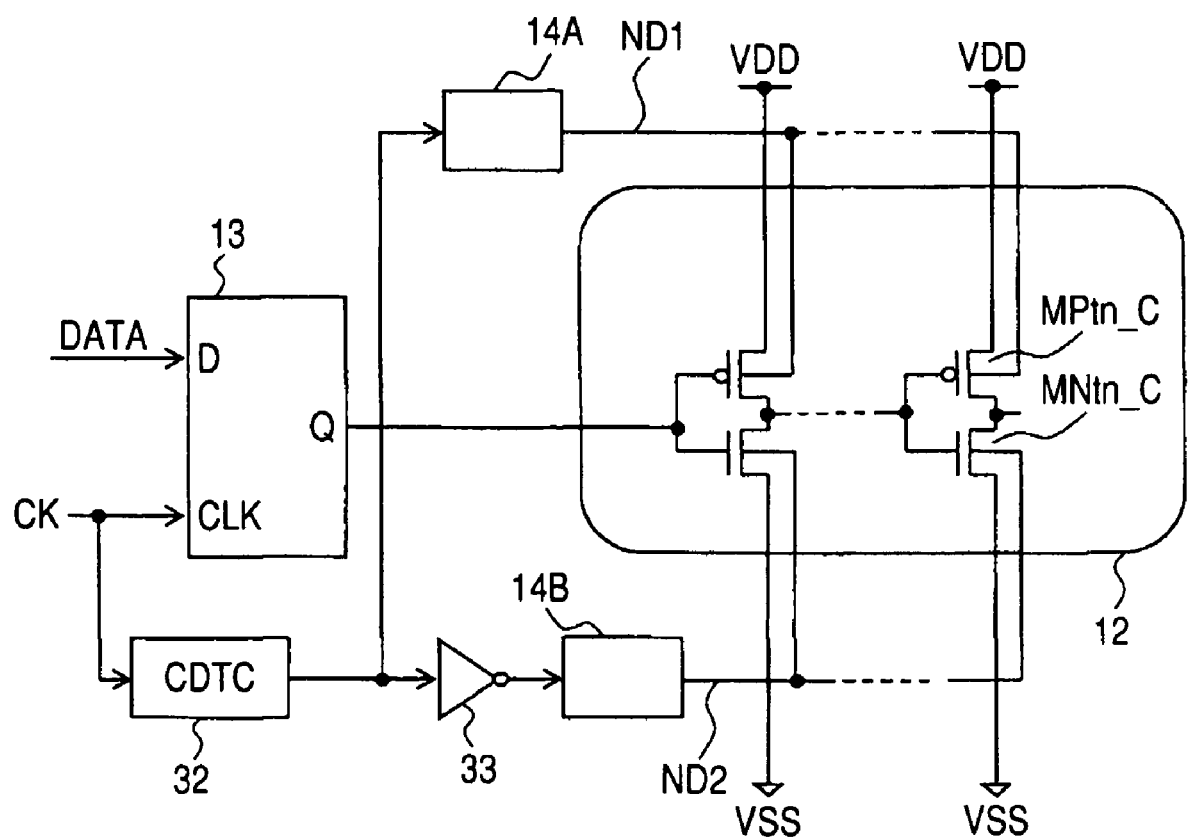
FIG. 37 is a circuit diagram showing a still further example of body bias control that optimizes a body potential of a subsequent-stage circuit by a pre-stage circuit.

A still further example of body bias control for optimizing a body potential of a subsequent-stage circuit by a pre-stage circuit is shown in FIG. 37. In the present example, a subsequent-stage combination circuit 12 is forward-biased when a clock signal CK supplied to a clock terminal CLK of a flip-flop 13 corresponding to the pre-stage circuit is being changed. A detection circuit (CDTC) 32 detects that the clock signal CK supplied to the clock terminal CLK of the flip-flop 13 is being changed and thereby outputs a high-level signal. The body bias circuit 14A, which receives the output signal therein, performs body bias control on p channel type MOS transistors MPtn_C of the combination circuit 12. The body bias circuit 14B, which receives the output of the detection circuit 32 with being inverted by an inverter 33, effects body bias control on n channel type MOS transistors MNtn_C of the combination circuit 12. Thus, when data is supplied to the combination circuit 12 via the flip-flop 13 in sync with a change in clock signal CK, the body of each MOS transistor that constitutes the combination circuit is forward-biased to enable a high-speed operation. When the clock signal is being stopped, the application of the forward bias is released so that low power consumption is attained.

Figure 38:
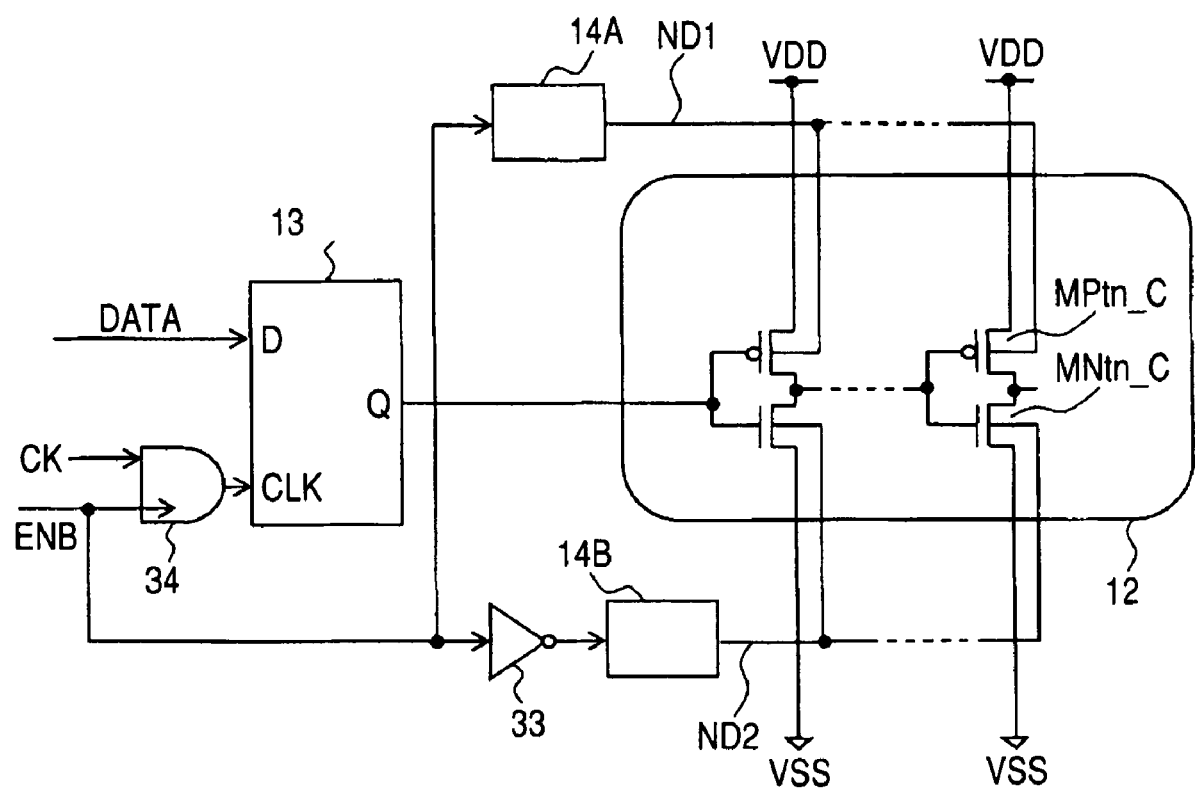
FIG. 38 is a circuit diagram showing an example which controls each of the body bias circuits using a clock enable signal as an alternative to the detection of a change in clock signal.

An example in which the body bias circuits 14A and 14B are controlled using a clock enable signal in place of the detection of the change in clock signal CK, is shown in FIG. 38. A clock signal CK is supplied to its corresponding clock terminal CLK of a flip-flop 13 during a period in which the clock enable signal ENB is high in level. Each of the body bias circuits 14A and 14B applies a forward bias to the body of each MOS transistor constituting a combination circuit 12 during the period in which the clock enable signal is high in level.

The specific circuits of the body bias circuits 14A and 14B are not limited to the configurations shown in FIGS. 31 and 33. They can be replaced with level shift circuits or the like each constituted of other circuit. It is needless to say that level shift voltages differ from each other according to the conductivity type of each MOS transistor. The body bias circuits 14, 14A and 14B are ranked or placed as control circuits which perform body bias control for the subsequent-stage circuit 12.

<<Body Bias Control at Power-On/Power-Off of LSI>>

Figure 39:
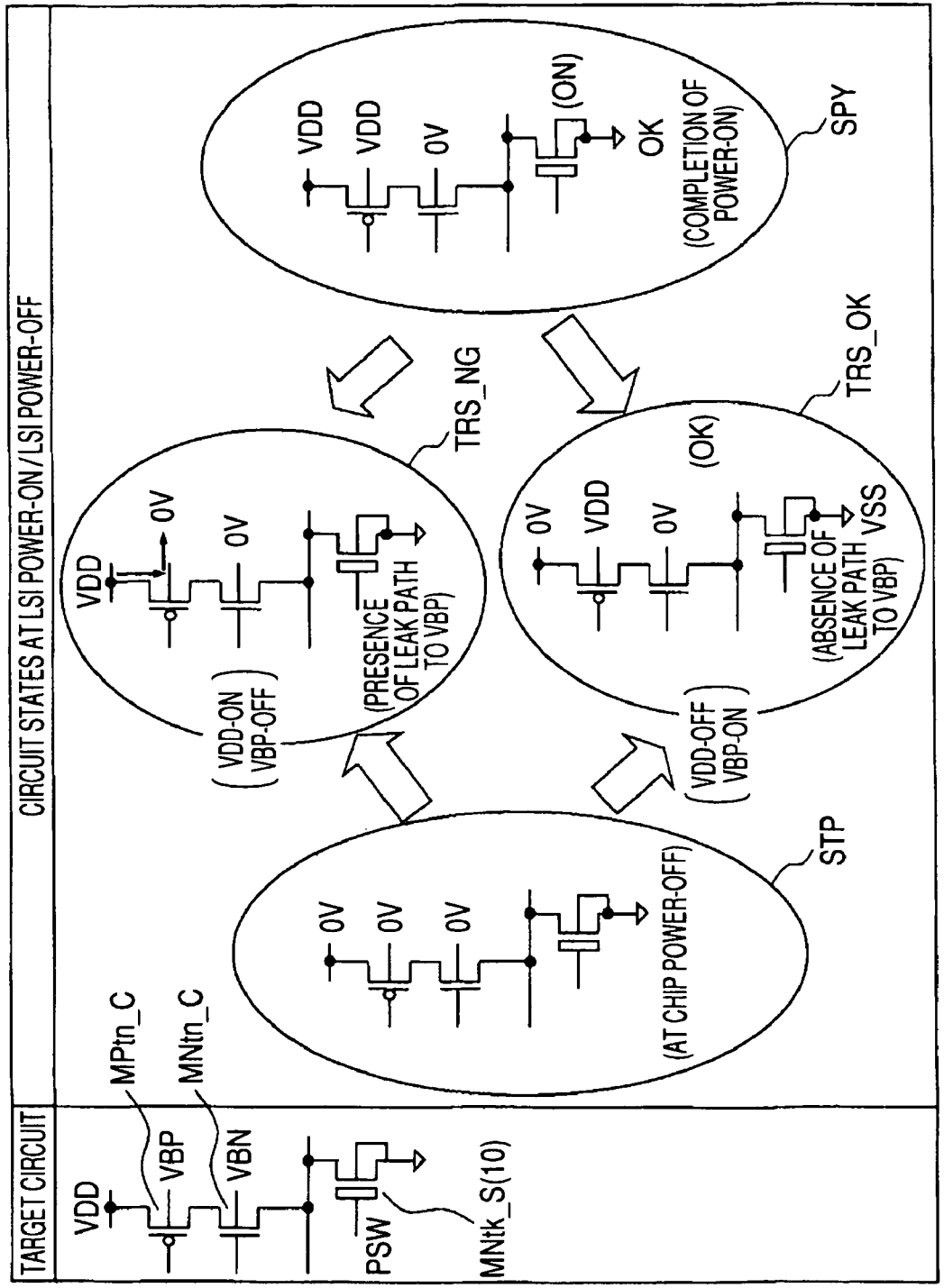
FIG. 39 is a status explanatory diagram illustrating body bias states to be taken into consideration upon external power-on and power shutdown for a semiconductor integrated circuit.
Figure 40:
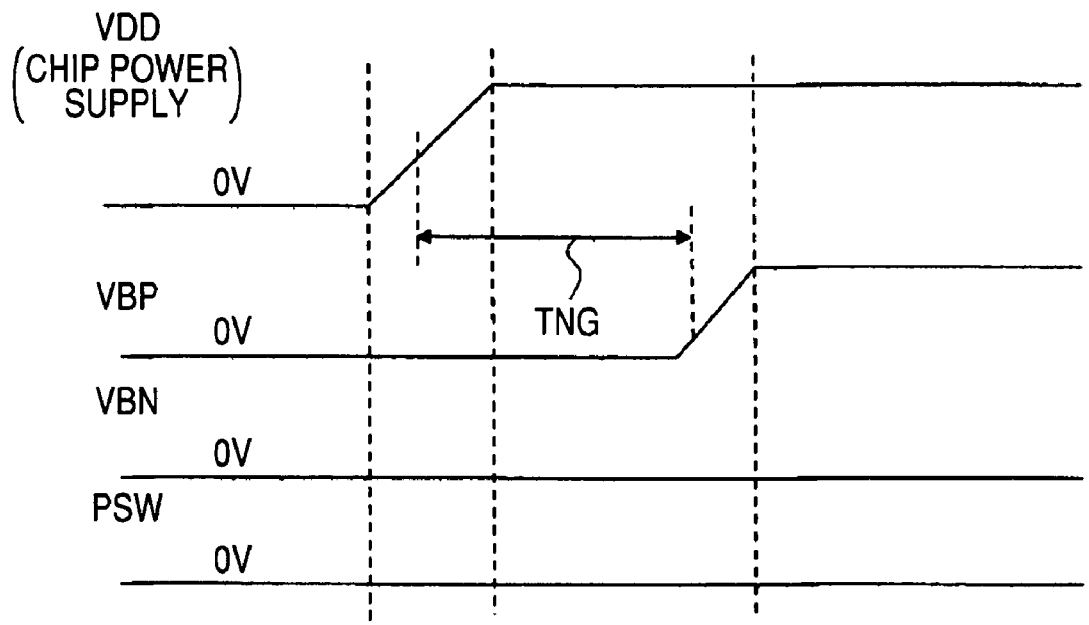
Figure 41:
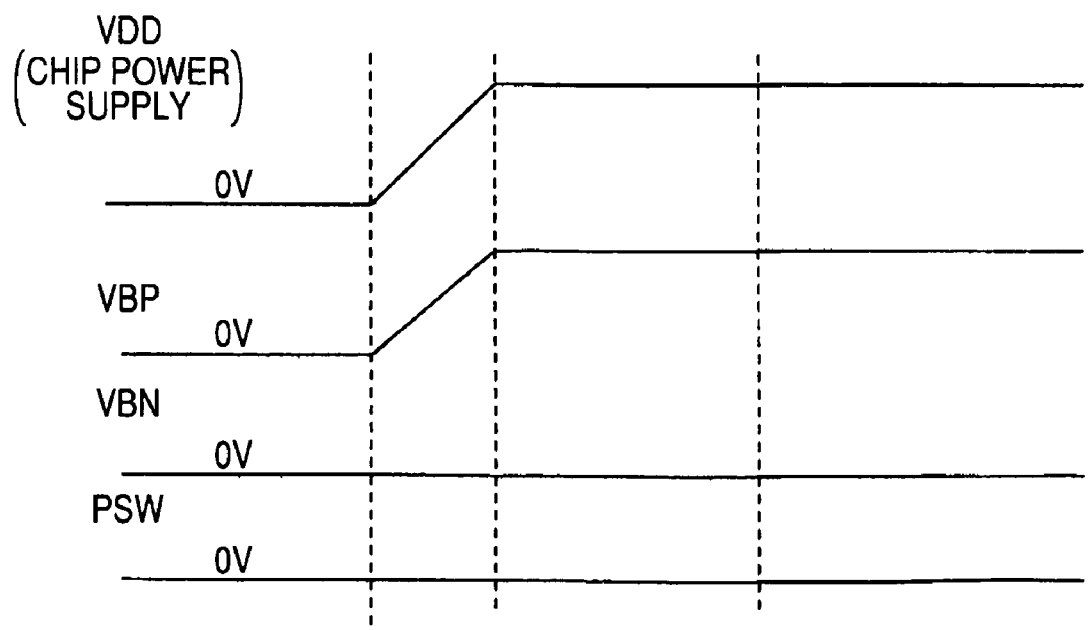

Body bias states to be taken into consideration upon external power-on and power shutdown for a semiconductor integrated circuit (LSI) are illustrated in FIG. 39. Here, a circuit in which a power supply switch 10 comprising an n channel type thick film MOS transistor MNtk_S is connected to a ground voltage VSS, and a CMOS circuit constituted of thin film MOS transistors MPtn_C and MNtn_C is connected between the power supply switch 10 and a power supply voltage VDD, is illustrated by way of example. VBP indicates a body bias voltage for the thin film MOS transistor MPtn_C, and VBN indicates a body bias voltage for the thin film MOS transistor MNtn_C. PSW indicates a switch control signal for the power supply switch 10. STP indicates an LSI power-off state in which the power supply voltage VDD is set to 0V (no power supply voltage is applied). SPY indicates an LSI power-on state in which the power supply voltage VDD is supplied from outside. Let's assume here that in the power-on state, the body of the p channel type MOS transistor MPtn_C is biased to the power supply voltage VDD and the body of the n channel type MOS transistor MNtn_C is biased to the ground voltage VSS. The power supply switch 10 is of course being set to an on state. In this state, the MOS transistors MPtn_C and MNtn_C are respectively in a backward bias state between the sources/drains thereof and their bodies. A disadvantage occurs in that when the body bias voltage VBP remains at 0V upon a rise in the power supply voltage VDD where the transition from the LSI power-off to the LSI power-on is made, a parasitic diode between the source and body of the MOS transistor MPtn_C is placed in the forward direction as illustrated in TRS_NG, thereby causing current to flow into the body. In order to avoid it, the body bias voltage VBP may be biased to the power supply voltage VDD as shown in TRS_OK prior to or simultaneously with the supply of operating power to the MOS transistors MNtn_C and MPtn_C. In brief, the body bias voltage for holding the parasitic diode in an off state may be applied prior to or simultaneously with the application of the operating power to the corresponding MOS transistor. A disadvantage occurs in that when the body bias voltage VBP is brought to 0V prior to the shutdown of the power supply voltage VDD where the transition from the LSI power-on to the LSI power-off is made, the parasitic diode between the source and body of the MOS transistor MPtn_C is placed in the forward direction as illustrated in TRS_NG, thereby causing current to flow into the body. In order to avoid it, the body bias voltage VBP may be shut down as shown in TRS_OK subsequently to or simultaneously with the shutdown of operating power to the MOS transistors MNtn_C and MPtn_C. In brief, the body bias voltage for holding the parasitic diode in an off state may be shut down subsequently to or simultaneously with the application of the operating power to the corresponding MOS transistor. Thus, it is possible to suppress the disadvantage that the forward direction current flows into the parasitic diodes between the sources and bodies of the MOS transistors MPtn_C and MNtn_C, upon the LSI power-on and LSI power-off. FIG. 40 illustrates an operating timing provided to produce the state TRS_NG upon the LSI power-on. FIG. 41 illustrates an operating timing provided to realize the state TRS_OK upon the LSI power-on. Assuming that the forward voltage at which the parasitic diode is brought to an on operation, is 0.6V, for example, VBP should be greater than or equal to VDD-0.6V upon the LSI power-on. In FIG. 40, the parasitic diode is brought to an on state during a period TNG.

Even when the power supply switch 10 constituted of the p channel type MOS transistor MPtk_S is disposed on the power supply voltage VDD side, although not shown in the figure in particular, consideration similar to the above may be done.

<<Body Bias Control at On/Off of Power Supply Switch>>

Figure 42:
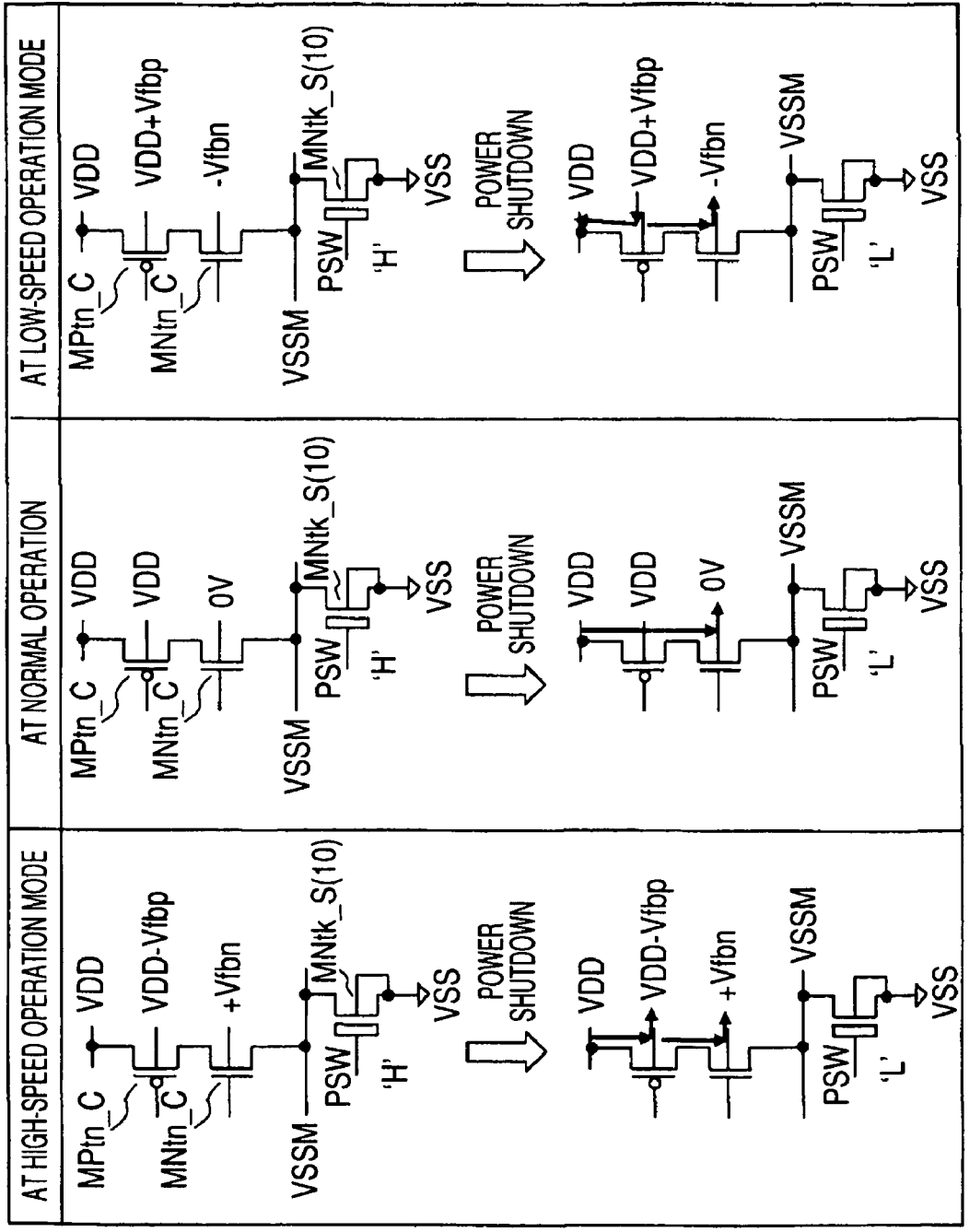
FIG. 42 is a status explanatory diagram illustrating the existence of leak paths to be taken into consideration when power shutdown is performed by power supply switches in an LSI power-on state.

FIG. 42 illustrates the existence of leak paths to be taken into consideration when power shutdown is performed by power supply switches 10 in an LSI power-on state. Body bias states for typically-illustrated MOS transistors MPtn_C and MNtn_C are made different according to circuit operation modes. In the high-speed operation mode, a forward bias voltage VDD-Vfbp is applied to the MOS transistor MPtn_C, and a forward bias voltage +Vfbn is applied to the MOS transistor MNtn_C. In the low-speed operation mode, a reverse bias voltage VDD+Vfbp is applied to the MOS transistor MPtn_C, and a reverse bias voltage –Vfbn is applied to the MOS transistor MNtn_C. In the normal operation mode, a bias voltage VDD is applied to the MOS transistor MPtn_C, and a bias voltage 0V (VSS) is applied to the MOS transistor MNtn_C. When the power shutdown by the power supply switch is made, i.e., the power supply switch MNtk_S (10) is brought to an off state, the potential at a node VSSM converges to the power supply voltage VDD. The power supply switch 10 is brought to an on state at a high level ('H') of PSW, and the power supply switch 10 is brought to an off state at a low level ('L') of PSW.

There is a fear that assuming that the body bias voltage is kept as it is when the power supply switch MNtk_S (10) is brought to the off state in the high-speed operation mode, the parasitic diode between the source/drain and body of the MOS transistor MPtn_C is brought to an on state according to the voltage value of –Vfbp to produce a leak current, whereby a junction leak takes place due to the difference in potential between the source/drain and body of the MOS transistor MNtn_C.

There is a fear that assuming that the body bias voltage is held as it is when the power supply switch MNtk_S is brought to an off state in the normal operation mode, a junction leak occurs due to the difference in potential between the source/drain and body of the MOS transistor MNtn_C.

There is a fear that assuming that the body bias voltage is held as it is when the power supply switch MNtk_S (10) is brought to an off state in the low-speed operation mode, a junction leak occurs due to the difference in potential between the source/drain and body of the MOS transistor MNtn_C.

Figure 43:
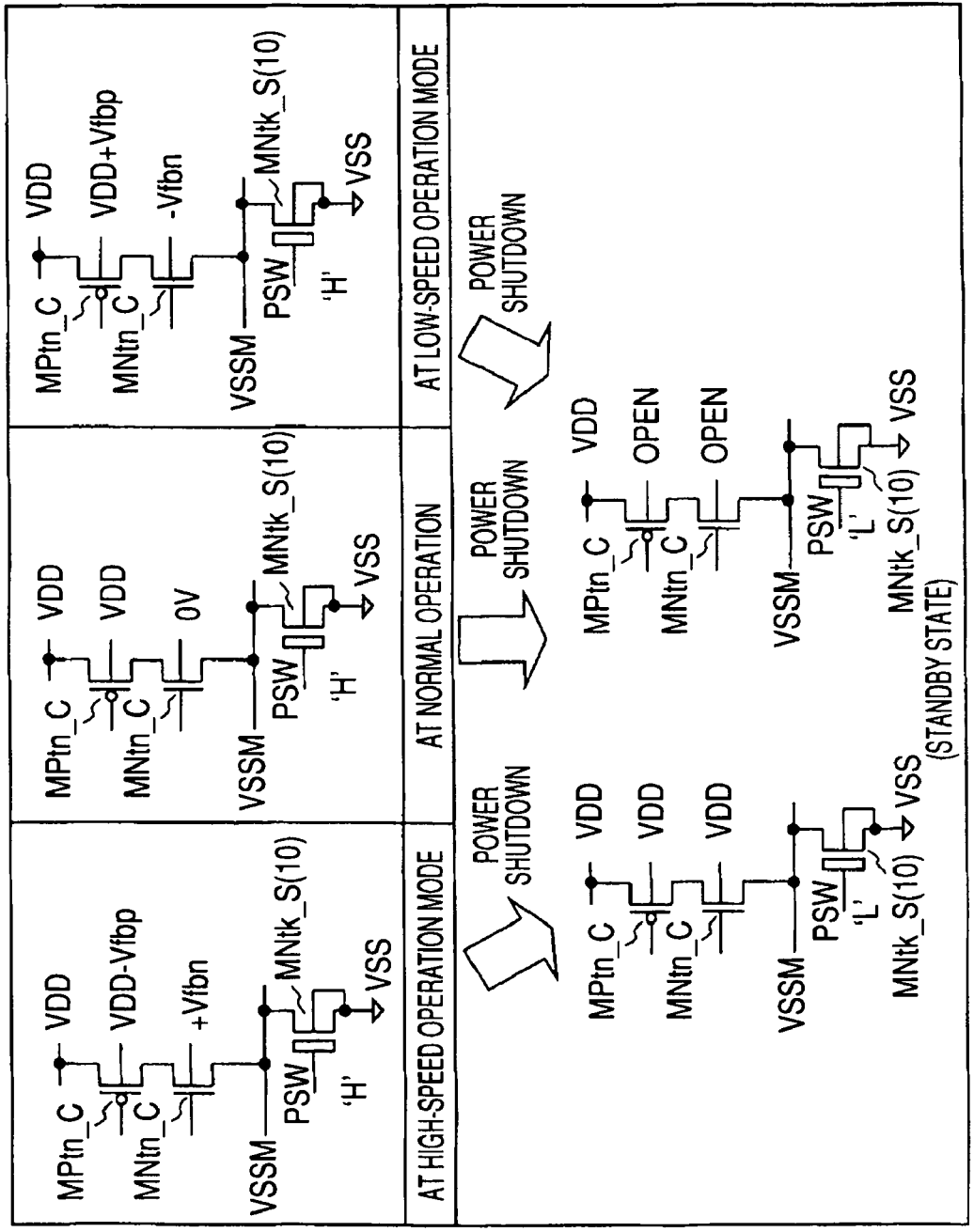
FIG. 43 is an explanatory diagram illustrating the states of body bias control for avoiding the formation of the leak paths of FIG. 43 when the power shutdown is performed by the power supply switches in the LSI power-on state.

The states of body bias control for avoiding the formation of the leak paths of FIG. 43 when the power shutdown is performed by the power supply switches 10 in the LSI power-on state, are illustrated in FIG. 43. When power is shut down by the power supply switch 10, the bodies of MOS transistors MPtn_C and MNtn_C connected to the power supply switch 10 are biased to a power supply VDD lying on the side opposite to a power supply VSS cut off by the corresponding power supply switch or the bodies are brought into floating (OPEN), in any operation mode. When the power on the low potential side like the ground potential VSS is shut down by the power supply switch 10 as illustrated in FIG. 43, a junction leak between the source/drain and body of each of the MOS transistors MPtn_C and MNtn_C and an on state of a parasitic diode therebetween can be suppressed in the shutoff state of the power supply switch 10 by bringing body potentials of the MOS transistors MPtn_C and MNtn_C to the high-potential power supply VDD. When the high-potential power supply VDD is shut down by the p channel type power supply switch MPtk_S (10) in the power shuttable-down circuit 6 of FIG. 1 in such a circuit configuration that the p channel type MOS transistor MPtk_S (10) is defined as the power supply switch in the power shuttable-down circuit 6, although not shown in the figure in particular, the body potentials for the MOS transistors MPtn_C and MNtn_C connected to the downstream side of the p channel type power supply switch are brought to the low-potential power supply VSS or floating, thereby making it possible to suppress a junction leak between the source/drain and body of each of the MOS transistors MPtn_C and MNtn_C and an on state of a parasitic diode formed therebetween in the shutoff state of the power supply switch MPtk_S (10).

Figure 44:
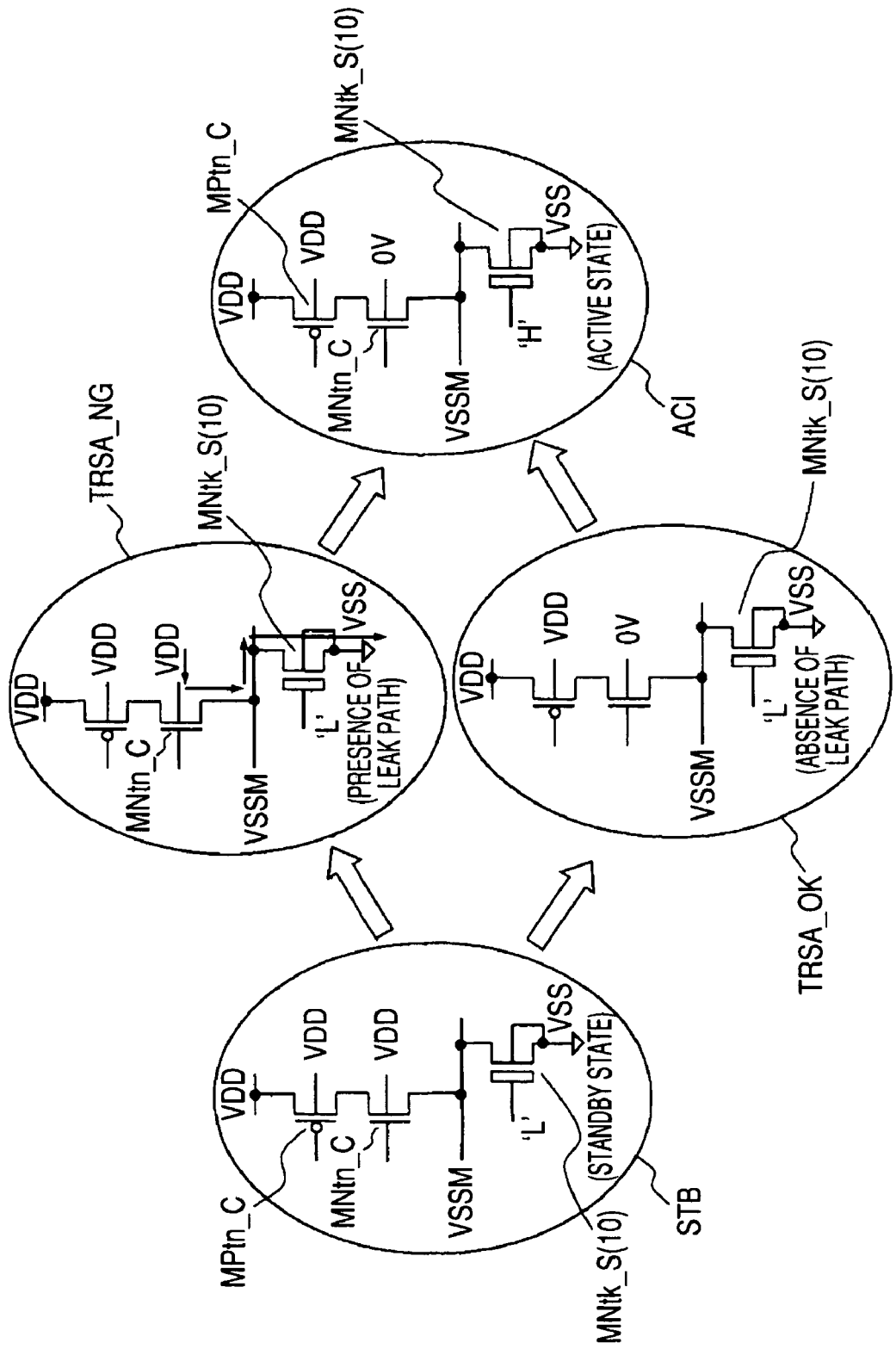
FIG. 44 is a status explanatory diagram illustrating the existence of each leak path to be taken into consideration when a transition from a standby state in an LSI power-on state to an active state subsequent to an on state of each power supply switch is taken.

FIG. 44 illustrates the existence of each leak path to be taken into consideration when a transition from a standby state (power shutdown state by power supply switch 10) placed in an LSI power-on state to an active state subsequent to an on state of each power supply switch 10 is taken. When a power supply switch MNtk_S (10) is brought to an on state while body bias states of MOS transistors MPtn_C and MNtn_C are being left as they are, upon the transition from the standby state STB to the active state ACT, a parasitic diode between the source and body of the n channel type MOS transistor MNtn_C is brought to an on state so that a leak current flows from the body to a ground potential VSS. In order to suppress the leak current, a bias voltage for holding the parasitic diode in an off state may be applied to the body of each MOS transistor connected to the power supply switch 10 prior to or simultaneously with the on operation of the power supply switch 10 when the supply of power by the power supply switch 10 is resumed. When the state of shutdown of the power on the low-potential side like the ground potential VSS is released by the power supply switch 10 as shown in FIG. 44, the body potential of the n channel type MOS transistor MNtn_C is first switched to the low-potential power supply VSS when the body potential is brought to the high-potential power supply VDD in the standby state. Thus, it is possible to suppress that the parasitic diode between the body and source of the n channel type MOS transistor MNtn_C is brought to the on state after the release of power shutdown by the power supply switch 10. When the shutdown state of the power supply VDD on the high-potential side by the p channel type power supply switch MPtk_S (10) is released in such a circuit configuration that the p channel type MOS transistor MPtk_S (10) is defined as the power supply switch in the power shuttable-down circuit 6 of FIG. 1, although not shown in the figure in particular, the body potential for the p channel type MOS transistor MPtn_C is first switched to the high-potential power supply VDD when the body potential is being set to the low-potential power supply VSS in the standby state. Thus, it is possible to suppress that the parasitic diode between the body and source of the p channel type MOS transistor MPtn_C is brought to an on state after the release of power shutdown by the power supply switch 10.

Figure 45:
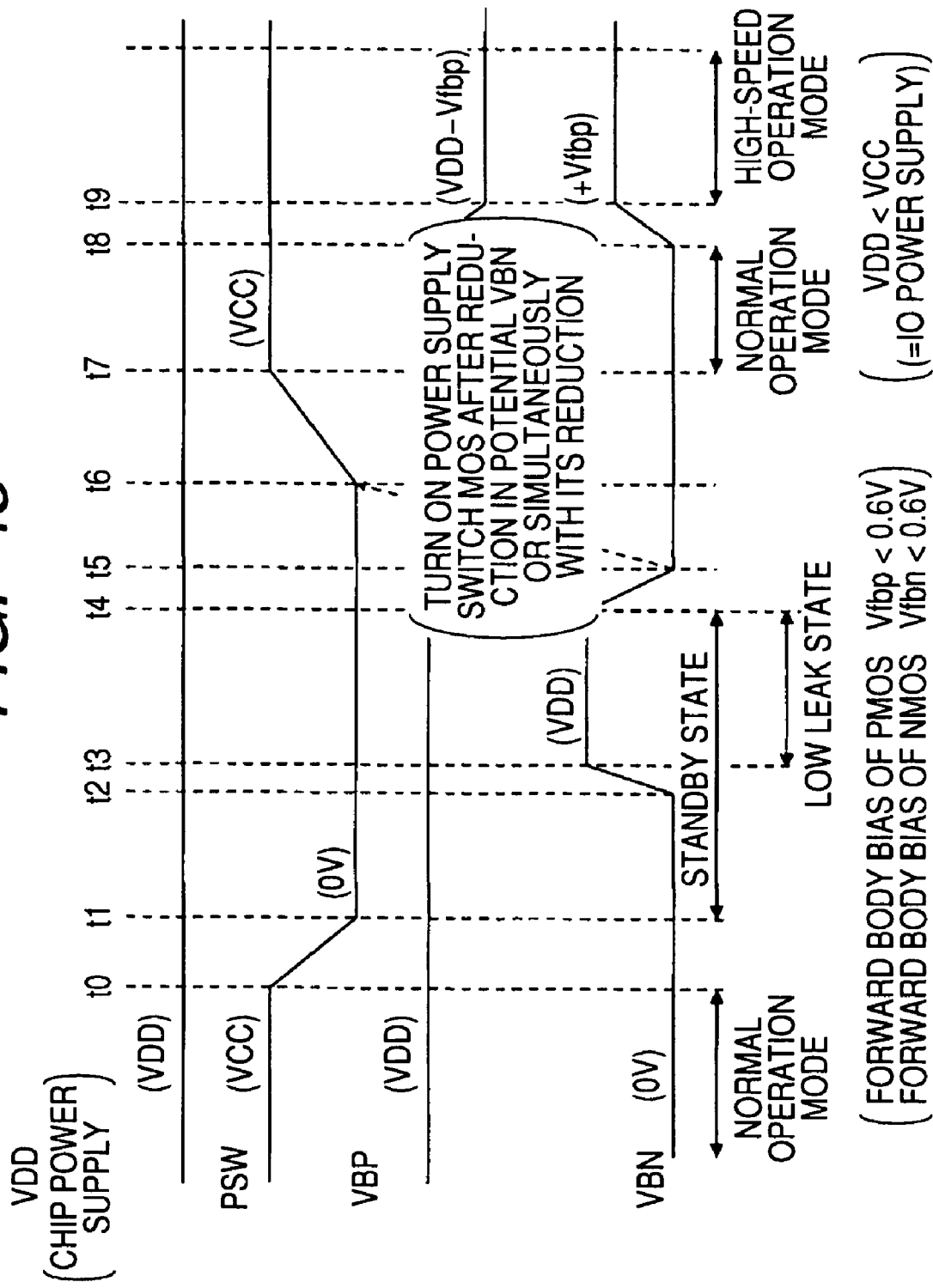
FIG. 45 is a timing chart illustrating operation timings provided to transition a standby state and an active state by turning on/off of each power supply switch.

FIG. 45 illustrates operation timings provided to transition a standby state and an active state by turning on/off of each power supply switch 10. The normal operation mode is taken in an LSI power-on state till a time t0. During a period from the times t0 to t1, the power supply switch 10 is shut off and brought to the standby state. Since a body bias voltage VBN of an n channel type MOS transistor MNtn_C is held at 0V till a time t2, a junction leak path remains formed between the source/drain and body of the n channel type MOS transistor MNtn_C during this period. At a time t3, the body bias voltage VBN of the n channel type MOS transistor MNtn_C is changed to a power supply voltage VDD. Thus, such a leak path as mentioned above is resolved so that a low leak state is reached, thereby making it possible to achieve low power consumption in the standby state. When the standby state is transitioned to the active state, the body bias voltage VBN of the n channel type MOS transistor MNtn_C is changed from the power supply voltage VDD to a ground voltage VSS (time t5). Thereafter, the power supply switch 10 is turned on by a switch control signal PSW (time t7). Since the power supply switch 10 is constituted of the thick film MOS transistor MNtk_C, the high level of the switch control signal PSW is brought to a power supply voltage VCC of an input/output circuit or the like (VDD<VCC). When the shutdown of power by the power supply switch 10 is released, the n channel type MOS transistor MNtn_C is biased in the backward direction between its body and source. Thus, an undesired leak current is not produced and the operation mode can be shifted to the normal operation mode. Thereafter, the bias voltage VBP and the bias voltage VBN may be respectively changed to VDD−Vfbp and +Vfbn to proceed to the high-speed operation mode (time t9). Vfbp is defined as a forward body bias voltage with the potential at the source of the p channel type MOS transistor as the reference. For example, Vfbp<0.6V is suitable. Likewise, Vfbn is defined as a forward body bias voltage with the potential at the source of the n channel type MOS transistor as the reference. For example, Vfbn<0.6V is suitable.

Figure 46:
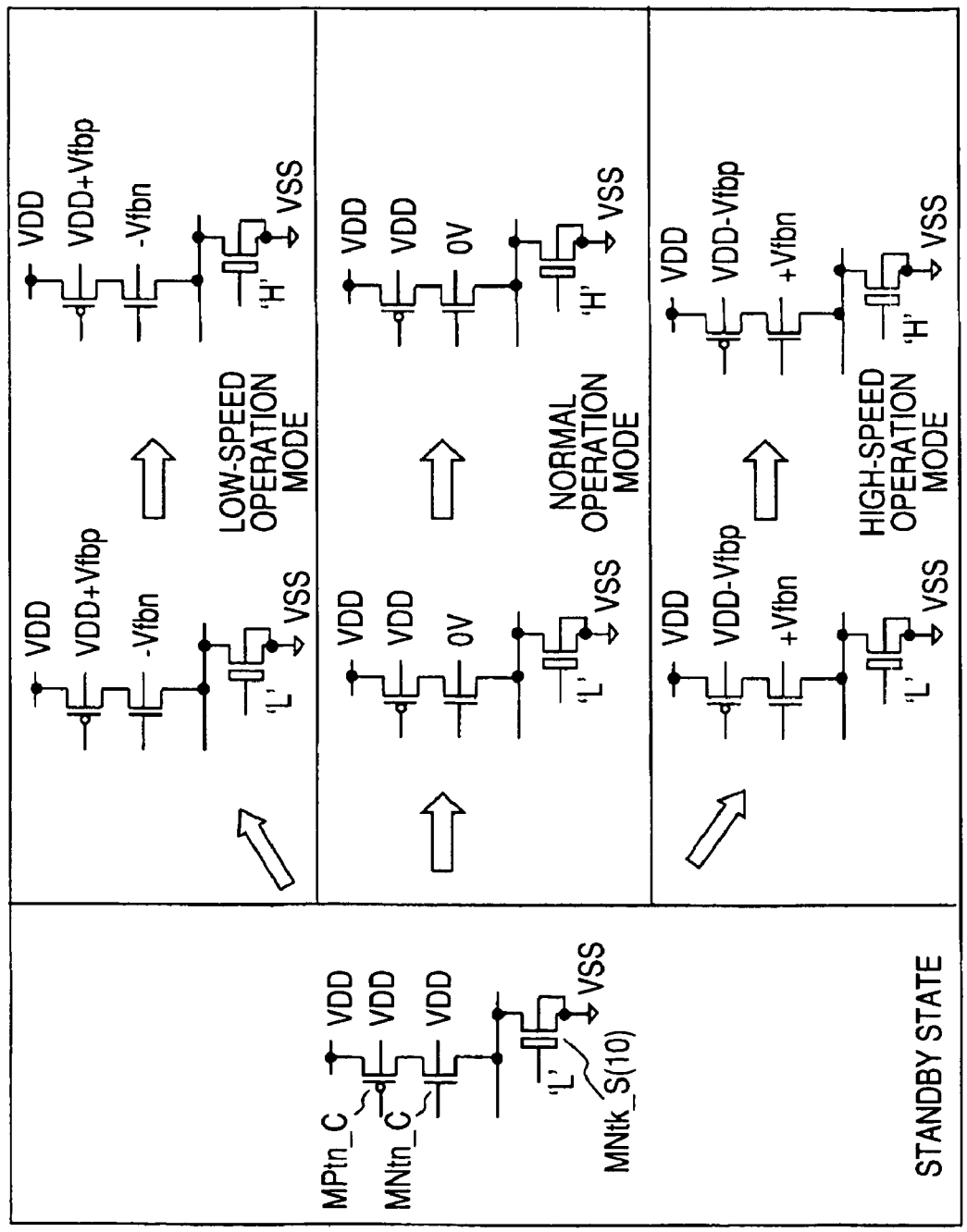
FIG. 46 is a status explanatory diagram illustrating operation forms at the transition from a standby state to operation states.

FIG. 46 illustrates operation forms at the transition from a standby state to operation states. The operation form at the transition from the standby state to the operation state is not limited to a normal operation mode but may be a low-speed operation mode or a high-speed operation mode. When the power supply switch 10 is in an off state in any of the operation modes as shown in the figure, it is desirable to supply a body bias to each of the MOS transistors MNtn_C and MPtn_C previously.

Figure 47:
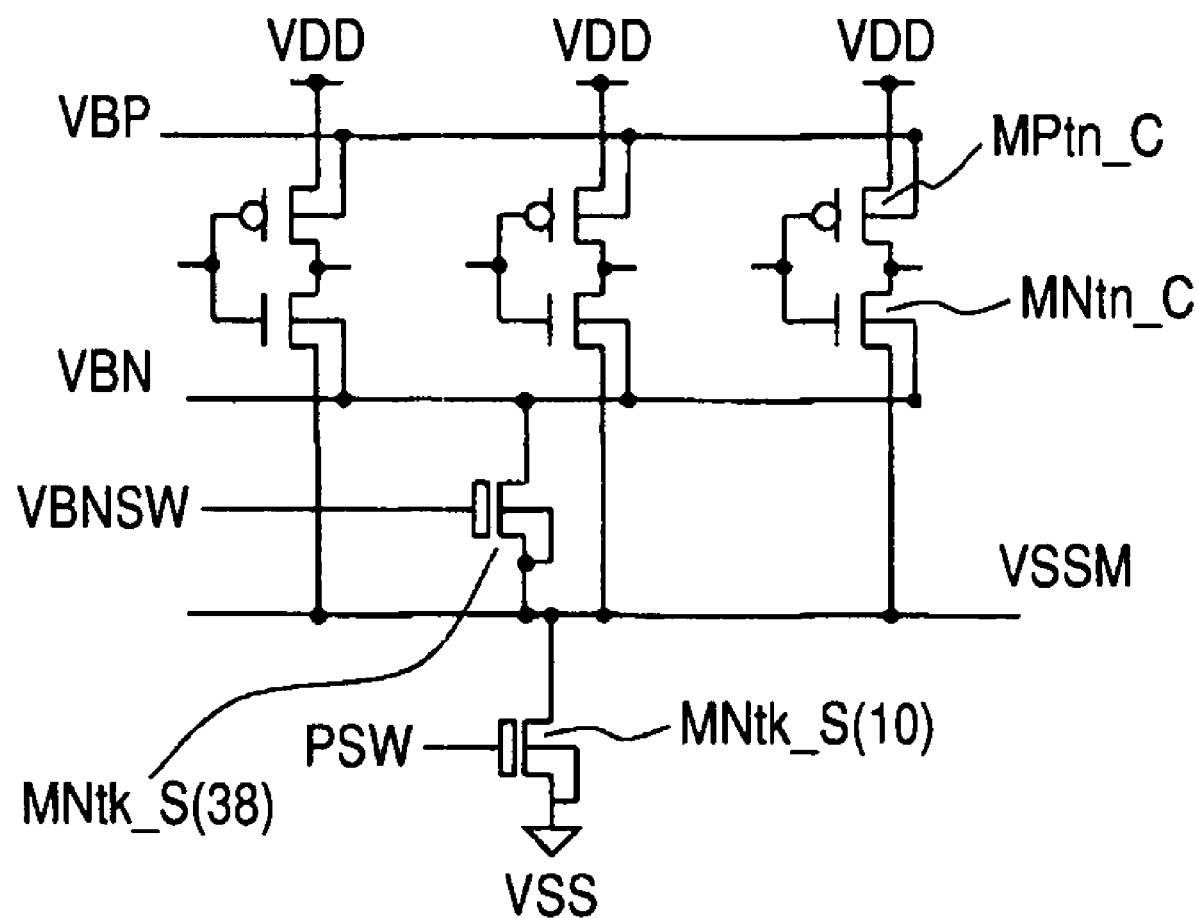
FIG. 47 is a circuit diagram illustrating a circuit capable of automatically setting body biases at the shutoff of a power supply switch.

FIG. 47 illustrates a circuit capable of automatically setting body biases at the shutoff of a power supply switch. A body bias automatic setting switch 38 is provided between a node VSSM and a node VBN connected to the body of each n channel type MOS transistor MNtn_C. For example, an n channel type thick film MOS transistor MNtk_C is adopted as the switch 38. Consideration is given to it in such a manner that a subthreshold leak in an off state becomes smaller. The body bias automatic setting switch 38 is switch-controlled by a switch control signal VBNSW. The switch control signal VBNSW is changed in antiphase to a switch control signal PSW of the power supply switch 10, for example. That is, the body bias automatic setting switch 38 is brought to an on state during a power shutdown period by the power supply switch 10 and brought to an off state during a power supply period by the power supply switch 10. When the body bias automatic setting switch 38 is brought to the on state at the power shutdown by the power supply switch 10, a power supply voltage VDD at the node VSSM reaching the power supply voltage VDD is applied to the node VBN via the switch 38. Thus, the formation of a leak path at the MOS transistor MNtn_C can be suppressed. Since the body bias automatic setting switch 38 is brought to the off state in response to the on operation of the power supply switch 10, a parasitic diode of the corresponding MOS transistor MNtn_C is no longer brought to an on state when the power shutdown is released. The body bias automatic setting switch 38 may be either a thin film MOS transistor or a p channel type MOS transistor or the like. The switch control signal VBNSW is not limited to being antiphase to the switch control signal VBNSW. A change in VBNSW may be set ahead of a change in PSW.

<<Control Circuit for Power Shutdown and Body Bias>>

Figure 48:
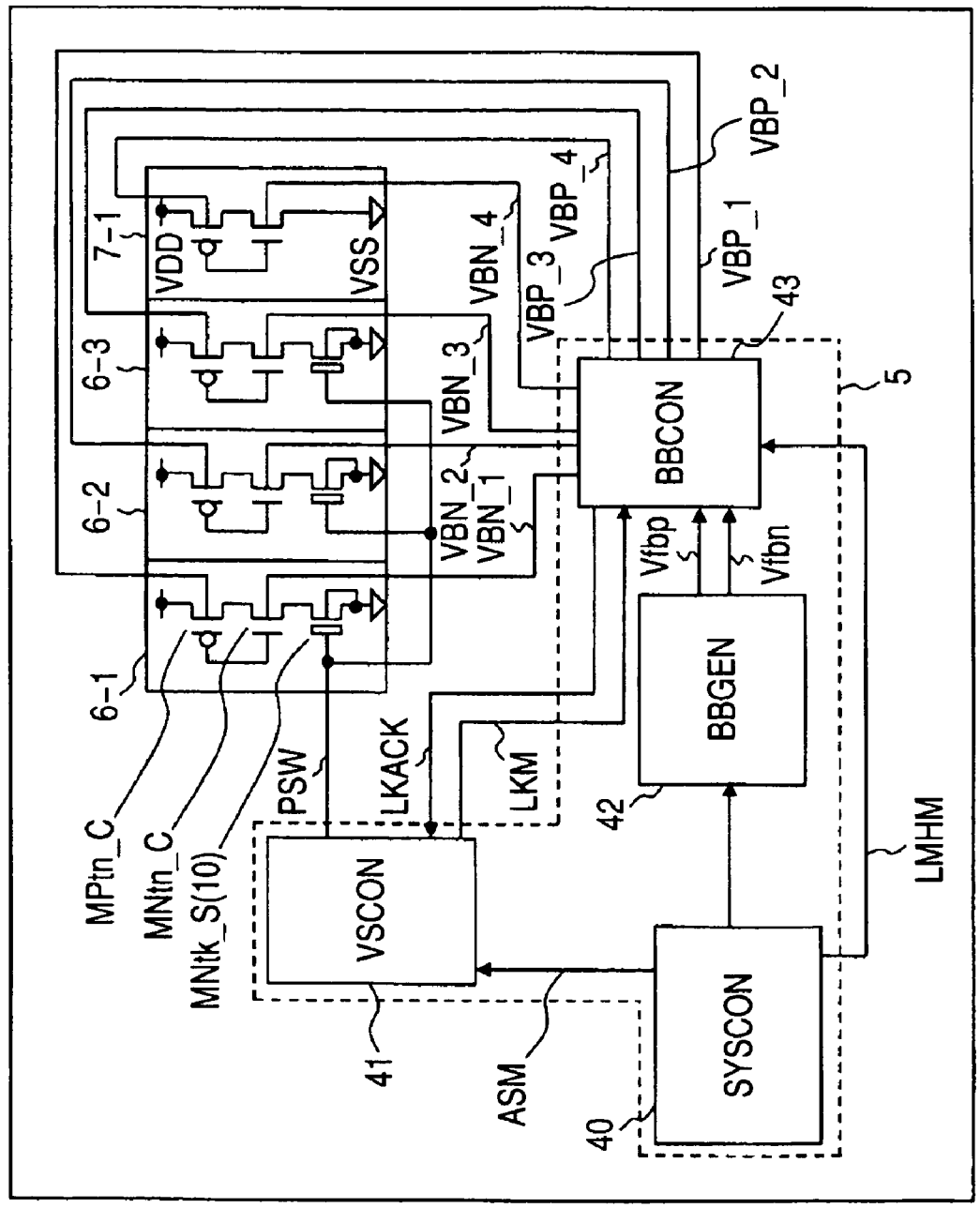
FIG. 48 is a circuit diagram illustrating a circuit that performs control on each power supply switch and control on each body bias.

An example of a circuit that performs control on each power supply switch and control on each body bias is shown in FIG. 48. In FIG. 48, each of power shuttable-down circuits 6_1 through 6_3 is supposed to be configured as the circuit illustrated in FIG. 25, and a power non-shutdown circuit 7_1 is supposed to be configured as the circuit illustrated in FIG. 26.

A control circuit or controller (power control and body bias control circuit or controller) 5, which performs control on each power supply switch 10 and control on each body bias comprises a system controller (SYSCON) 40, a power supply switch control circuit or controller (VSCON) 41, a body bias generating circuit or generator (BBGEN) 42, and a body bias control circuit or controller (BBCON) 43. The body bias generator 42 generates body bias voltages Vfbn and Vbnf to be supplied with a source potential as the reference. The power supply switch controller 41 outputs a switch control signal PSW of the power supply switch 10. The body bias controller 43 outputs body bias signals VBN_1 through VBN_4 and VBP_1 through VBP_4. Although not shown in the figure in particular, the body bias controller 43 is configured so as to be capable of outputting desired body bias voltages via a selector as typified by the body bias voltage controller or control circuit 11A described in FIG. 28. In accordance with the operation modes of the semiconductor integrated circuit 1, the system controller 40 outputs a signal AMS for notifying either an active mode or a standby mode to the power supply switch controller 41, and a signal LMHM of plural bits for notifying either a high-speed operation-mode, a normal mode or a low-speed mode to the body bias controller 43. The signal LMHM may be a signal for individually notifying the operation modes to the power shuttable-down circuits 6_1 through 6_3 and power non-shutdown circuit 7_1.

When the standby mode is notified to the power supply switch controller 41 in accordance with the signal ASM, the power supply switch controller 41 brings each power supply switch 10 to an off state in accordance with the signal PSW and instructs the body bias controller 43 to make a transition to a low leak state in accordance with a signal LKM. The body bias controller 43 having received it therein brings the respective body bias signals VBN_1 through VBN_3 and VBP_1 through VBP_3 for the power shuttable-down circuits 6_1, 6_2 and 6_3 to a power supply voltage VDD as described in FIG. 43. When the low leak state is set, the body bias controller 43 asserts an acknowledge signal LKACK to the power supply switch controller 41.

The body bias controller 43 individually sets body biases respectively relative to the power shuttable-down circuits 6_1 through 6_3 and power non-shutdown circuit 7_1 to the high-speed operation mode, normal mode or low-speed mode using the body bias signals VBN_1 through VBN_4 and VBP_1 through VBP_4 in accordance with the operation mode notified by the signal LMHM. When all the power shuttable-down circuits 6_1 through 6_3 are brought to the low-leak state, the body bias controller 43 negates the acknowledge signal LKACK outputted to the power supply switch controller 41.

When the active mode is notified by the signal ASM, the power supply switch controller 41 brings each power supply switch 10 to an on state in accordance with the signal PSW on the condition that the acknowledge signal LKACK sent from the body bias controller 43 has been negated. Since the power shuttable-down circuits 6_1 through 6_3 have already been released from the low-leak state when the power shuttable-down circuits 6_1 through 6_3 are transitioned from the standby state to the active state, the parasitic diode of each n channel MOS transistor MNtn_C is no longer brought to an on state.

Figure 49:
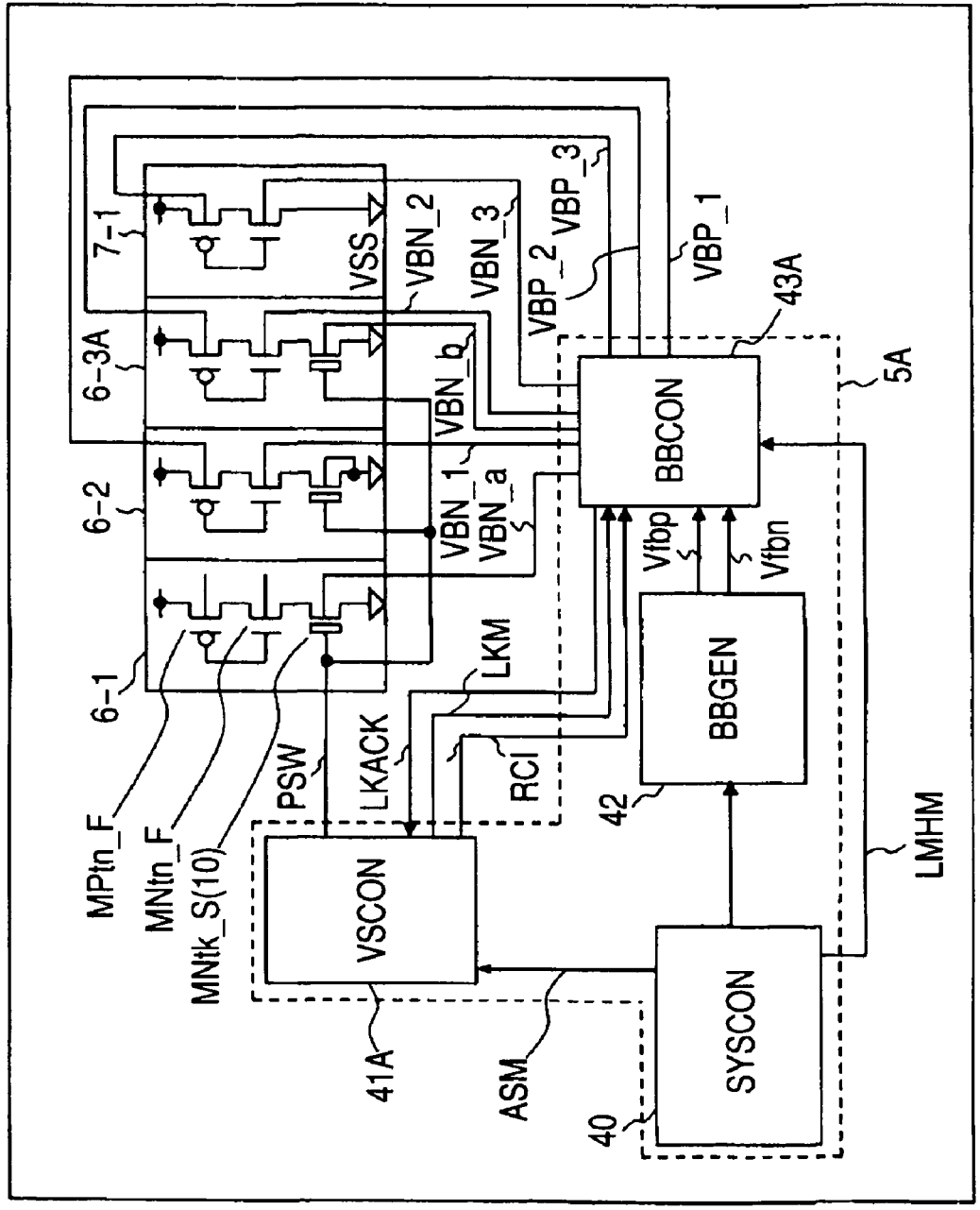
FIG. 49 is a circuit diagram illustrating another circuit that performs control on each power supply switch and control on each body bias.

Another example of a circuit that performs control on each power supply switch and control on each body bias is shown in FIG. 49. In FIG. 49, the bodies of MOS transistors MPtn and MNtn of a power shuttable-down circuit 6_1A are brought into floating, and power supply switches 10 of the power shuttable-down circuits 6_1A and 6_3A are variably controlled in body bias voltage. VBN_1 through VBN_3 and VBP_1 through VBP_3 are body bias signals for the MOS transistors MNtn and MPtn. VBN_a and VBN_b are body bias signals for the power supply switches MNtk_C (10).

The control circuit 5A that performs the control on the power supply switches 10 and the control on the body biases comprises a system controller (SYSCON) 40, a power supply switch control circuit or controller (VSCON) 41A, a body bias generating circuit or generator (BBGEN) 42, and a body bias control circuit or controller (BBCON) 43A. When a standby mode is notified to the power supply switch controller 41A in accordance with a signal ASM, the power supply switch controller 41A brings each power supply switch 10 to an off state in accordance with a signal PSW and instructs the body bias controller 43 to make a transition to a low leak state in accordance with a signal LKM. The body bias controller 43 having received it therein brings the respective body bias signals VBN_1 and VBN_2 and VBP_1 and VBP_2 for the power shuttable-down circuits 6_1A, 6_2 and 6_3A to a power supply voltage VDD as described in FIG. 43. When the low leak state is set, the body bias controller 43 asserts an acknowledge signal LKACK to the power supply switch controller 41.

The body bias controller 43A individually sets body biases respectively relative to the power shuttable-down circuits 6_2 and 6_3A and power non-shutdown circuit 7_1 to a high-speed operation mode, a normal mode or a low-speed mode using the body bias signals VBN_1 through VBN_3 and VBP_1 through VBP_3 in accordance with the operation mode notified by the signal LMHM. When all the power shuttable-down circuits 6_2 and 6_3A intended for body bias control are not brought to the low-leak state, the body bias controller 43 negates the acknowledge signal LKACK outputted to the power supply switch controller 41.

When the active mode is notified by the signal ASM, the power supply switch controller 41 instructs the body bias controller 43A to perform an inrush current inhibiting operation in accordance with a signal RCI on the condition that the acknowledge signal LKACK sent from the body bias controller 43A has been negated. When the inrush current inhibiting operation is instructed, the body bias controller 43A applies reverse bias voltages to the MOS transistors MNtk_C in accordance with the body bias signals VBN_a and VBN_b for the power supply switches 10, respectively, for a predetermined period, thereby increasing on resistances of the power supply switches 10. Immediately after it, the power supply switch controller 41A brings the power supply switches 10 to an on state in accordance with the signal PSW. When the power shuttable-down circuits 6_1A, 6_2 and 6_3A are transitioned from a standby state to an active state, the power shuttable-down circuits 6_1A and 6_3A have already been released from the low leak state. Therefore, the parasitic diode of each n channel type MOS transistor MNtn_C is not brought to an on state. Further, since each power supply switch 10 increases in on resistance due to the reverse body bias, the floating of a ground voltage due to the inrush current is suppressed, so that a malfunction at the power non-shut-down circuit 7 is prevented. The predetermined period is defined as a period enough to stabilize power in accordance with the on operation of each power supply switch. After the elapse of the predetermined period, the body bias signals VBN_a and VBN_b for the power supply switches 10 are returned to the ground voltage VSS, for example.

Controlling the body bias in consideration of the state of each power supply switch 10 as described based on FIGS. 48 and 49 reduces the operating power supply voltage as compared with the input/output circuit 2 and makes it easier to satisfy, as needed, both a high-speed operation request and a low power consumption request to circuits such as a logic circuit, an analog circuit, etc. in a core area in which the high-speed operation and the low power consumption have been projected or planned.

<<Source Tie Structure>>

Figure 50:
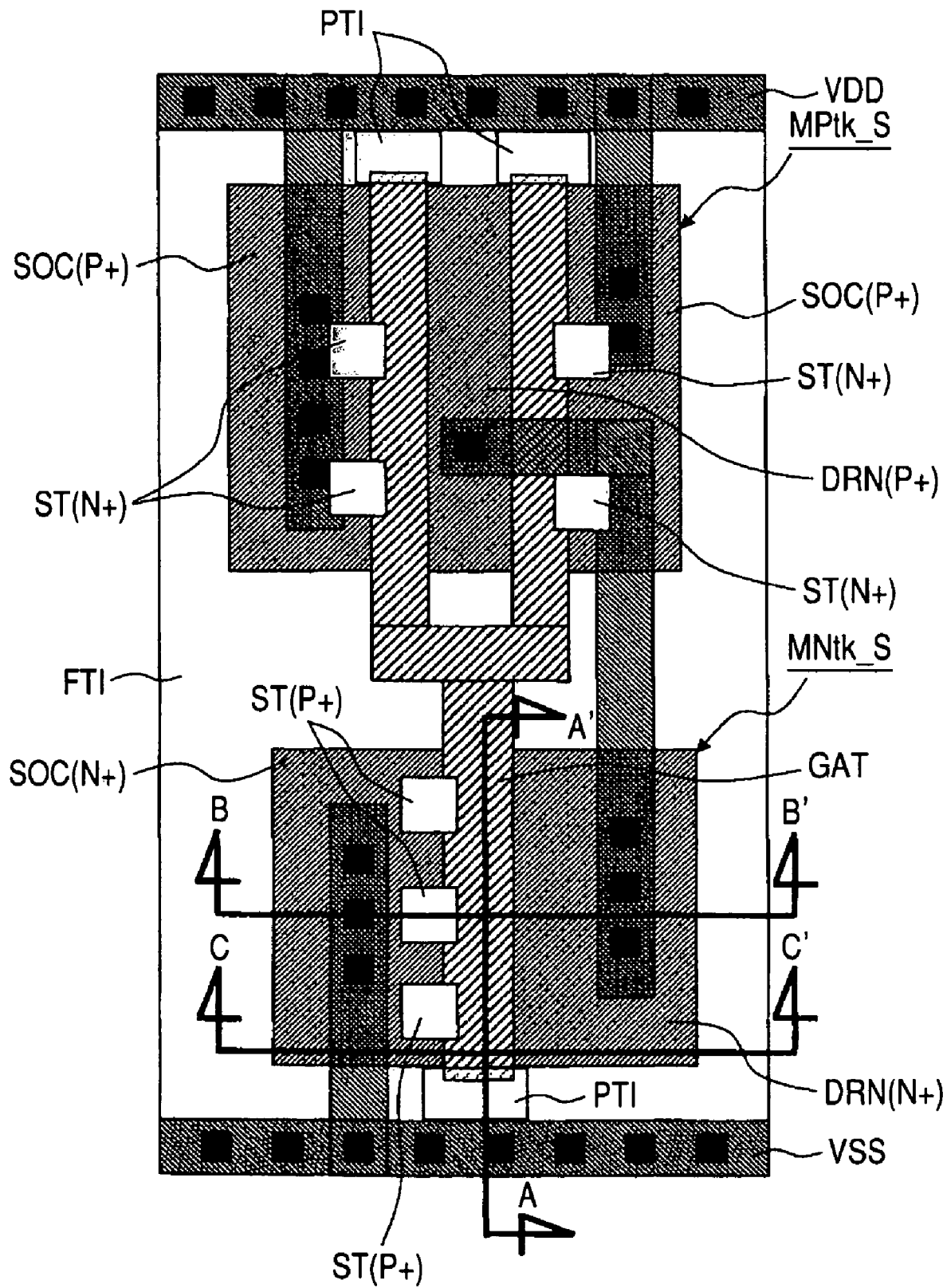
FIG. 50 is a plan view illustrating a device layout of each inverter that constitutes an input/output circuit.
Figure 51:
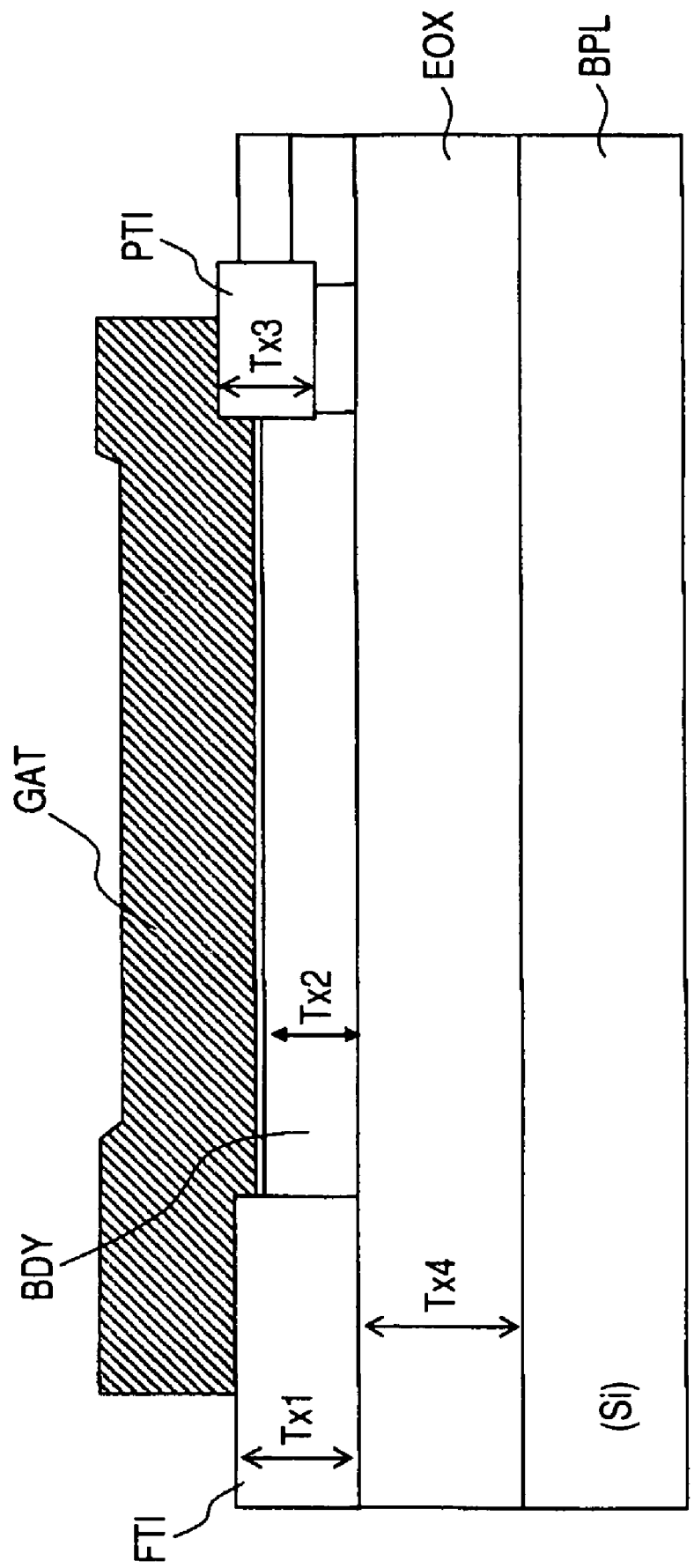
FIG. 51 is a sectional view taken along line A-A' of FIG. 50.
Figure 52:
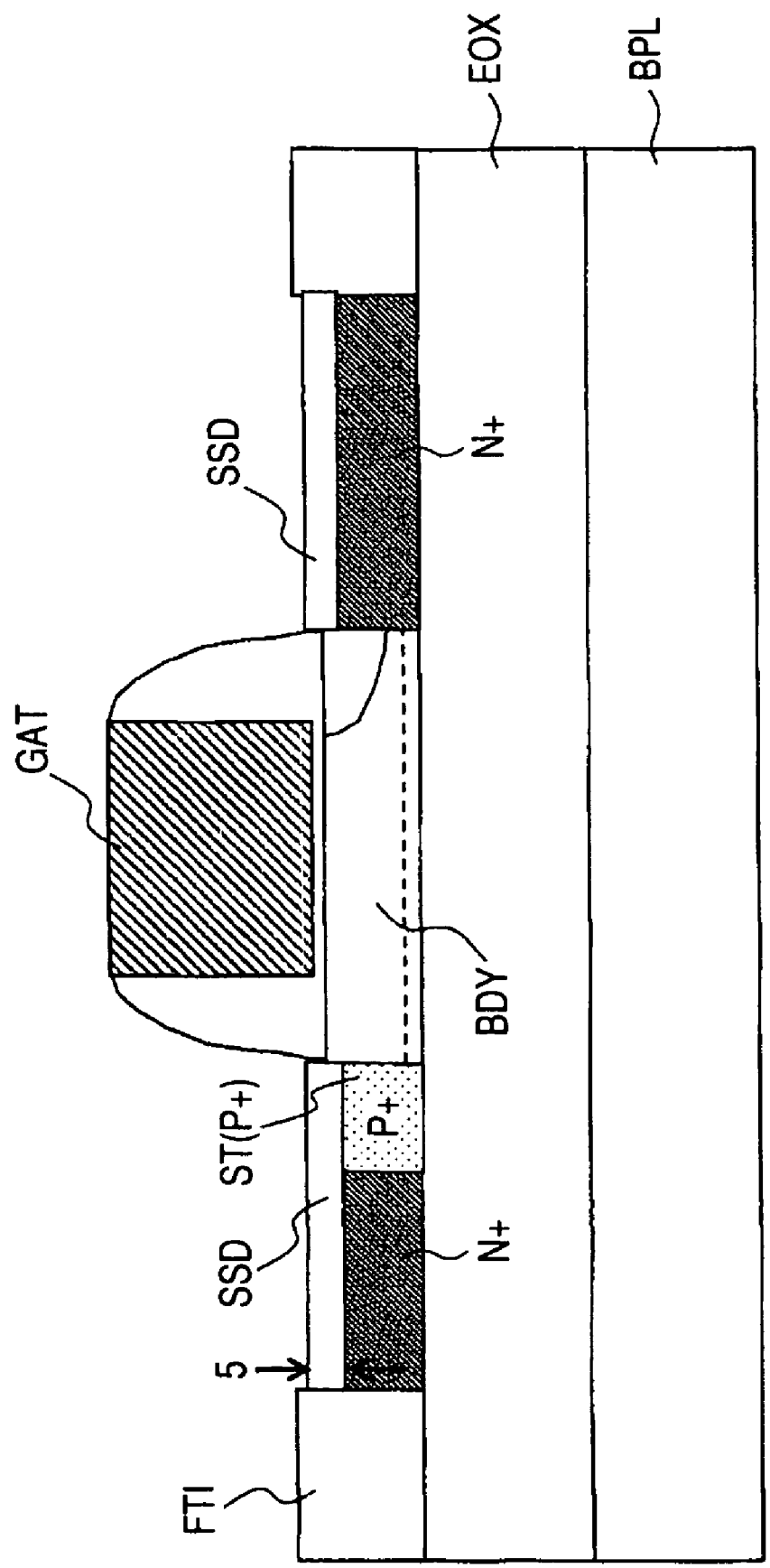
FIG. 52 is a sectional view taken along line B-B' of FIG. 50.
Figure 53:
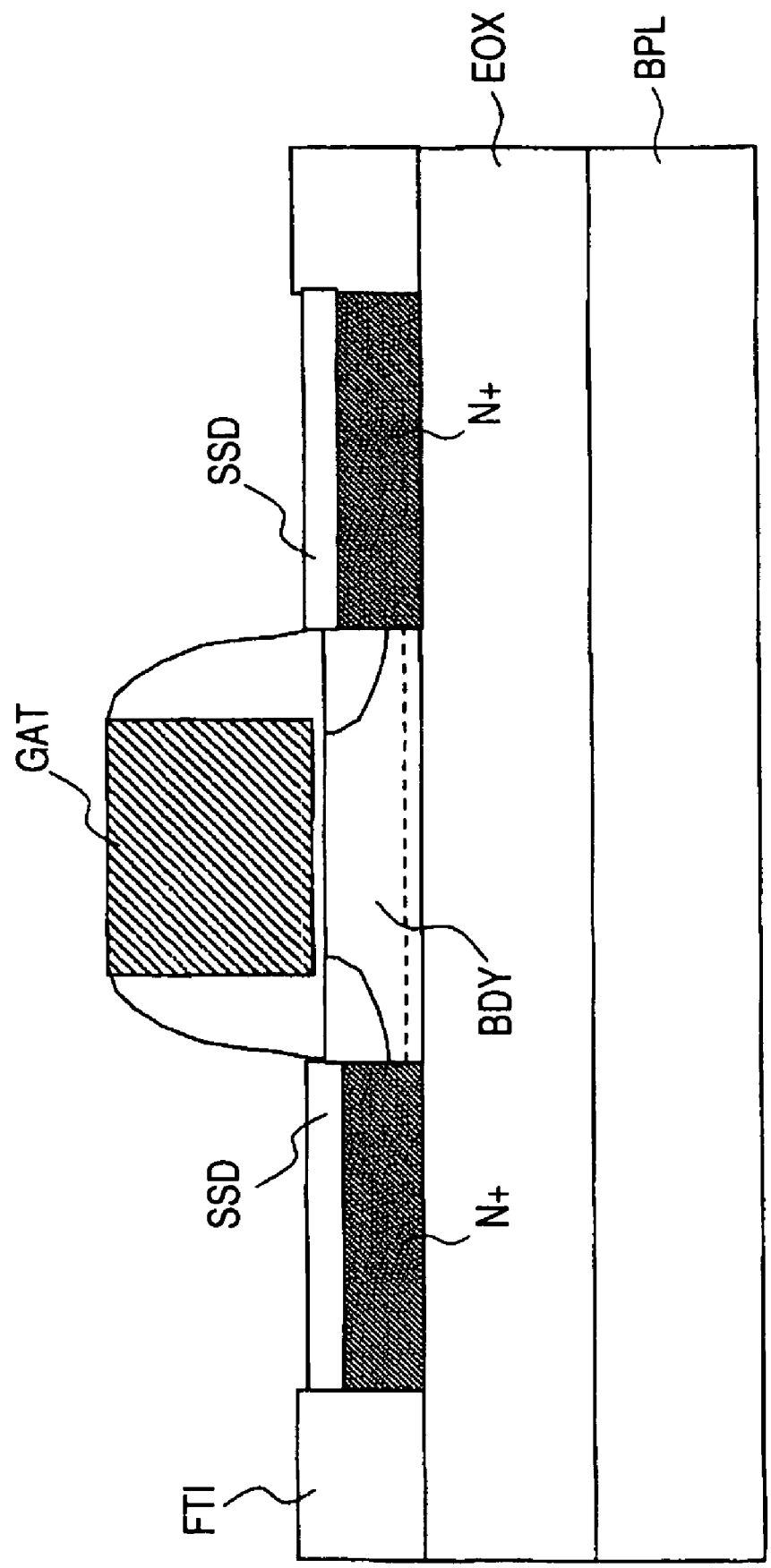
FIG. 53 is a sectional view taken along line C-C' of FIG. 50.

FIG. 50 illustrates a device layout of each inverter that constitutes the input/output circuit 2. FIG. 51 is a sectional view taken along line A-A' of FIG. 50, FIG. 52 is a sectional view taken along line B-B' of FIG. 50, and FIG. 53 is a sectional view taken along line C-C' of FIG. 50, respectively. The inverter shown in the same figure is constituted of a series circuit of thin film MOS transistors MPtk_S and MNtk_S as described above and is used to configure an external output buffer and an external input buffer. The bodies BODY of the thick film MOS transistors MPtk_S and MNtk_S that constitute the inverter are connected to their sources at plural places and have a source tie structure. The partial isolation regions PTIs may be used to connect the ends of the bodies BDY to a power wiring VDD and a ground wiring VSS. Source tie pads ST (N+) and ST (P+) of the same conductivity type as the body BDY are used to connect intermediate portions of the bodies BDY to the power wiring VDD and the ground wiring VSS. The source tie pad ST (N+) is used for the p channel type MOS transistor MPtk_S, and the source tie pad ST (P+) is used for the n channel type MOS transistor MNtk_S. A silicide film SSD is formed over the surface of each diffusion region in which a source SOC and a drain DRN are formed. Each of the source tie pads ST (N+) and ST (P+) are made conductive to the source SOC via the silicide film SSD. Body-biasing, with connecting points to a source potential as plural points, an external interface circuit that tends to become higher in operating power than a core circuit portion or a logic circuit portion and widen a channel width because impact ionization occurs due to a high potential at each drain and a kink phenomenon often occurs due to body floating makes it possible to suppress or reduce the occurrence of a kink phenomenon of a voltage/current characteristic due to the impact ionization. Incidentally, thickness dimensions in the figure are set to Tx1=120 nm, Tx2=75 nm, Tx3=90 nm, Tx4=145 nm and Tx5=30 to 40 nm. An impurity concentration of each body BDY becomes high in concentration at a boundary between the same and an embedded oxide film EOX. A depletion layer is provided so as not to spread and hence a body potential becomes easy to fix.

While the invention made above by the present inventors has been described specifically on the basis of the preferred embodiments, the present invention is not limited to the embodiments referred to above. It is needless to say that various changes can be made thereto within the scope not departing from the gist thereof.

The function of a circuit constituted of thin film MOS transistors can suitably be selected. It is also possible to suitably change the conductivity type of a power supply switch, the number of hierarchical stages of power supply switches, the number of MOS transistors in a primitive cell and their layout, etc. The semiconductor integrated circuit is not limited to the digital processing LSI typified by the microcomputer. The semiconductor integrated circuit can be widely applied to an analog processing LSI, an analog/digital mixed LSI and the like. As the standby mode, there are known, for example, a sleep mode transitioned by executing a sleep instruction by a CPU, an external standby mode instructed from outside by a standby signal or a register setting or the like, and a module standby mode in which whether or not to perform the operation can be set every module. The power supply switches can be disposed on a hierarchical basis. The power supply switch may be constituted of a thick film MOS transistor alone. A thin film MOS transistor may suitably be provided in mixed form as a low-order hierarchical power supply switch. The low-order hierarchical power supply switch is not limited to being configured by the thin film MOS transistor but can also be constituted of a thick film MOS transistor as a matter of course.

What is claimed is:

1. A semiconductor integrated circuit comprising:
    a plurality of circuits constituted of MOS transistors each having a source, a drain, a body, a gate insulating film provided over the body, and a gate provided over the gate insulating film, said circuits being provided over an insulating thin film of a substrate;
    a control circuit, a controlled circuit and an external interface circuit as parts of the plurality of circuits; and
    a body bias circuit, as another part of the plurality of circuits, which variably controls body potentials of MOS transistors constituting a subsequent-stage circuit on the basis of an output of a pre-stage circuit at a serial signal transmission path in the controlled circuit,
    wherein the control circuit variably controls a body potential of each MOS transistor constituting the controlled circuit according to an operation mode.

2. A semiconductor integrated circuit comprising:
    a plurality of circuits constituted of MOS transistors each having a source, a drain, a body, a gate insulating film provided over the body, and a gate provided over the gate insulating film, said circuits being provided over an insulating thin film of a substrate; and a control circuit, a controlled circuit and an external interface circuit as parts of the plurality of circuits, wherein the control circuit variably controls a body potential of each MOS transistor constituting the controlled circuit according to an operation mode, wherein the controlled circuit has a power supply switch, and a gate oxide film of the MOS transistor constituting the power supply switch has the same thickness as a gate oxide film of each of the MOS transistors for external input/output, constituting the external interface circuit, and wherein the control circuit controls on/off of the power supply switch according to the operation mode.

3. The semiconductor integrated circuit according to claim 2, wherein the body of the MOS transistor constituting the power supply switch is connected to a source thereof.

4. The semiconductor integrated circuit according to claim 3, wherein the bodies of the MOS transistors constituting the external interface circuit are connected to sources thereof at plural spots.

5. The semiconductor integrated circuit according to claim 2, wherein in a low leak mode at shutoff of the power supply switch, the control circuit controls the body of each MOS transistor constituting the controlled circuit to a reverse bias voltage at which a threshold voltage thereof becomes greater than when equal to a source voltage thereof, and in a high-speed mode at the supply of power by the power supply switch, the control circuit controls the body of each MOS transistor constituting the controlled circuit to a forward bias voltage at which the threshold voltage becomes smaller than when equal to the source voltage thereof.

6. The semiconductor integrated circuit according to claim 5, wherein in a low-speed mode at the supply of power by the power supply switch, the control circuit sets the body of each MOS transistor constituting the controlled circuit to the reverse bias.

7. The semiconductor integrated circuit according to claim 6, wherein in a normal mode at the supply of power by the power supply switch, the control circuit controls the body of each MOS transistor constituting the controlled circuit to a source voltage thereof.

8. The semiconductor integrated circuit according to claim 2, wherein when power on a high-potential side or a low-potential side is shut down by the power supply switch, the control circuit biases the body of each MOS transistor connected to the power supply switch to a power supply lying on the side opposite to a power supply shutdown by the power supply switch, or brings the same into floating.

9. The semiconductor integrated circuit according to claim 8, wherein when the supply of power by the power supply switch is resumed, the control circuit applies a bias voltage for holding a parasitic diode in an off state to the body of each MOS transistor connected to the power supply switch prior to or simultaneously with an on operation of the power supply switch.

10. The semiconductor integrated circuit according to claim 9, wherein when the supply of the power by the power supply switch is shut off, the control circuit shuts off the application of the bias voltage applied to hold the parasitic diode in the off state to the body of each MOS transistor connected to the power supply switch after or simultaneously with an off operation of the power supply switch.

11. A semiconductor integrated circuit comprising:

a plurality of circuits constituted of MOS transistors each having a source, a drain, a body, a gate insulating film provided over the body, and a gate provided over the gate insulating film, said circuits being provided over an insulating thin film of a substrate; and a control circuit, a controlled circuit and an external interface circuit as parts of the plurality of circuits, wherein the control circuit variably controls a body potential of each MOS transistor constituting the controlled circuit according to an operation mode, wherein when power of the semiconductor integrated circuit is turned on, the control circuit applies a bias voltage for holding a parasitic diode in an off state to the body of the MOS transistor prior to or simultaneously with the application of operating power to each MOS transistor constituting the controlled circuit.

12. The semiconductor integrated circuit according to claim 11, wherein when the power of the semiconductor integrated circuit is turned off, the control circuit shuts off the bias voltage applied to hold the parasitic diode in the off state to the body of the MOS transistor simultaneously with or after the shutdown of the operating power for each MOS transistor constituting the controlled circuit.

13. A semiconductor integrated circuit comprising:

a plurality of circuits constituted of MOS transistors each having a source, a drain, a body, a gate insulating film provided over the body, and a gate provided over the gate insulating film, said circuits being provided over an insulating thin film of a substrate; and a control circuit, a controlled circuit and an external interface circuit as parts of the plurality of circuits, wherein the control circuit variably controls a body potential of each MOS transistor constituting the controlled circuit according to an operation mode, wherein when the power of the semiconductor integrated circuit is turned on, the control circuit connects the body of the MOS transistor to a power supply on the source side prior to or simultaneously with the application of the operating power to each MOS transistor constituting the controlled circuit.

14. The semiconductor integrated circuit according to claim 13, wherein when the power of the semiconductor integrated circuit is turned off, the control circuit shuts off the connection between the body of the MOS transistor and the power supply on the source side simultaneously with or after the shutdown of the operating power for each MOS transistor constituting the controlled circuit.

15. A semiconductor integrated circuit comprising:

a plurality of circuits constituted of MOS transistors each having a source, a drain, a body, a gate insulating film provided over the body, and a gate provided over the gate insulating film, said circuits being provided over an insulating thin film of a substrate;

a memory circuit included as part of the plurality of circuits; and a digital circuit as part of the plurality of circuits, wherein the digital circuit has sequence circuits constituted of MOS transistors whose body voltages are fixed, and wherein the memory circuit has memory elements constituted of MOS transistors whose body voltages are fixed.

16. The semiconductor integrated circuit according to claim 15, wherein the digital circuit has combination circuits constituted of MOS transistors whose bodies are brought into floating, and the combination circuits are connected in series with the sequence circuits.

17. The semiconductor integrated circuit according to claim 16, further including:

another digital circuit as part of the plurality of circuits, wherein the digital circuit has a logic circuit constituted of MOS transistors whose bodies are brought into floating.

18. The semiconductor integrated circuit according to claim 17, further including:

a control circuit, a controlled circuit and an external interface circuit as parts of the plurality of circuits, wherein the control circuit variably controls a body potential of a body of each MOS transistor that constitutes the controlled circuit according to an operation mode.

19. The semiconductor integrated circuit according to claim 18, further including:

a body bias circuit, as another part of the plurality of circuits, which variably controls body potentials of MOS transistors constituting a subsequent-stage circuit on the basis of an output of a pre-stage circuit at a serial signal transmission path in the controlled circuit.

20. The semiconductor integrated circuit according to claim 19, wherein the controlled circuit has a power supply switch, and a gate oxide film of the MOS transistor constituting the power supply switch has the same thickness as a gate oxide film of each of the MOS transistors for external input/output, constituting the external interface circuit, and wherein the control circuit controls on/off of the power supply switch according to the operation mode.

21. The semiconductor integrated circuit according to claim 20, wherein the body of the MOS transistor constituting the power supply switch is connected to a source thereof.

22. The semiconductor integrated circuit according to claim 21, wherein the bodies of the MOS transistors constituting the external interface circuit are connected to sources thereof at plural spots.

23. The semiconductor integrated circuit according to claim 22, wherein in a low leak mode at shutoff of the power supply switch, the control circuit controls the body of each MOS transistor constituting the controlled circuit to a reverse bias voltage at which a threshold voltage thereof becomes greater than when equal to a source voltage thereof, and in a high-speed mode at the supply of power by the power supply switch, the control circuit controls the body of each MOS transistor constituting the controlled circuit to a forward bias voltage at which the threshold voltage becomes smaller than when equal to the source voltage thereof.

24. The semiconductor integrated circuit according to claim 23, wherein in a low-speed mode at the supply of power by the power supply switch, the control circuit sets the body of each MOS transistor constituting the controlled circuit to the reverse bias.

25. The semiconductor integrated circuit according to claim 24, wherein in a normal mode at the supply of power by the power supply switch, the control circuit controls the body of each MOS transistor constituting the controlled circuit to a source voltage thereof.

26. The semiconductor integrated circuit according to claim 25, wherein upon power-on of the semiconductor integrated circuit, the control circuit applies a bias voltage for holding a parasitic diode in an off state to the body of the MOS transistor prior to or simultaneously with the application of operating power to each MOS transistor constituting the controlled circuit.

27. The semiconductor integrated circuit according to claim 26, wherein upon power-off of the semiconductor integrated circuit, the control circuit shuts off the application of the bias voltage for holding the parasitic diode in the off state, which is applied to the body of the MOS transistor simultaneously with or after the shutdown of the operating power for each MOS transistor constituting the controlled circuit.

28. The semiconductor integrated circuit according to claim 27, wherein when power on a high-potential side or a low-potential side is shut down by the power supply switch, the control circuit biases the body of each MOS transistor connected to the power supply switch to a power supply lying on the side opposite to the power supply shutdown by the power supply switch, or brings the same into floating.

29. The semiconductor integrated circuit according to claim 28, wherein when the supply of power by the power supply switch is resumed, the control circuit applies a bias voltage for holding a parasitic diode in an off state to the body of each MOS transistor connected to the power supply switch prior to or simultaneously with an on operation of the power supply switch.

30. The semiconductor integrated circuit according to claim 29, further including:

an analog circuit as part of the plurality of circuits, wherein the analog circuit has a circuit which allows each MOS transistor whose body voltage is fixed, to operate in a saturated region.

* * * * *